US008094247B2

(12) United States Patent
Allemand et al.

(10) Patent No.: US 8,094,247 B2
(45) Date of Patent: Jan. 10, 2012

(54) NANOWIRE-BASED TRANSPARENT CONDUCTORS AND APPLICATIONS THEREOF

(75) Inventors: Pierre-Marc Allemand, San Jose, CA (US); Haixia Dai, Mountain View, CA (US); Shuo Na, San Jose, CA (US); Hash Pakbaz, Hayward, CA (US); Florian Pschenitzka, San Francisco, CA (US); Xina Quan, Saratoga, CA (US); Jelena Sepa, Sunnyvale, CA (US); Michael A. Spaid, Mountain View, CA (US)

(73) Assignee: Cambrios Technologies Corporation, Sunnyvale, CA (US)

( * ) Notice: Subject to any disclaimer, the term of this patent is extended or adjusted under 35 U.S.C. 154(b) by 791 days.

(21) Appl. No.: 11/871,767

(22) Filed: Oct. 12, 2007

(65) Prior Publication Data

US 2008/0143906 A1    Jun. 19, 2008

Related U.S. Application Data

(60) Provisional application No. 60/851,652, filed on Oct. 12, 2006, provisional application No. 60/911,058, filed on Apr. 10, 2007, provisional application No. 60/913,231, filed on Apr. 20, 2007.

(51) Int. Cl.
*G02F 1/1335* (2006.01)
(52) U.S. Cl. ........................................................ 349/12
(58) Field of Classification Search ........................ None
See application file for complete search history.

(56) References Cited

U.S. PATENT DOCUMENTS

| 2,426,318 | A | | 8/1947 | Menaul ........................ 252/8.55 |
|---|---|---|---|---|
| 4,523,976 | A | | 6/1985 | Bukhman |
| 4,539,041 | A | | 9/1985 | Figlarz et al. .................... 75/5 A |
| 5,009,812 | A | | 4/1991 | Finter et al. .................... 252/500 |
| 5,063,125 | A | | 11/1991 | Yuh et al. ......................... 430/59 |
| 5,165,985 | A | | 11/1992 | Wiste et al. .................... 428/209 |
| 5,198,267 | A | | 3/1993 | Aharoni et al. |
| 5,225,244 | A | | 7/1993 | Aharoni et al. |
| 5,258,140 | A | | 11/1993 | Chetcuti ........................ 252/519 |
| 5,270,364 | A | | 12/1993 | Schwartz et al. |
| 5,292,784 | A | | 3/1994 | McKinney et al. |
| 5,294,401 | A | | 3/1994 | Hagiwara ........................ 422/48 |
| 5,411,792 | A | * | 5/1995 | Yukinobu et al. .............. 428/212 |
| 5,415,815 | A | | 5/1995 | Bruno |

(Continued)

FOREIGN PATENT DOCUMENTS

EP    0 100 670 A1    2/1984
(Continued)

OTHER PUBLICATIONS

3M, "Lamination Techniques for Converters of Laminating Adhesives", Technical Bulletin, Mar. 2004, 6 pages.
(Continued)

*Primary Examiner* — Timothy L Rude
(74) *Attorney, Agent, or Firm* — Seed IP Law Group PLLC

(57) ABSTRACT

A transparent conductor including a conductive layer coated on a substrate is described. More specifically, the conductive layer comprises a network of nanowires that may be embedded in a matrix. The conductive layer is optically clear, patternable and is suitable as a transparent electrode in visual display devices such as touch screens, liquid crystal displays, plasma display panels and the like.

11 Claims, 32 Drawing Sheets

U.S. PATENT DOCUMENTS

| | | | | |
|---|---|---|---|---|
| 5,436,353 | A | 7/1995 | Chetcuti | 549/15 |
| 5,456,747 | A | 10/1995 | Ibbotson | |
| 5,518,810 | A | 5/1996 | Nishihara et al. | 428/328 |
| 5,554,446 | A | 9/1996 | Minder et al. | 428/411.1 |
| 5,560,998 | A | 10/1996 | Oyamatsu et al. | |
| 5,716,663 | A | 2/1998 | Capote et al. | 427/96 |
| 5,719,016 | A | 2/1998 | Christian et al. | 430/530 |
| 5,731,119 | A | 3/1998 | Eichorst et al. | 430/63 |
| 5,750,054 | A | 5/1998 | Cinquina et al. | |
| 5,759,230 | A | 6/1998 | Chow et al. | 75/362 |
| 5,788,738 | A | 8/1998 | Pirzada et al. | 75/331 |
| 5,820,957 | A | 10/1998 | Schroeder et al. | |
| 5,851,507 | A | 12/1998 | Pirzada et al. | 423/659 |
| 5,867,945 | A | 2/1999 | Scafidi | 52/16 |
| 5,874,684 | A | 2/1999 | Parker et al. | 75/228 |
| 5,897,945 | A | 4/1999 | Lieber et al. | 428/323 |
| 5,905,000 | A | 5/1999 | Yadav et al. | 429/33 |
| 5,952,040 | A | 9/1999 | Yadav et al. | 427/126.3 |
| 5,958,514 | A | 9/1999 | Havey et al. | |
| 6,045,925 | A | 4/2000 | Klabunde et al. | 428/548 |
| 6,241,451 | B1 | 6/2001 | Albright et al. | 414/501 |
| 6,265,466 | B1 | 7/2001 | Glatkowski et al. | 523/137 |
| 6,274,412 | B1 | 8/2001 | Kydd et al. | 438/149 |
| 6,294,401 | B1 | 9/2001 | Jacobson et al. | 438/99 |
| 6,331,672 | B1 | 12/2001 | Matsuda et al. | |
| 6,379,745 | B1 | 4/2002 | Kydd et al. | 427/96 |
| 6,416,818 | B1 | 7/2002 | Aikens et al. | 427/383.1 |
| 6,444,495 | B1 | 9/2002 | Leung et al. | 438/118 |
| 6,536,106 | B1 | 3/2003 | Jackson et al. | 29/872 |
| 6,541,539 | B1 | 4/2003 | Yang et al. | 523/200 |
| 6,632,274 | B2 | 10/2003 | Kawamoto et al. | 106/286.4 |
| 6,641,775 | B2 | 11/2003 | Vigliotti et al. | 264/618 |
| 6,673,142 | B2 | 1/2004 | Tofuku et al. | 106/287.16 |
| 6,686,249 | B1 | 2/2004 | Yukinobu et al. | 438/328 |
| 6,706,402 | B2 | 3/2004 | Rueckes et al. | 428/408 |
| 6,713,176 | B2 | 3/2004 | Yadav et al. | 428/402 |
| 6,773,823 | B2 | 8/2004 | O'Connor et al. | 428/548 |
| 6,781,116 | B2 | 8/2004 | Bateman | 250/281 |
| 6,781,166 | B2 | 8/2004 | Lieber et al. | 257/211 |
| 6,783,569 | B2 | 8/2004 | Cheon et al. | 75/348 |
| 6,803,392 | B1 | 10/2004 | Köhler et al. | |
| 6,813,931 | B2 | 11/2004 | Yadav et al. | 73/31.05 |
| 6,825,239 | B2 | 11/2004 | Wilhelm et al. | |
| 6,835,591 | B2 | 12/2004 | Rueckes et al. | 438/99 |
| 6,849,109 | B2 | 2/2005 | Yadav et al. | 106/31.13 |
| 6,855,202 | B2 | 2/2005 | Alivisatos et al. | 117/68 |
| 6,872,645 | B2 | 3/2005 | Duan et al. | 438/584 |
| 6,881,604 | B2 | 4/2005 | Lindstrom et al. | 438/99 |
| 6,882,051 | B2 | 4/2005 | Majumdar et al. | 257/746 |
| 6,905,756 | B2 | 6/2005 | Yamamoto et al. | |
| 6,912,092 | B2 | 6/2005 | Ukuda | 359/642 |
| 6,916,842 | B2 | 7/2005 | Manzer | 514/424 |
| 6,916,872 | B2 | 7/2005 | Yadav et al. | 524/430 |
| 6,929,896 | B2 | 8/2005 | Yamato et al. | |
| 6,933,331 | B2 | 8/2005 | Yadav et al. | 523/210 |
| 6,936,761 | B2 | 8/2005 | Pichler | 136/256 |
| 6,939,576 | B2 | 9/2005 | Deshpande et al. | |
| 6,942,921 | B2 | 9/2005 | Rueckes et al. | 428/408 |
| 6,946,410 | B2 | 9/2005 | French et al. | 438/800 |
| 6,949,678 | B2 | 9/2005 | Kunimoto et al. | |
| 6,949,931 | B2 | 9/2005 | Cole et al. | 324/464 |
| 6,975,067 | B2 | 12/2005 | McCormick et al. | |
| 6,982,206 | B1 | 1/2006 | Berman et al. | 438/400 |
| 6,996,147 | B2 | 2/2006 | Majumdar et al. | |
| 7,014,918 | B2 | 3/2006 | Terry et al. | |
| 7,029,514 | B1 | 4/2006 | Yang et al. | 75/348 |
| 7,033,416 | B2 | 4/2006 | Kurihara et al. | 75/351 |
| 7,033,729 | B2 | 4/2006 | Jung et al. | |
| 7,037,379 | B2 | 5/2006 | Croce | |
| 7,051,945 | B2 | 5/2006 | Empedocles et al. | |
| 7,060,241 | B2 | 6/2006 | Glatkowski | 423/447.1 |
| 7,062,848 | B2 | 6/2006 | Pan et al. | 29/825 |
| 7,064,372 | B2 | 6/2006 | Duan et al. | 257/296 |
| 7,067,328 | B2 | 6/2006 | Dubrow et al. | 438/1 |
| 7,091,120 | B2 | 8/2006 | Buretea et al. | 438/602 |
| 7,135,055 | B2 | 11/2006 | Mirkin et al. | 75/343 |
| 7,135,394 | B2 | 11/2006 | Houng et al. | 438/610 |
| 7,135,728 | B2 | 11/2006 | Duan et al. | 257/296 |
| 7,136,237 | B2 | 11/2006 | Ogawa | 359/795 |
| 7,147,687 | B2 | 12/2006 | Mirkin et al. | 75/343 |
| 7,190,049 | B2 | 3/2007 | Tuominen et al. | 257/618 |
| 7,255,796 | B2 | 8/2007 | Chen et al. | |
| 7,270,694 | B2 | 9/2007 | Li et al. | 75/351 |
| 7,341,944 | B2 | 3/2008 | Harutyunyan | 438/679 |
| 7,846,786 | B2 | 12/2010 | Lee et al. | 438/151 |
| 7,849,424 | B2 | 12/2010 | Wolk et al. | 716/3 |
| 2002/0013160 | A1 | 1/2002 | Harano | 455/556 |
| 2002/0022801 | A1 | 2/2002 | DeLegge | 604/178 |
| 2002/0063242 | A1 | 5/2002 | Hayashi et al. | 252/500 |
| 2002/0172820 | A1 | 11/2002 | Majumdar et al. | |
| 2003/0008123 | A1 | 1/2003 | Glatkowski et al. | |
| 2003/0030760 | A1 | 2/2003 | Nishiki | 349/43 |
| 2003/0072891 | A1 | 4/2003 | Murakami et al. | 427/569 |
| 2003/0074492 | A1 | 4/2003 | Cochran | 710/5 |
| 2003/0082412 | A1 | 5/2003 | Fukuda et al. | 428/697 |
| 2003/0148380 | A1 | 8/2003 | Belcher | |
| 2003/0185990 | A1 | 10/2003 | Bittner et al. | 427/385.5 |
| 2003/0211333 | A1 | 11/2003 | Watanabe et al. | 428/422.8 |
| 2004/0016914 | A1 | 1/2004 | Matsuda et al. | |
| 2004/0071949 | A1 | 4/2004 | Glatkowski et al. | |
| 2004/0105980 | A1 | 6/2004 | Sudarshan et al. | 428/404 |
| 2004/0112964 | A1 | 6/2004 | Empedocles et al. | |
| 2004/0127640 | A1 | 7/2004 | Belcher et al. | |
| 2004/0147049 | A1 | 7/2004 | Lee et al. | 438/20 |
| 2005/0003081 | A1 | 1/2005 | Nakano et al. | 427/160 |
| 2005/0009714 | A1 | 1/2005 | Chen et al. | 508/591 |
| 2005/0064185 | A1 | 3/2005 | Buretea et al. | 428/364 |
| 2005/0064508 | A1 | 3/2005 | Belcher et al. | |
| 2005/0128788 | A1 | 6/2005 | Segal et al. | |
| 2005/0164515 | A9 | 7/2005 | Belcher et al. | |
| 2005/0165120 | A1 | 7/2005 | Kumar et al. | 516/78 |
| 2005/0170336 | A1 | 8/2005 | Belcher et al. | |
| 2005/0189883 | A1 | 9/2005 | Suh et al. | |
| 2005/0191448 | A1 | 9/2005 | Suh et al. | 428/32.69 |
| 2005/0221083 | A1 | 10/2005 | Belcher et al. | |
| 2006/0070559 | A1 | 4/2006 | Yoest et al. | |
| 2006/0109400 | A1 | 5/2006 | Wang | |
| 2006/0111008 | A1* | 5/2006 | Arthur et al. | 445/46 |
| 2006/0214156 | A1 | 9/2006 | Pan et al. | |
| 2006/0215250 | A1 | 9/2006 | Shibuya et al. | 359/270 |
| 2006/0254502 | A1 | 11/2006 | Garrou et al. | |
| 2006/0257638 | A1 | 11/2006 | Glatkowski et al. | 428/292.1 |
| 2007/0012980 | A1 | 1/2007 | Duan et al. | 257/296 |
| 2007/0065651 | A1 | 3/2007 | Glatkowski et al. | 428/297.4 |
| 2007/0074316 | A1* | 3/2007 | Alden et al. | 977/762 |
| 2007/0275320 | A1 | 11/2007 | Washio et al. | 430/270.1 |
| 2008/0143906 | A1* | 6/2008 | Allemand et al. | 349/43 |
| 2008/0210052 | A1 | 9/2008 | Allemand | 75/300 |
| 2008/0233675 | A1 | 9/2008 | Lee et al. | 438/104 |
| 2008/0259262 | A1 | 10/2008 | Jones et al. | 349/139 |
| 2009/0052029 | A1 | 2/2009 | Dai et al. | 359/486 |
| 2009/0223703 | A1 | 9/2009 | Winoto | 174/257 |
| 2009/0283304 | A1 | 11/2009 | Winoto | 174/257 |
| 2009/0321113 | A1 | 12/2009 | Allemand et al. | 174/257 |
| 2010/0243295 | A1 | 9/2010 | Allemand et al. | 174/250 |
| 2010/0307792 | A1 | 12/2010 | Allemand et al. | 174/126.1 |
| 2011/0024159 | A1 | 2/2011 | Allemand et al. | 174/126.1 |
| 2011/0042126 | A1 | 2/2011 | Spaid et al. | 174/250 |
| 2011/0045272 | A1 | 2/2011 | Allemand | 428/292.1 |
| 2011/0048170 | A1 | 3/2011 | Bhatia et al. | 75/330 |
| 2011/0163403 | A1 | 7/2011 | Bhatia et al. | 257/432 |

FOREIGN PATENT DOCUMENTS

| | | |
|---|---|---|
| EP | 0 234 347 A1 | 9/1987 |
| EP | 0 534 744 A1 | 3/1993 |
| EP | 0 653 763 A1 | 5/1995 |
| EP | 0 132 565 B2 | 11/1998 |
| EP | 1 046 945 A2 | 10/2000 |
| EP | 1 089 113 A2 | 4/2001 |
| EP | 1209694 A2 | 5/2002 |
| EP | 1 220 234 A1 | 7/2002 |
| EP | 1 619 524 A1 | 1/2006 |
| JP | 57 61025 A | 4/1982 |
| JP | 05194856 A | 8/1993 |
| JP | 06005115 A | 1/1994 |
| JP | 06162818 A | 6/1994 |
| JP | 06215631 A | 8/1994 |

| | | | |
|---|---|---|---|
| JP | 07094036 A | 4/1995 |
| JP | 09324324 A | 12/1997 |
| JP | 10017325 A | 1/1998 |
| JP | 10046382 A | 2/1998 |
| JP | 10226007 A | 8/1998 |
| JP | 2001093414 | 4/2001 |
| JP | 2001205600 A | 7/2001 |
| JP | 2001291431 A | 10/2001 |
| JP | 2004035962 A | 2/2004 |
| JP | 2004055486 A | 2/2004 |
| JP | 2004111106 A | 4/2004 |
| JP | 2004182546 A | 7/2004 |
| JP | 2004196923 A | 7/2004 |
| JP | 2004196981 A | 7/2004 |
| JP | 2004230690 A | 8/2004 |
| JP | 2004253326 A | 9/2004 |
| JP | 2004253796 A | 9/2004 |
| JP | 2004256702 A | 9/2004 |
| JP | 2005103723 A | 4/2005 |
| JP | 3665969 | 6/2005 |
| JP | 2005239481 A | 9/2005 |
| JP | 2005277405 A | 10/2005 |
| JP | 2005281357 A | 10/2005 |
| JP | 2005311330 A | 11/2005 |
| JP | 2005317394 A | 11/2005 |
| JP | 2005317395 A | 11/2005 |
| JP | 2005335054 A | 12/2005 |
| JP | 2006035771 A | 2/2006 |
| JP | 2006035773 A | 2/2006 |
| JP | 2006049843 A | 2/2006 |
| JP | 2006075961 A | 3/2006 |
| JP | 2006103982 A | 4/2006 |
| JP | 2006103983 A | 4/2006 |
| JP | 2006111675 A | 4/2006 |
| JP | 2006133528 A | 5/2006 |
| JP | 2006171336 A | 6/2006 |
| JP | 2006517485 T2 | 7/2006 |
| JP | 2006233252 A | 9/2006 |
| JP | 2006239790 A | 9/2006 |
| JP | 2006272876 A | 10/2006 |
| JP | 2006310353 A | 11/2006 |
| JP | 3903159 | 4/2007 |
| JP | 2007091859 A | 4/2007 |
| JP | 2007098563 A | 4/2007 |
| JP | 2007105822 A | 4/2007 |
| JP | 2007112133 A | 5/2007 |
| WO | 02/072930 A1 | 9/2002 |
| WO | WO 03/058728 A1 | 7/2003 |
| WO | 03/068674 A1 | 8/2003 |
| WO | 03/086961 A2 | 10/2003 |
| WO | 03/106573 A1 | 12/2003 |
| WO | 2004/005182 A1 | 1/2004 |
| WO | 2004/022637 A2 | 3/2004 |
| WO | 2004/034421 A2 | 4/2004 |
| WO | 2004/069736 A2 | 8/2004 |
| WO | 2004/097466 A1 | 11/2004 |
| WO | WO 2005/038824 A1 | 4/2005 |
| WO | 2005/040460 A1 | 5/2005 |
| WO | 2005/078770 A2 | 8/2005 |
| WO | 2006/006462 A1 | 1/2006 |
| WO | 2006/062160 A1 | 6/2006 |
| WO | WO 2006/070559 A1 | 7/2006 |
| WO | 2006/091823 A2 | 8/2006 |
| WO | 2007/022226 A2 | 2/2007 |
| WO | 2007/061428 A2 | 5/2007 |

OTHER PUBLICATIONS

Bühler and Belluš, "Photopolymers as a Powerful Tool in Modern Technology", Pure & Appl. Chem. 67(1):25-31, 1995.

Crivello, "Cationic Polymerization—Iodonium and Sulfonium Salt Photoinitiators", Advances in Polymer Science 62:1-48, 1984.

Mao et al., "Viral Assembly of Oriented Quantum Dot Nanowires", PNAS 100(12):6946-6951, Jun. 10, 2003.

Mao et al., "Virus-Based Toolkit for the Directed Synthesis of Magnetic and Semiconducting Nanowires", Science 303:213-217, Jan. 9, 2004.

Sun et al., "Crystalline Silver Nanowires by Soft Solution Processing", Nano Letters 2(2):165-168, 2002.

Sun et al., "Uniform Silver Nanowires Synthesis by Reducing AgNO3 with Ethylene Glycol in the Presence of Seeds and Poly(Vinyl Pyrrolidone)", Chem. Mater. 14(11):4736-4745, 2002.

Sun et al., "Polyol Synthesis of Uniform Silver Nanowires: A Plausible Growth Mechanism and the Supporting Evidence", Nano Letters 3(7):955-960, 2003.

Adachi et al., "Formation of a Transparent Conductive Film Using Gold Nanowires," Source:Preprints for Annual Meeting of the Society of Chemical Engineers, vol. 67:660, 2002.

Adachi et al., "Gold Nanowire Formation of 2-Dimensional Network Structure with Electric Conductivity," *Journal of Chemical Engineering of Japan* 37(5):604-608, 2004.

Komatsu, M., "Morphology of Nanoparticles and Applications Thereof," Chemical Sensors 19 (a):118-120, 2003.

Hirata, H., "Gold Nanorod and its Properties," *Newer Metal Industry*, pp. 19-21, 2003.

Ulbricht, et al., "Transparent carbon nanotube sheets as 3-D charge collectors in organic solar cells," Solar Energy Materials & Solar Cells 91:416-419, 2007.

Walter et al., "Electrodeposition of Portable Metal Nanowire Arrays," *Physical Chemistry of Interfaces and Nanomaterials*, vol. 4807, 2002.

Wang et al., "Glucose Reduction Route Synthesis of Uniform Silver Nanowires in Large-scale," *Chemistry Letters* 33(9):1160-1161, 2004.

Yan et al., "DNA-Templated Self-Assembly of Protein Arrays and Highly Conductive Nanowires," *Science* 301:1882-1884. Sep. 26, 2003.

* cited by examiner

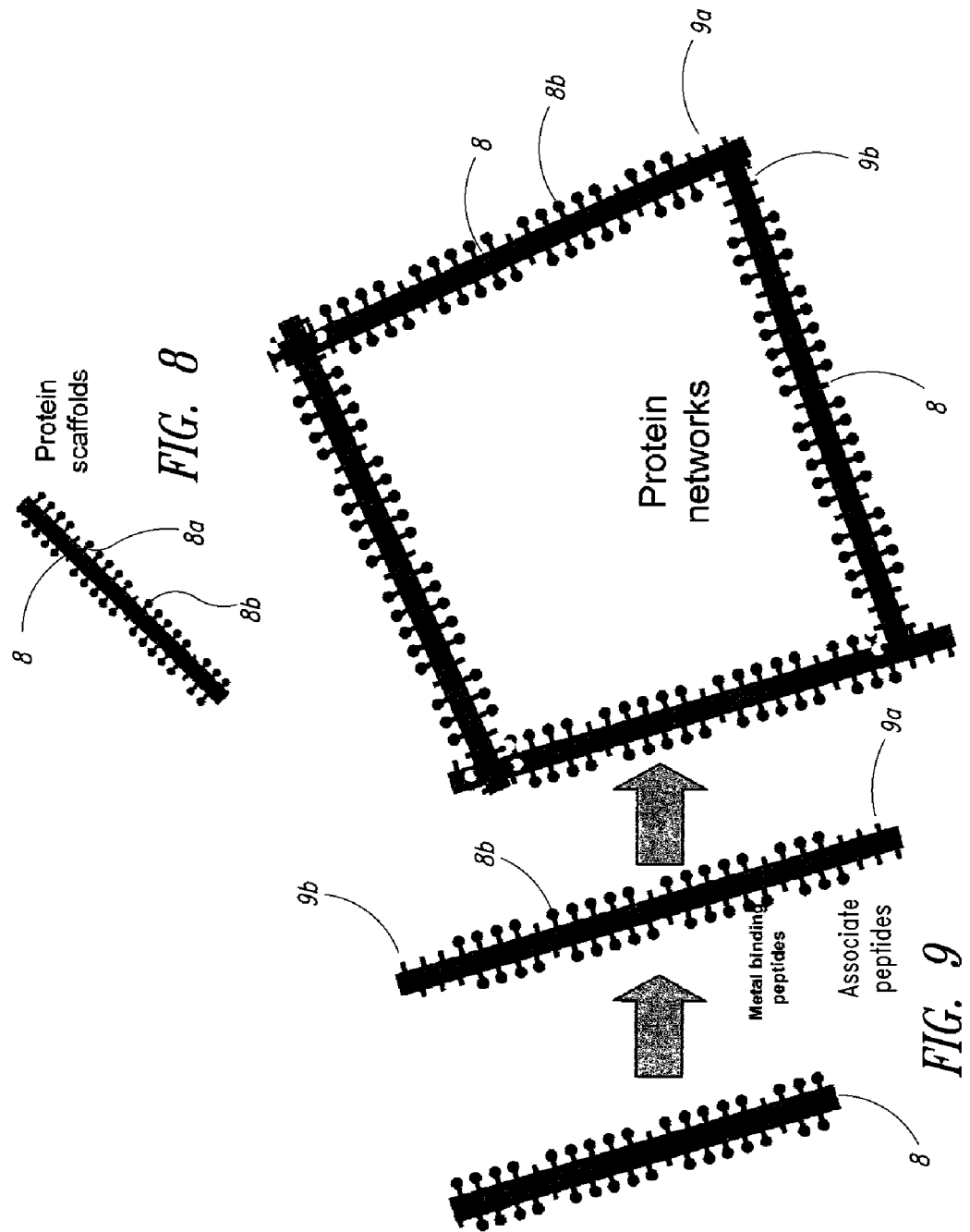

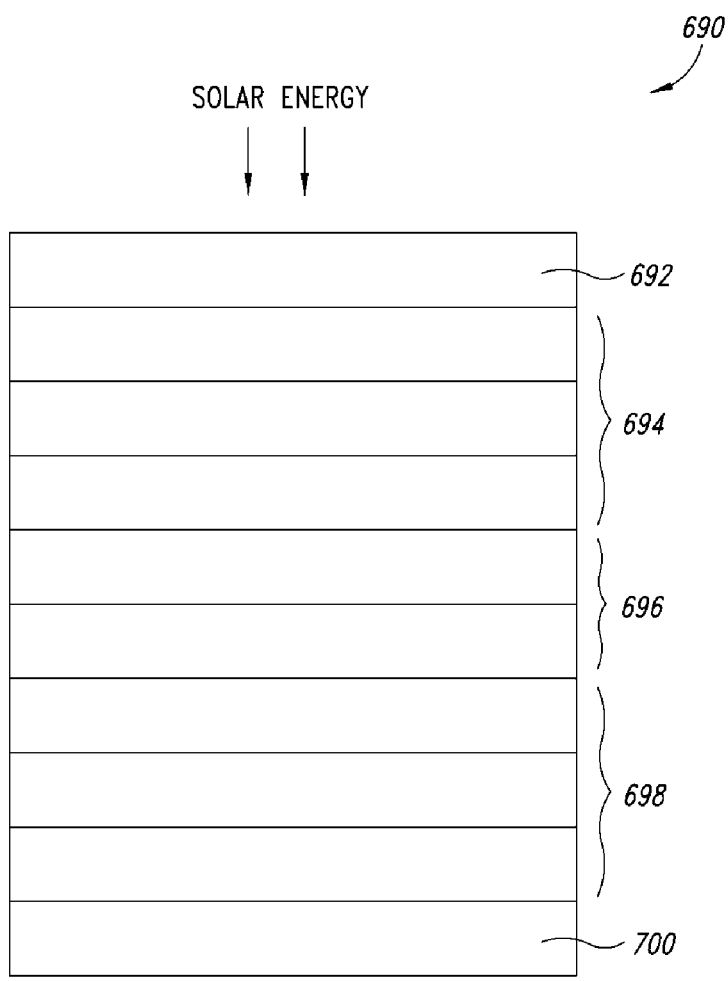
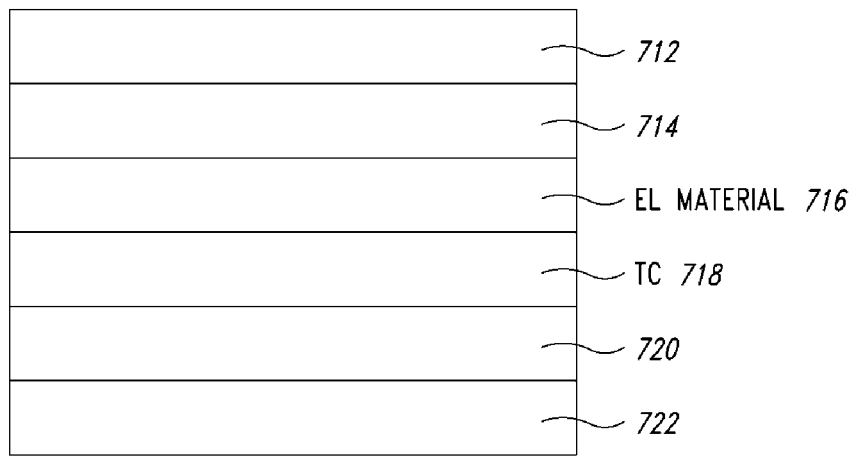

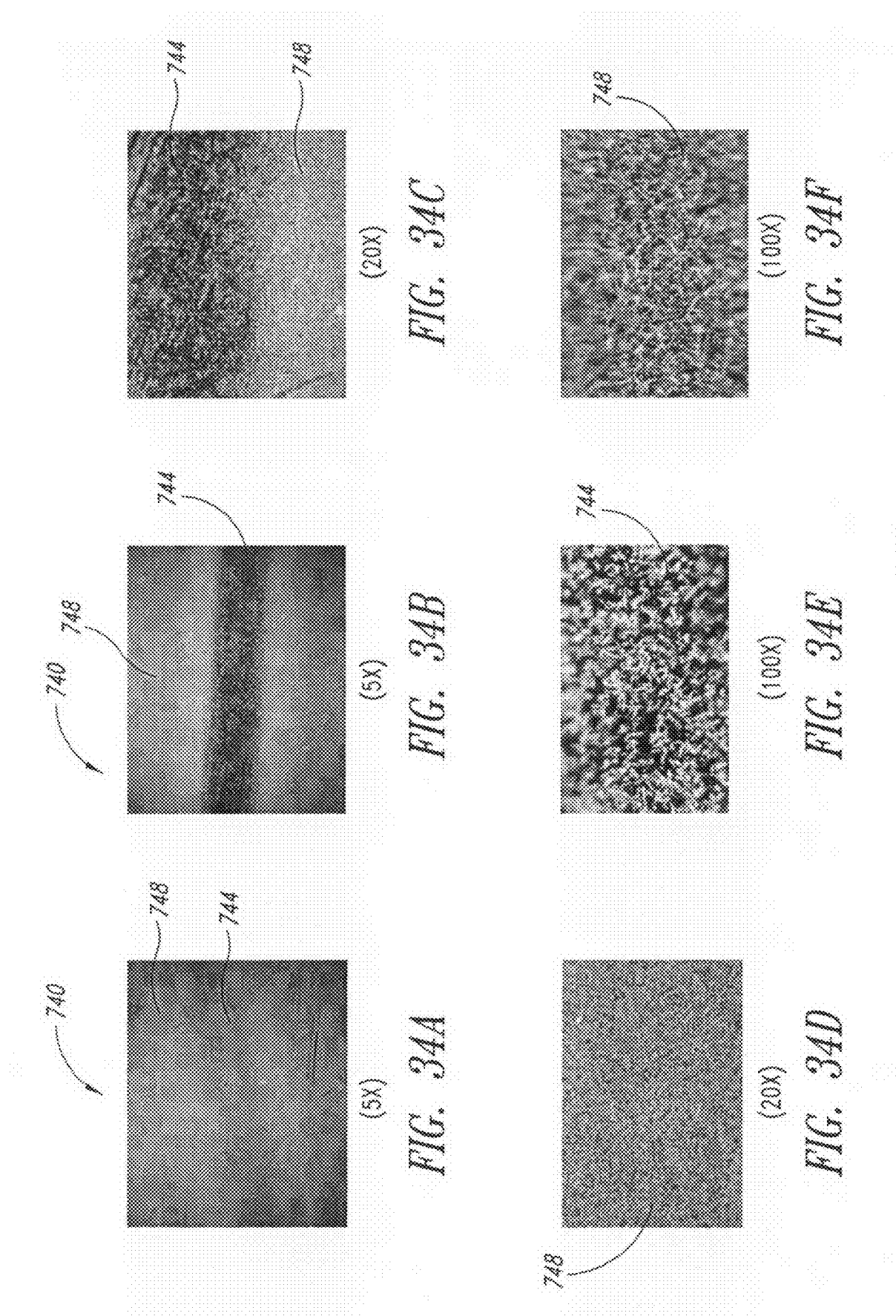

NANOWIRE-BASED TRANSPARENT CONDUCTORS AND APPLICATIONS THEREOF

BACKGROUND

1. Technical Field

This invention is related to transparent conductors, methods of manufacturing and patterning the same, and applications thereof.

2. Description of the Related Art

Transparent conductors refer to thin conductive films coated on high-transmittance surfaces or substrates. Transparent conductors may be manufactured to have surface conductivity while maintaining reasonable optical transparency. Such surface conducting transparent conductors are widely used as transparent electrodes in flat liquid crystal displays, touch panels, electroluminescent devices, and thin film photovoltaic cells, as anti-static layers and as electromagnetic wave shielding layers.

Currently, vacuum deposited metal oxides, such as indium tin oxide (ITO), are the industry standard materials to provide optically transparency and electrical conductivity to dielectric surfaces such as glass and polymeric films. However, metal oxide films are fragile and prone to damage during bending or other physical stresses. They also require elevated deposition temperatures and/or high annealing temperatures to achieve high conductivity levels. There also may be issues with the adhesion of metal oxide films to substrates that are prone to adsorbing moisture such as plastic and organic substrates, e.g. polycarbonates. Applications of metal oxide films on flexible substrates are therefore severely limited. In addition, vacuum deposition is a costly process and requires specialized equipment. Moreover, the process of vacuum deposition is not conducive to forming patterns and circuits. This typically results in the need for expensive patterning processes such as photolithography.

Conductive polymers have also been used as optically transparent electrical conductors. However, they generally have lower conductivity values and higher optical absorption (particularly at visible wavelengths) compared to the metal oxide films, and suffer from lack of chemical and long-term stability.

Accordingly, there remains a need in the art to provide transparent conductors having desirable electrical, optical and mechanical properties, in particular, transparent conductors that are adaptable to any substrates, and can be manufactured and patterned in a low-cost, high-throughput process.

BRIEF SUMMARY

Transparent conductors based on electrically conductive nanowires in an optically clear matrix are described. The transparent conductors are patternable and are suitable as transparent electrodes in a wide variety of devices including, without limitation, display devices (e.g., touch screens, liquid crystal displays, plasma display panels and the like), electroluminescent devices, and photovoltaic cells.

One embodiment describes a method comprising: forming a nanowire network on a substrate, the nanowire network comprising a plurality of nanowires; forming a matrix on the nanowire network according to a pattern, the pattern defining a first region and a second region of the nanowire network, wherein the nanowire network in the first region comprises matrix-protected nanowires, and the nanowire network in the second region comprises unprotected nanowires; etching the nanowire network whereby the unprotected nanowires are dissolved; and removing the unprotected nanowires.

Another embodiment describes a method for patterning a conductive layer comprising: forming the conductive layer on a substrate, the conductive layer comprising a matrix and a plurality of electrically conductive nanowires embedded therein; placing a mask on the conductive layer to define a masked region and a unmasked region; and etching the unmasked region A further embodiment describes a transparent conductor comprising: a substrate; and a conductive layer on the substrate, the conductive layer including a plurality of metal nanowires and a matrix, wherein the matrix comprises a partially cured polymeric material.

A further embodiment describes switching device comprising: a transparent electrode; and a thin film transistor including a substrate, a gate electrode, an semiconductor active layer, a source electrode and a drain electrode, wherein the transparent electrode includes a plurality of electrically conductive nanowires.

A further embodiment describes a color filter comprising: a transparent substrate; a plurality of colored pixels arranged on the transparent substrate; a conductive layer overlying the plurality of colored pixels, wherein the conductive layer includes a plurality of electrically conductive nanowires.

A further embodiment describes a liquid crystal display comprising: a bottom panel comprising a plurality of thin film transistors, each thin film transistor being connected to a pixel electrode; an upper panel comprising a plurality of color pixels, the plurality of color pixels being connected to a common electrode; and a liquid crystal layer disposed between the first panel and the second panel, wherein at least one of the pixel electrode and the common electrode include a plurality of electrically conductive nanowires.

A further embodiment describes a plasma display panel comprises: a bottom panel including an address electrode; an upper panel including a display electrode; a plurality of plasma discharge cells between the bottom panel and the top panel, wherein the display electrode includes a plurality of electrically conductive nanowires.

A further embodiment describes a single junction solar cell structure comprising: a bottom contact; a semiconductor diode on the bottom contact; and a top contact on the semiconductor diode, wherein at least one of the bottom contact and the top contact include a plurality of electrically conductive nanowires.

A further embodiment describes a multi-junction solar cell comprising: a bottom contact; a first cell on the bottom contact, the first cell comprising a first semiconductor diode; a tunnel diode on the first cell; a second cell on the tunnel diode, the second cell comprising a second semiconductor diode; and a top contact, wherein at least one of the bottom contact and the top contact include a plurality of electrically conductive nanowires, and wherein the first semiconductor diode has a lower bandgap than that of the second semiconductor diode.

A further embodiment describes an electroluminescent device comprising: a bottom electrode; an electroluminescent material layer overlying the bottom electrode; and a top electrode overlying the electroluminescent material layer, wherein the top electrode is optically clear and includes a plurality of electrically conductive nanowires.

A further embodiment describes a method for patterning a conductive layer comprising: forming the conductive layer on a substrate, the conductive layer comprising a matrix and a network of electrically conductive nanowires embedded therein; and treating a region of the conductive layer to convert the electrically conductive nanowires within the region to non-conductive nanowires, thereby forming a patterned conductive layer including a treated region having a first resistivity and an untreated region having a second resistivity.

Another embodiment provides an electronic device including: a substrate having at least one surface relief feature; and a transparent conductive layer overlying the substrate, the transparent conductive layer including a plurality of electrically conductive nanowires wherein one or more nanowires are at least partially contoured to the at least one surface relief feature of the substrate.

A further embodiment provides a transparent conductor comprising: a substrate; and a conductive layer on the substrate, the conductive layer including a plurality of metal nanowires, wherein the conductive layer is patterned such that first regions of the surface of the transparent conductor are conductive and second regions of the surface of the transparent conductor are non-conductive and a line width between the conductive and non-conductive regions is from 5 µm to 50 µm.

A further embodiment provides a transparent conductor comprising: a substrate; and a conductive layer on the substrate, the conductive layer including a plurality of metal nanowires, wherein the conductive layer is patterned such that first regions of the surface of the transparent conductor are conductive and second regions of the surface of the transparent conductor are non-conductive and at least a portion of the nanowires at an interface between the conductive region and non-conductive region are severed.

A further embodiment provides a touch screen device comprising: a first transparent conductive layer including metal nanowires, wherein the metal nanowires are at or above an electrical percolation level; and a second transparent conductive layer positioned above the first transparent conductive layer and separated therefrom by a spacer, the second transparent conductive layer including metal nanowires, wherein the metal nanowires are at or above the electrical percolation level; wherein at least one of the first transparent conductive layer and the second transparent conductive layer is further coated with a transparent overcoat, the transparent overcoat including a plurality of conductive particles at below the electrical percolation level.

A further embodiment provides a multi-layer structure comprising: a substrate; a conductive layer formed on the substrate, wherein the conductive layer comprises a first plurality of metallic nanowires, the first plurality of metallic nanowires reaching an electrical percolation level; and an overcoat formed on the conductive layer, the overcoat incorporating a second plurality of conductive particles, the second plurality of conductive particles being below the electrical percolation level.

A further embodiment provides a method for providing electromagnetic shielding comprising: providing a composite including a plurality of metallic nanowires and a matrix material; applying the composite to a substrate in need of electromagnetic shielding; and forming a conductive layer including the plurality of metallic nanowires dispersed in the matrix material, the conductive layer having a surface conductivity of no more than $10^8 \Omega/\square$.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

FIG. 8 illustrates a protein scaffold coupled to conductive particles via various binding sites.

FIG. 9 illustrates the formation of a conductive network of biological templates based on the coupling of associate peptides.

FIG. 29C shows a multi-junction solar cell structure according to another embodiment.

FIG. 30 shows a thin film EL device according to one embodiment.

FIGS. 34A-34F show photographs of the patterned conductive films before and after an adhesive tape treatment at various levels of magnification.

DETAILED DESCRIPTION

Certain embodiments are directed to a transparent conductor based on a conductive layer of nanowires. In particular, the conductive layer includes a sparse network of metal nanowires. In addition, the conductive layer is transparent, flexible and can include at least one surface that is conductive. It can be coated or laminated on a variety of substrates, including flexible and rigid substrates. The conductive layer can also form part of a composite structure including a matrix material and the nanowires. The matrix material can typically impart certain chemical, mechanical and optical properties to the composite structure. Other embodiments describe methods of fabricating and patterning the conductive layer.

Conductive Nanowires

Figure 1:
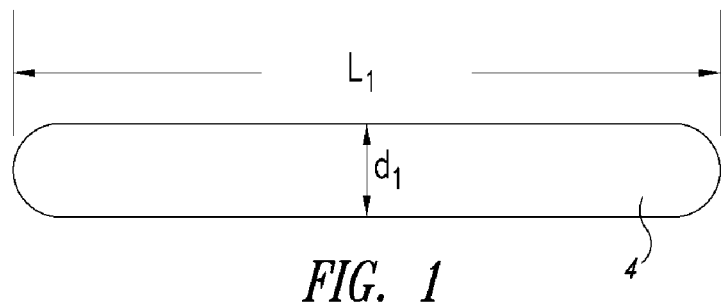
FIG. 1 is a schematic illustration of a nanowire.

FIG. 1 illustrates a nanowire 2 having an aspect ratio equal to the length $L_1$ divided by the diameter $d_1$. Suitable nanowires typically have aspect ratios in the range of 10 to 100,000. Larger aspect ratios can be favored for obtaining a transparent conductor layer since they may enable more efficient conductive networks to be formed while permitting lower overall density of wires for a high transparency. In other words, when conductive nanowires with high aspect ratios are used, the density of the nanowires that achieves a conductive network can be low enough that the conductive network is substantially transparent.

One method to define the transparency of a layer to light is by its absorption coefficient. The illumination of light passing through a layer can be defined as:

$$I = I_o e^{-ax}$$

in which $I_o$ is the incoming light on a first side of the layer, I is the illumination level that is present on a second side of the layer, and $e^{-ax}$ is the transparency factor. In the transparency factor, a is the absorption coefficient and x is the thickness of the layer. A layer having a transparency factor near 1, but less than 1 can be considered to be substantially transparent.

FIGS. 2-5 illustrate some of the optical and electrical characteristics of the conductive nanowires.

Figure 2:
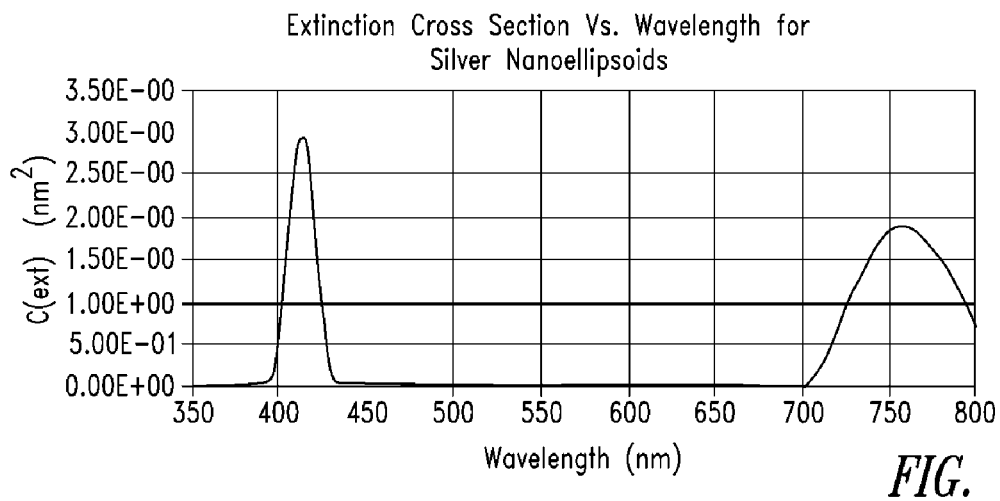
FIG. 2 is a graph illustrating the expected optical properties of a silver nanoellipsoids at various wavelengths of light.

FIG. 2 shows a theoretical model of the light absorption of silver nanoellipsoids at various wavelengths of light. Depending on widths and lengths, silver nanoellipsoids exhibit a high extinction coefficient to a narrow band of light in the wavelengths between 400 and 440 nanometers and to wavelengths of light above 700 nm. However, they are substantially transparent between about 440 to about 700 nm, which falls in the visible range.

Figure 3:
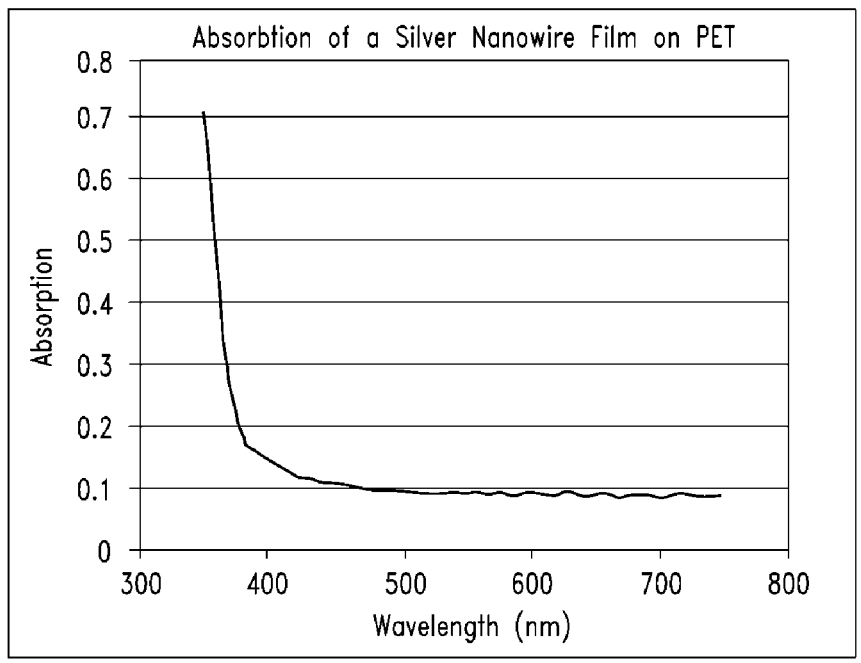
FIG. 3 illustrates the absorption spectrum of a silver nanowire layer on a polyethylene terephthalate (PET) substrate.

FIG. 3 shows the absorption spectrum of a layer of silver nanowires deposited on a polyethylene terephthalate (PET) substrate. As shown by the absorption profile, the silver nanowire layer on PET substrate is substantially transparent between about 440 nm to 700 nm, agreeing with the results of the theoretical model shown in FIG. 2.

Figure 4:
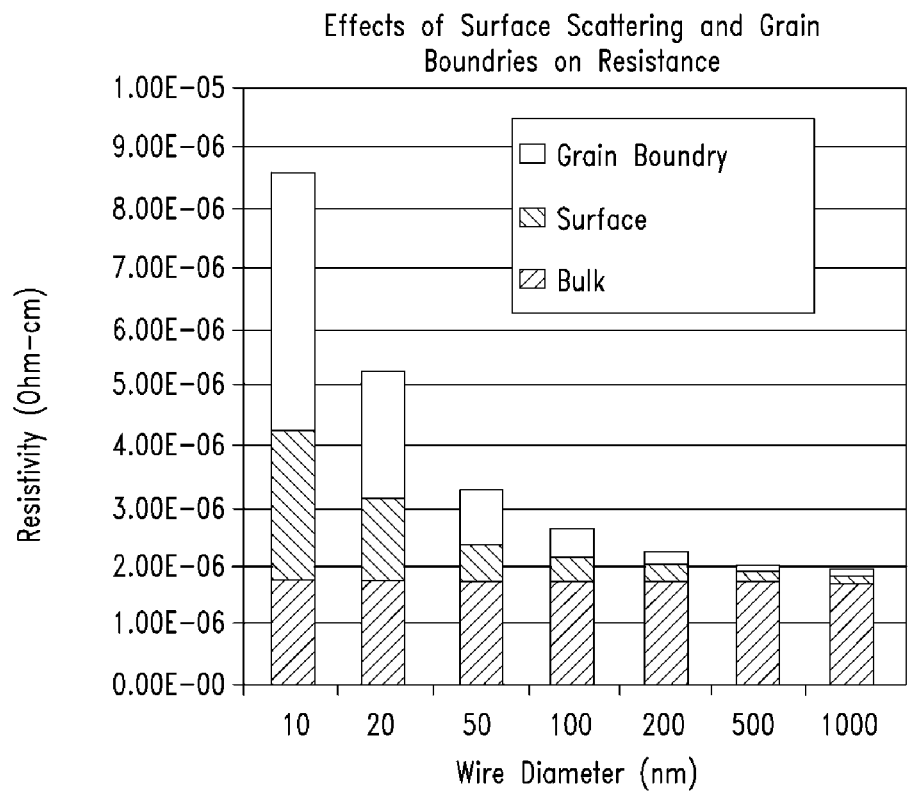
FIG. 4 is a graph illustrating expected values for various resistivity properties of a nanowire based on the wire diameter.
Figure 5:
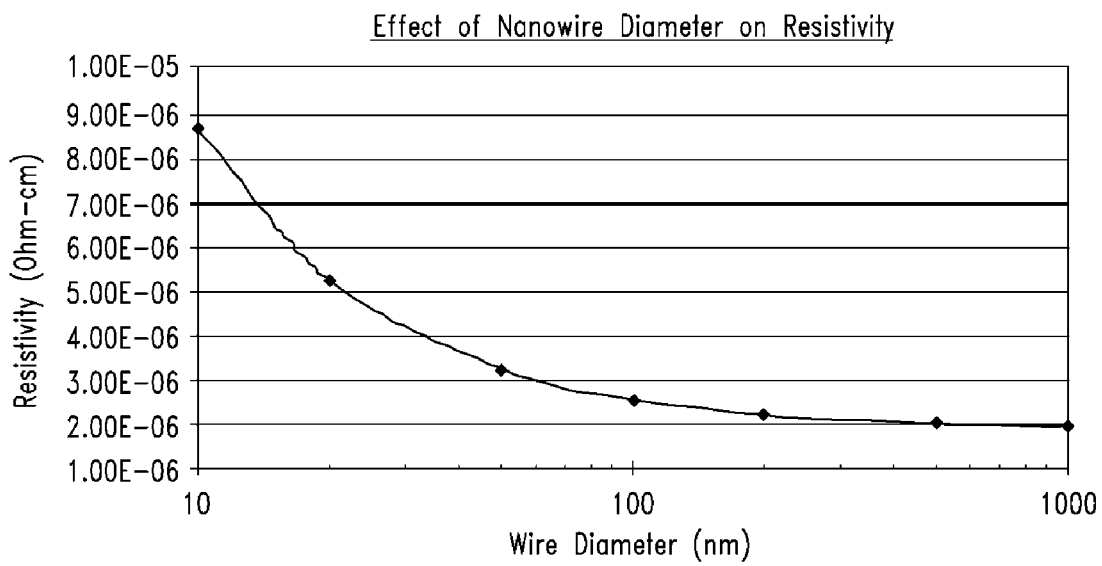
FIG. 5 is a graph illustrating the expected overall resistivity as a function of the diameters of nanowires.

FIGS. 4 and 5 show the results of theoretical modeling of the resistivity of metal nanowires based on their diameters. For a larger diameter of nanowire, the resistivity decreases substantially although it will absorb more light. As can be seen in FIG. 4, the effects on resistivity based on the grain boundary and surface scattering are high at diameters of less than 10 nm. As the diameter increases, these effects are drastically reduced. The overall resistivity is therefore reduced greatly for diameter that increases from 10 nm to over 100 nm (see, also FIG. 5). This improvement in electrical properties must be balanced, however, against the decreased transparency for applications requiring a transparent conductor.

Figure 6:
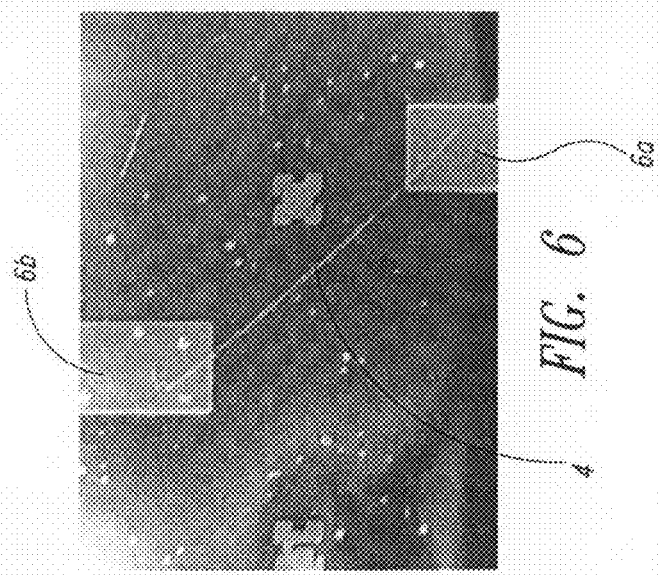
FIG. 6 shows an SEM image of a single silver nanowires connecting between two metal contacts.

FIG. 6 shows a single Ag nanowire 4 that extends between two other electrical terminals 6a and 6b, to provide an electrically conductive path from terminal 6a to terminal 6b. The term "terminal" includes contact pads, conduction nodes and any other starting and ending points that may be electrically connected. The aspect ratio, size, shape and the distribution of the physical parameters of the nanowires are selected to provide the desired optical and electrical properties. The number of such wires that will provide a given density of Ag nanowires is selected to provide acceptable electrical conduction properties for coupling terminal 6a to terminal 6b. For example, hundreds of Ag nanowires 4 can extend from terminal 6a to 6b to provide a low resistance electrical conduction path, and the concentration, aspect ratio, size and shape can be selected to provide a substantially transparent conductor. Therefore, transparent, electrical conduction is provided from terminal 6a to terminal 6b using a plurality of Ag nanowires.

As can be appreciated, the distance from terminal 6a to terminal 6b may be such that the desired optical properties are not obtained with a single nanowire. A plurality of many nanowires may need to be linked to each other at various points to provide a conductive path from terminal 6a to terminal 6b. According to the invention, the nanowires are selected based on the desired optical properties. Then, the number of nanowires that provides the desired conduction path and overall resistance on that path are selected to achieve acceptable electrical properties for an electrical conduction layer from terminal 6a to terminal 6b.

The electrical conductivity of the transparent layer is mainly controlled by a) the conductivity of a single nanowire, b) the number of nanowires between the terminals, and c) the connectivity between the nanowires. Below a certain nanowire concentration (also referred to as the percolation threshold, or electrical percolation level), the conductivity between the terminals is zero, i.e. there is no continuous current path provided because the nanowires are spaced too far apart. Above this concentration, there is at least one current path available. As more current paths are provided, the overall resistance of the layer will decrease.

Conductive nanowires include metal nanowires and other conductive particles having high aspect ratios (e.g., higher than 10). Examples of non-metallic nanowires include, but are not limited to, carbon nanotubes (CNTs), metal oxide nanowires, conductive polymer fibers and the like.

As used herein, "metal nanowire" refers to a metallic wire comprising element metal, metal alloys or metal compounds (including metal oxides). At least one cross-sectional dimension of the metal nanowire is less than 500 nm, and less than 200 nm, and more preferably less than 100 nm. As noted above, the metal nanowire has an aspect ratio (length:diameter) of greater than 10, preferably greater than 50, and more preferably greater than 100. Suitable metal nanowires can be based on any metal, including without limitation, silver, gold, copper, nickel, and gold-plated silver.

The metal nanowires can be prepared by known methods in the art. In particular, silver nanowires can be synthesized through solution-phase reduction of a silver salt (e.g., silver nitrate) in the presence of a polyol (e.g., ethylene glycol) and poly(vinyl pyrrolidone). Large-scale production of silver nanowires of uniform size can be prepared according to the methods described in, e.g., Xia, Y. et al., *Chem. Mater.* (2002), 14, 4736-4745, and Xia, Y. et al., *Nanoletters* (2003) 3(7), 955-960.

Alternatively, the metal nanowires can be prepared using biological templates (or biological scaffolds) that can be mineralized. For example, biological materials such as viruses and phages can function as templates to create metal nanowires. In certain embodiments, the biological templates can be engineered to exhibit selective affinity for a particular type of material, such as a metal or a metal oxide. More detailed description of biofabrication of nanowires can be found in, e.g., Mao, C. B. et al., "Virus-Based Toolkit for the Directed Synthesis of Magnetic and Semiconducting Nanowires," (2004) *Science,* 303, 213-217. Mao, C. B. et al., "Viral Assembly of Oriented Quantum Dot Nanowires," (2003) *PNAS*, vol. 100, no. 12, 6946-6951; Mao, C. B. et al., "Viral Assembly of Oriented Quantum Dot Nanowires," (2003) *PNAS,* 100(12), 6946-6951, U.S. application Ser. No. 10/976, 179 and U.S. Provisional Application Ser. No. 60/680,491, which references are incorporated herein in their entireties.

More specifically, a conductive material or a conductor (e.g., a metal nanowire) can directly bind to a biological template based on an affinity between the conductive material and certain binding sites (e.g., peptide sequences) on the biological template.

In other embodiments, a conductive material can be created by a nucleation process, during which a precursor is converted to conductive particles that bind to the biological templates, the conductive particles being capable of further growing into a continuous conductive layer. This process is also referred to as "mineralization" or "plating". For example, a metal precursor (e.g., a metal salt) can be converted to an elemental metal in the presence of a reducing agent. The resulting elemental metal binds to the biological templates and grows into a continuous metallic layer.

In other embodiments, a seed material layer is initially nucleated onto the biological material. Thereafter, a metal precursor can be converted into metal and plated on the seed material layer. The seed material can be selected, for example, based on a material that causes the nucleation and growth of a metal out of a solution containing a corresponding metal precursor. To illustrate, a seed material layer containing palladium can cause the mineralization of Cu or Au. As one specific example, for creating a Cu conductor, acceptable seed materials may contain palladium, a palladium based molecule, Au or an Au based molecule. For an oxide conductor, a zinc oxide may be used as a nucleation material. Examples of the seed material include Ni, Cu, Pd, Co, Pt, Ru, Ag, Co alloys or Ni alloys. Metals, metal alloys and metal oxides that can be plated include, without limitation, Cu, Au, Ag, Ni, Pd, Co, Pt, Ru, W, Cr, Mo, Ag, Co alloys (e.g., CoPt), Ni alloys, Fe alloys (e.g., FePt) or $TiO_2$, $CO_3O_4$, $Cu_2O$, $HfO_2$, ZnO, vanadium oxides, indium oxide, aluminum oxide, indium tin oxide, nickel oxide, copper oxide, tin oxide, tantalum oxide, niobium oxide, vanadium oxide or zirconium oxide.

Any of a number of different biological materials can be used to provide the templates for creating the metal nanowires, including proteins, peptides, phages, bacteria, viruses, and the like. The techniques for selecting, forming and engineering a biological material that will couple to a desired metal or conductive material are described in U.S. application Ser. Nos. 10/155,883 and 10/158,596; both applications are in the name of Cambrios Technologies Corporation and are incorporated herein by reference.

As noted above, biological templates such as protein, a peptide, or other biological material can be engineered to have affinity sites for a selected seed material or a selected conductive material. Proteins or peptides with affinity to a specific material can be identified through a protein discovery process such as phage display, yeast display, cell surface display or others. For example in the case of phage display, libraries of phages (e.g., M13 phages) can be created by inserting a wide variety of different sequences of peptides into a population of the phage. A protein having high affinity for a specific target molecule can be isolated and its peptide structure can be identified.

In particular, the genetic sequences of the biological molecules can be controlled to provide a number of copies of particular peptide sequences in certain types of phage particles. For example, about 3000 copies of P8 proteins can be arranged in an ordered array along the length of M13 phage particles. The P8 proteins can be modified to include a specific peptide sequence that can nucleate the formation of or bind a conductive material, thereby providing conductive nanowires of high conductivity. Advantageously, this technique allows for the ability to control the geometry and crystalline structure of the nanowires through the use of biological template molecules, e.g., proteins having specifically designed or controlled peptide sequences. To that end, peptides or proteins with binding affinity for silver, gold or palladium have been identified which can be incorporated into a phage structure to create nanowires with dimensions based on those of the phage particles.

Figure 7:
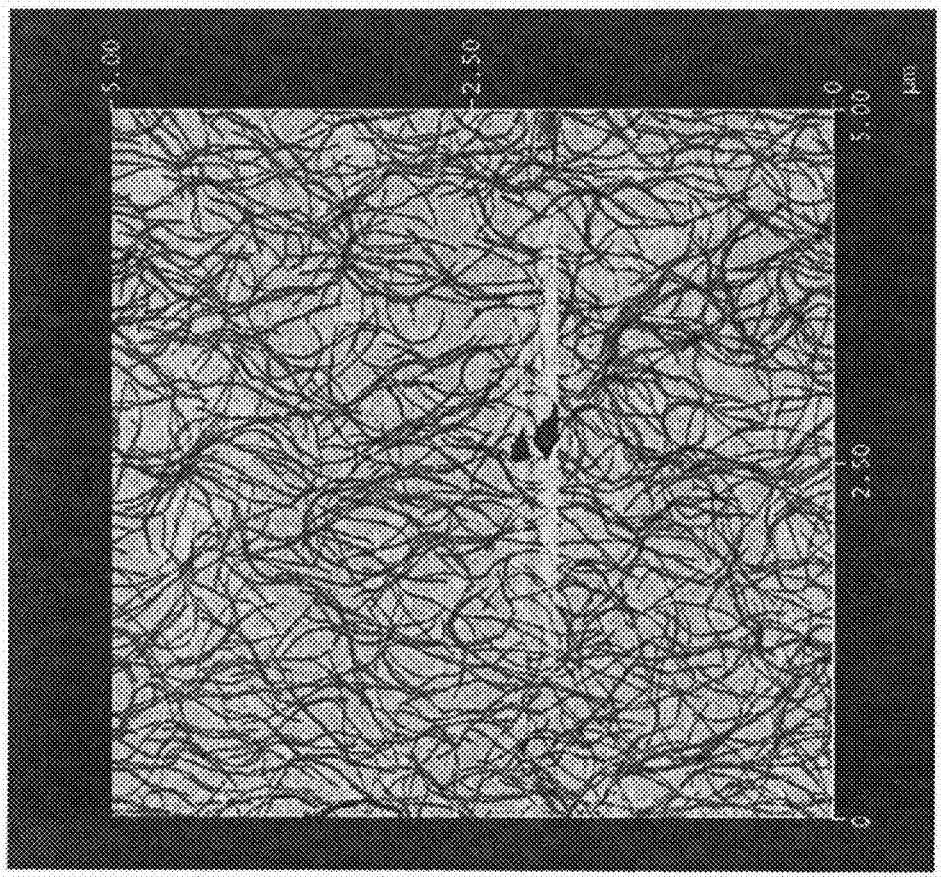
FIG. 7 illustrates a network of filamentous proteins that function as biological templates for a transparent conductor.

Biological materials other than phages can be used as templates for the formation of conductive nanowires. For example, filamentous proteins which self-assemble into long strands of tens of microns in length can be used as an alternative template (see, FIG. 7). Advantageously, such a template protein can be synthesized to have a much larger aspect ratio than phage, which leads to lower percolative threshold concentrations of the conductive nanowires. Additionally, proteins are easier to synthesize in large volume than phage particles. Large scale manufacture of proteins, such as enzymes used as detergent additives, is well developed.

FIG. 8 shows a schematic version of a protein scaffold 8 having a number of binding sites 8a coupled with conductive particles 8b. The binding sites are selected to have an affinity for the conductive particles, such as Au, Ag, Cu and Ni. Alternatively, the binding sites 8a have an affinity for a seed material layer (e.g., Pd and Au) that can further nucleate the conductive particles, such as Cu and the like. The protein scaffold 8 can also be engineered to have a plurality of binding sites 8a with such affinity. It is preferred to have them spaced at frequent and regular intervals along their length to increase the conductivity of the final conductive layer.

The length of a biological material, such as a protein, as well as its diameter is easily engineered using known techniques. It is engineered to have the correct dimensions for the optical properties. Once the size, shape and aspect ratio have been selected, the biological material can be exposed to conductive material 8b, such as a metal, or a precursor of the metal.

FIG. 9 illustrates a further embodiment of fabricating conductive nanowires using biological templates. The protein scaffold 8 can be further engineered to include binding partners such as associate peptides 9a and 9b at respective ends. Binding partners can couple with each other through any type of associative interaction, including, for example, ionic interaction, covalent bonding, hydrogen bonding, hydrophobic interaction, and the like. The interaction between the associate peptides 9a and 9b encourage the self-assembly of the conductive nanowires into 2-D interconnected mesh networks, as shown in the final sequence in FIG. 8. The association peptides and their locations may be of the type to encourage the forming of meshes, end to end connection, cross-connections, and other desired shapes for the conductive layer. In the example shown in FIG. 8, the conductive material 8b has already bound to the protein scaffold 8 before the protein scaffolds form a network. It should be understood, that protein scaffold 8 can also form a network prior to the binding of the conductive material.

Thus, the use of biological template having associate peptides or other binding partners allows for the formation of a conductive layer of highly connected network than would be possible with random nanowires. The particular network of the biological templates can therefore be selected to achieve a desired degree of order in the conductive layer.

Template-based synthesis is particularly suited for fabricating nanowires of particular dimensions, morphologies and compositions. Further advantages of biologically based manufacturing of nano-materials include: solution processing that can be modified for high throughput, ambient temperature deposition, superior conformality and production of conductive layers.

Conductive Layer and Substrate

Figure 10A:
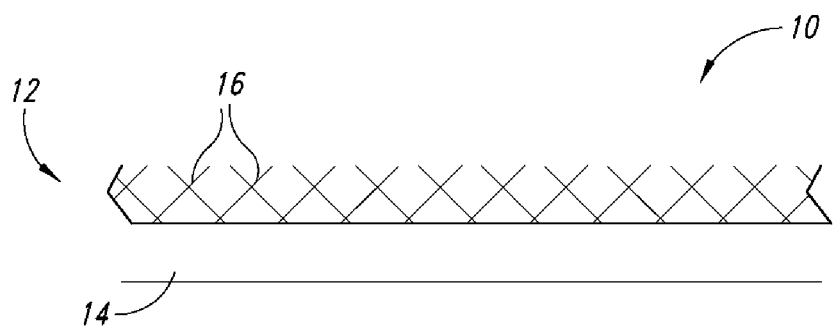
FIG. 10A illustrates schematically an embodiment of a metal nanowires-based transparent conductor.

As an illustrative example, FIG. 10A shows a transparent conductor 10 comprising a conductive layer 12 coated on a substrate 14. The conductive layer 12 comprises a plurality of metal nanowires 16. The metal nanowires form a conductive network.

Figure 10B:
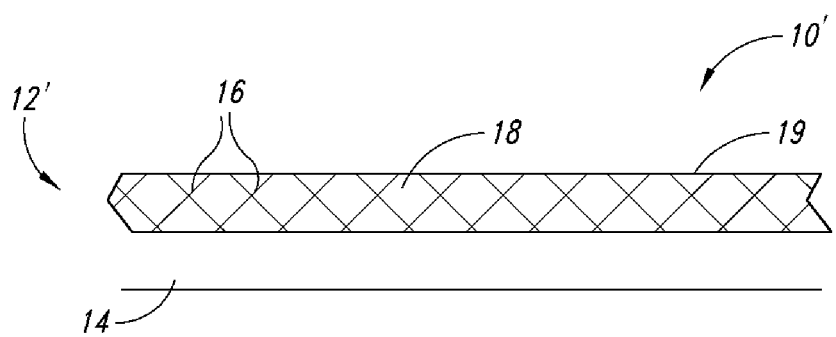
FIG. 10B illustrates schematically another embodiment of a metal nanowires-based transparent conductor.

FIG. 10B shows another example of a transparent conductor 10', in which a conductive layer 12' is formed on the substrate 14. The conductive layer 12' includes a plurality of metal nanowires 16 embedded in a matrix 18.

"Matrix" refers to a solid-state material into which the metal nanowires are dispersed or embedded. Portions of the nanowires may protrude from the matrix material to enable access to the conductive network. The matrix is a host for the metal nanowires and provides a physical form of the conductive layer. The matrix protects the metal nanowires from adverse environmental factors, such as corrosion and abrasion. In particular, the matrix significantly lowers the permeability of corrosive elements in the environment, such as moisture, trace amount of acids, oxygen, sulfur and the like.

In addition, the matrix offers favorable physical and mechanical properties to the conductive layer. For example, it can provide adhesion to the substrate. Furthermore, unlike metal oxide films, polymeric or organic matrices embedded with metal nanowires are robust and flexible. As will be discussed in more detail herein, flexible matrices make it possible to fabricate transparent conductors in a low-cost and high throughput process.

Moreover, the optical properties of the conductive layer can be tailored by selecting an appropriate matrix material. For example, reflection loss and unwanted glare can be effectively reduced by using a matrix of a desirable refractive index, composition and thickness.

Typically, the matrix is an optically clear material. A material is considered "optically clear" or "optically transparent", if the light transmission of the material is at least 80% in the visible region (400 nm-700 nm). Unless specified otherwise, all the layers (including the substrate and the nanowire network layer) in a transparent conductor described herein are preferably optically clear. The optical clarity of the matrix is typically determined by a multitude of factors, including without limitation: the refractive index (RI), thickness, consistency of RI throughout the thickness, surface (including interface) reflection, and haze (a scattering loss caused by surface roughness and/or embedded particles).

In certain embodiments, the matrix is about 10 nm to 5 μm thick, about 20 nm to 1 μm thick, or about 50 nm to 200 nm thick. In other embodiments, the matrix has a refractive index of about 1.3 to 2.5, or about 1.35 to 1.8.

In certain embodiments, the matrix is a polymer, which is also referred to as a polymeric matrix. Optically clear polymers are known in the art. Examples of suitable polymeric matrices include, but are not limited to: polyacrylics such as polymethacrylates (e.g., poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g., EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by Du Pont).

In other embodiments, the polymeric matrix described herein comprises partially polymerized or partially cured polymer. Compared to a fully polymerized or fully cured matrix, a partially cured matrix has lesser degree of cross-linking and/or polymerization and lower molecular weight. Thus, the partially polymerized matrix can be etched under certain conditions and patterning is possible using conventional photolithography. Under a proper polymerization condition, the partially cured matrix may be further cured whereby further cross-linking and polymerization are carried out to provide a matrix of higher molecular weight than that of a partially cured matrix. The partially cured matrix can be etched, followed by a further curing step, to provide a patterned and fully-cured transparent conductor film. Examples of suitable partially cured polymers include, but are not limited to partially cured acrylate, silicone-epoxy, siloxane, novolac, epoxy, urethane, silsesquioxane or polyimide.

One skilled in the art would recognize that the degree of polymerization may impact the etching condition (solution) under which the partially polymerized matrix and/or nanowires can dissolve. Typically, the higher the degree of polymerization, the more difficult it is to etch the matrix.

Preferably, the partially cured matrix has an acceptable degree of physical integrity to protect the nanowires within. This is desirable because an end-user may carry out his own patterning and the subsequent curing to obtain a final transparent conductor film.

In further embodiments, the matrix is an inorganic material. For example, a sol-gel matrix based on silica, mullite, alumina, SiC, MgO—$Al_2O_3$—$SiO_2$, $Al_2O_3$—$SiO_2$, MgO—$Al_2O_3$—$SiO_2$—$Li_2O$ or a mixture thereof can be used.

In certain embodiments, the matrix itself is conductive. For example, the matrix can be a conductive polymer. Conductive polymers are well known in the art, including without limitation: poly(3,4-ethylenedioxythiophene) (PEDOT), polyanilines, polythiophenes, and polydiacetylenes.

"Conductive layer", or "conductive film", refers to a network layer of metal nanowires that provide the conductive media of the transparent conductor. When a matrix is present, the combination of the network layer of metal nanowires and the matrix is also referred to as a "conductive layer". Since conductivity is achieved by electrical charge percolating from one metal nanowire to another, sufficient metal nanowires must be present in the conductive layer to reach an electrical percolation threshold and become conductive. The surface conductivity of the conductive layer is inversely proportional to its surface resistivity, sometimes referred to as sheet resistance, which can be measured by known methods in the art.

Likewise, when a matrix is present, the matrix must be filled with sufficient metal nanowires to become conductive. As used herein, "threshold loading level" refers to a percentage of the metal nanowires by weight after loading of the conductive layer at which the conductive layer has a surface resistivity of no more than about $10^6$ ohm/square (or $\Omega/\square$). More typically, the surface resistivity is no more than $10^5\Omega/\square$, no more than $10^4\Omega/\square$, no more than $1,000\Omega/\square$, no more than $500\Omega/\square$, or no more than $100\Omega/\square$. The threshold loading level depends on factors such as the aspect ratio, the degree of alignment, degree of agglomeration and the resistivity of the metal nanowires.

As is understood by one skilled in the art, the mechanical and optical properties of the matrix are likely to be altered or compromised by a high loading of any particles therein. Advantageously, the high aspect ratios of the metal nanowires allow for the formation of a conductive network through the matrix at a threshold surface loading level preferably of about 0.05 µg/cm² to about 10 µg/cm², more preferably from about 0.1 µg/cm² to about 5 µg/cm² and more preferably from about 0.8 µg/cm² to about 3 µg/cm² for silver nanowires. These surface loading levels do not affect the mechanical or optical properties of the matrix. These values depend strongly on the dimensions and spatial dispersion of the nanowires. Advantageously, transparent conductors of tunable electrical conductivity (or surface resistivity) and optical transparency can be provided by adjusting the loading levels of the metal nanowires.

In certain embodiments, the conductive layer spans the entire thickness of the matrix, as shown in FIG. 10B. Advantageously, a certain portion of the metal nanowires is exposed on a surface 19 of the matrix due to the surface tension of the matrix material (e.g., polymers). This feature is particularly useful for touch screen applications. In particular, a transparent conductor can display surface conductivity on at least one surface thereof. FIG. 10C illustrates how it is believed the network of metal nanowires embedded in a matrix achieves surface conductivity. As shown, while some nanowires, such as nanowire 16a, may be entirely 'submerged' in the matrix 18, ends of other nanowires, such as end 16b, protrude above the surface 19 of the matrix 18. Also, a portion of a middle section of nanowires, such as middle section 16c, may protrude above the surface 19 of the matrix 18. If enough nanowire ends 16b and middle sections 16c protrude above the matrix 18, the surface of the transparent conductor becomes conductive. FIG. 10D is a scanning electron micrograph of the surface of one embodiment of a transparent conductor showing a contour of ends and middle sections of nanowires protruding above a matrix in a transparent conductor.

Figure 10E:
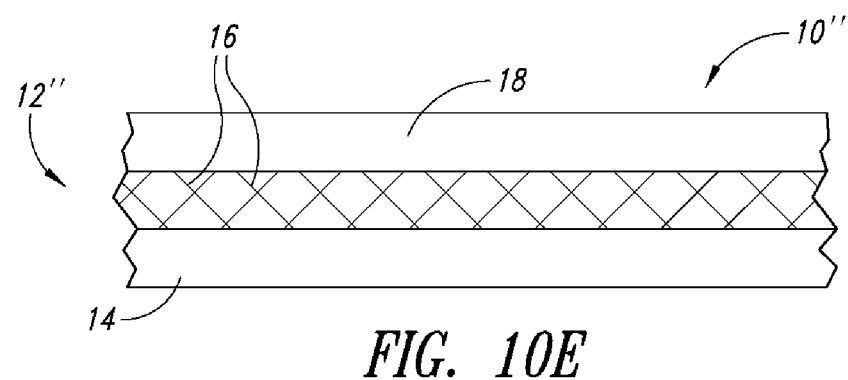
FIG. 10E illustrates schematically another embodiment of a metal nanowires-based transparent conductor.

In other embodiments, the conductive layer is formed by the metal nanowires embedded in a portion of the matrix, as shown in FIG. 10E. The conductive layer 12″ occupies only a portion of the matrix 18 and are completely "submerged" in the matrix 18.

In addition, the nanowire-filled conductive layer may be overlaid with one or more dielectric coatings (e.g., an overcoat or an anti-glare film) which protect or enhance the performance of the conductive layer. In these circumstances, the conductive layer may not be surface conductive, but is characterized with in-plane conductivity.

Figure 10F:
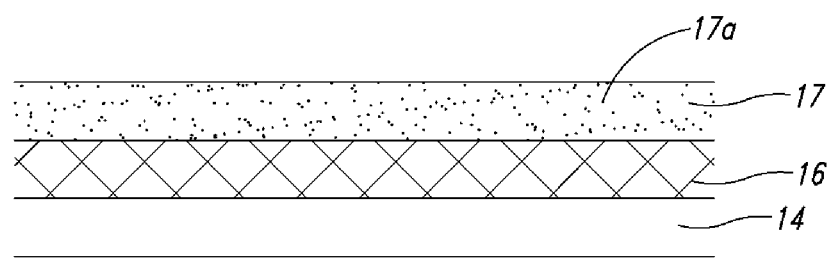
FIG. 10F illustrates schematically a multi-layer structure having a transparent conductive layer coated with a surface-conductive overcoat.
Figure 10C:
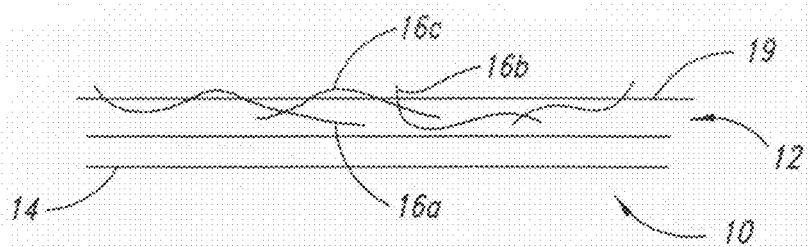
FIG. 10C shows schematically a further embodiment of a metal nanowire based transparent conductor in which portions of the nanowires are exposed on a surface of the transparent conductor.
Figure 10D:
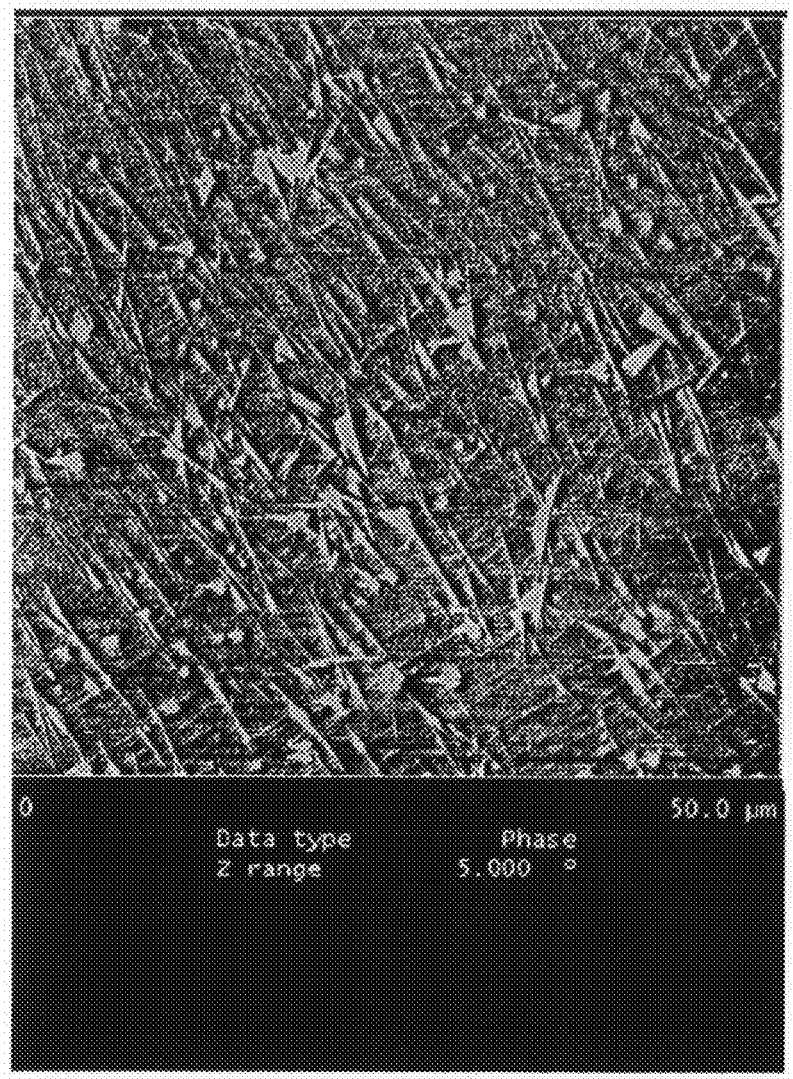
FIG. 10D shows an SEM image of silver nanowires protruding out of a surface of the transparent conductor.

In certain embodiments, surface conductivity in the overcoat can be established by incorporating a plurality of nano-sized conductive particles in the overcoat. As shown in FIG. 10F, a nanowire-based conductive layer 10 is deposited on substrate 14. The conductive layer 10 comprises nanowires 16 which reach the percolation threshold and establish in-plane conductivity. An overcoat 17 is formed on the conductive layer 10. A plurality of conductive particles 17a is embedded in the overcoat 17. Advantageously, the loading level of the nano-sized conductive particles in the overcoat does not need to reach the percolation threshold to exhibit surface conductivity. The conductive layer remains as the current-carrying medium, in which the nanowires have reached electrical percolation level. The conductive particles in the overcoat provide for surface conductivity as a result of their contacts with the underlying nanowires through the thickness of the overcoat.

Thus, one embodiment provides a multi-layer structure comprising: a substrate; a conductive layer formed on the substrate, wherein the conductive layer comprises a first plurality of metallic nanowires, the first plurality of metallic nanowires reaching an electrical percolation level; and an overcoat formed on the conductive layer, the overcoat incorporating a second plurality of conductive particles, the second plurality of conductive particles being below the electrical percolation level.

As used herein, nano-sized conductive particles refer to conductive particles having at least one dimension that is no more than 500 nm, more typically, no more than 200 nm. Examples of suitable conductive particles include, but are not limited to, ITO, ZnO, doped ZnO, metallic nanowires (including those described herein), metallic nanotubes, carbon nanotubes (CNT) and the like.

"Substrate", or "substrate of choice", refers to a material onto which the conductive layer is coated or laminated. The substrate can be rigid or flexible. The substrate can be clear or opaque. The term "substrate of choice" is typically used in connection with a lamination process, as will be discussed herein. Suitable rigid substrates include, for example, glass, polycarbonates, acrylics, and the like. Suitable flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in, e.g., U.S. Pat. No. 6,975,067.

Typically, the optical transparence or clarity of the conductive layer can be quantitatively defined by parameters including light transmission and haze. "Light transmission" (or "light transmissivity") refers to the percentage of an incident light transmitted through a medium. In various embodiments, the light transmission of the conductive layer is at least 80% and can be as high as 98%. For a transparent conductor in which the conductive layer is deposited or laminated on a substrate, the light transmission of the overall structure may be slightly diminished. Performance-enhancing layers, such as an adhesive layer, anti-reflective layer, anti-glare layer, may further contribute to reducing the overall light transmission of the transparent conductor. In various embodiments, the light transmission of the transparent conductors can be at least 50%, at least 60%, at least 70%, or at least 80% and may be as high as at least 91% to 92%.

Haze is an index of light diffusion. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. In various embodiments, the haze of the transparent conductor is no more than 10%, no more than 8%, or no more than 5% and may be as low as no more than 2% to 0.5%.

Performance-Enhancing Layers

As noted above, the conductive layers have superior physical and mechanical characteristics due to the matrix. These characteristics can be further enhanced by introducing additional layers in the transparent conductor structure. Thus, in other embodiments, a multi-layer transparent conductor is described, which comprises one or more layers such as anti-reflective layers, anti-glare layers, adhesive layers, barrier layers, and hard coats.

Figure 11:
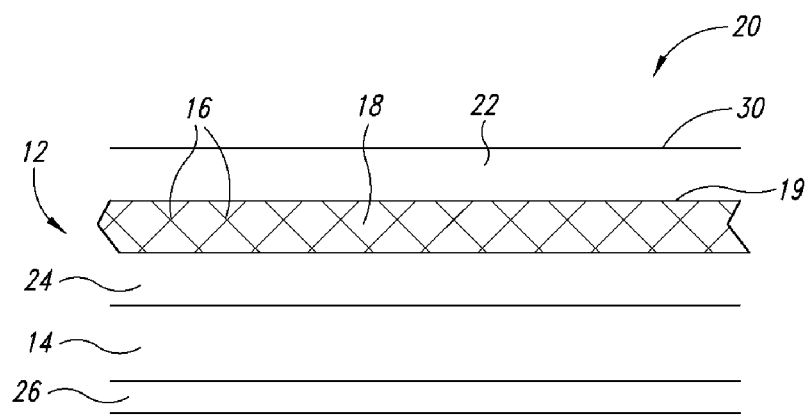
FIG. 11 illustrates schematically a further embodiment of a metal nanowires-based transparent conductor having a multi-layer structure.

As an illustrative example, FIG. 11 shows a multi-layer transparent conductor 20 comprising a conductive layer 12 and a substrate 14, as described above. The multi-layer transparent conductor 20 further comprises a first layer 22 positioned over the conductive layer 12, a second layer 24 positioned between the conductive layer 12 and the substrate 14, and a third layer 26 positioned below the substrate 14. Unless stated otherwise, each of the layers 22, 24 and 26 can be one or more anti-reflective layers, anti-glare layers, adhesive layers, barrier layers, hard coats, and protective films.

The layers 22, 24 and 26 serve various functions, such as enhancing the overall optical performance and improving the mechanical properties of the transparent conductor. These additional layers, also referred to as "performance-enhancing layers", can be one or more anti-reflective layers, anti-glare layers, adhesive layers, barrier layers, and hard coats. In certain embodiments, one performance-enhancing layer provides multiple benefits. For example, an anti-reflective layer can also function as a hard coat and/or a barrier layer. In addition to their specific properties, the performance-enhancing layers are optically clear, as defined herein.

In one embodiment, layer 22 is an anti-reflective layer, layer 24 is an adhesive layer, and layer 26 is a hard coat.

In another embodiment, layer 22 is a hard coat, layer 24 is a barrier layer, and layer 26 is an anti-reflective layer.

In yet another embodiment, layer 22 is a combination of an anti-reflective layer, anti-glare, a barrier layer and a hard coat, layer 24 is an adhesive layer, and layer 26 is an anti-reflective layer.

"Anti-reflective layer" refers to a layer that can reduce reflection loss at a reflective surface of the transparent conductor. The anti-reflective layer can therefore be positioned on the outer surfaces of the transparent conductor, or as an interface between layers. Materials suitable as anti-reflective layers are well known in the art, including without limitation: fluoropolymers, fluoropolymer blends or copolymers, see, e.g., U.S. Pat. Nos. 5,198,267, 5,225,244, and 7,033,729.

In other embodiments, reflection loss can be effectively reduced by controlling the thickness of the anti-reflective layer. For example, with reference to FIG. 11, the thickness of layer 22 can be controlled such that the light reflection of surface 28 and surface 30 cancel each other out. Thus, in various embodiments, the anti-reflective layer is about 100 nm thick or 200 nm thick.

Reflection loss can also be reduced by the appropriate use of textured surfaces, see, e.g. U.S. Pat. No. 5,820,957 and literature on Autoflex MARAG™ and Motheye™ products from MacDiamid Autotype.

"Anti-glare layer" refers to a layer that reduces unwanted reflection at an outer surface of the transparent conductor by providing fine roughness on the surface to scatter the reflection. Suitable anti-glare materials are well known in the art, including without limitation, siloxanes, polystyrene/PMMA blend, lacquer (e.g., butyl acetate/nitrocellulose/wax/alkyd resin), polythiophenes, polypyrroles, polyurethane, nitrocellulose, and acrylates, all of which may comprise a light diffusing material such as colloidal or fumed silica. See, e.g., U.S. Pat. Nos. 6,939,576, 5,750,054, 5,456,747, 5,415,815, and 5,292,784. Blends and copolymers of these materials can have microscale compositional heterogeneities, which can also exhibit light diffusion behavior to reduce glare.

"Hard coat", or "anti-abrasion layer" refers to a coating that provides additional surface protection against scratches and abrasion. Examples of suitable hard coats include synthetic polymers such as polyacrylics, epoxy, polyurethanes, polysilanes, silicones, poly(silico-acrylic) and so on. Typically, the hard coat also comprises colloidal silica. (See, e.g., U.S. Pat. Nos. 5,958,514, 7,014,918, 6,825,239, and references cited therein.) The thickness of the hard coat is typically from about 1 to 50 μm. The degree of hardness can be evaluated by known methods in the art, such as by scratching the coating with a steel wool #000 reciprocating 50 times within a distance of 2 cm at 2 reciprocations/sec under load of 300 g/cm$^2$ (see, e.g., U.S. Pat. No. 6,905,756). The hard coat may be further exposed to an anti-glare process or an anti-reflection treatment by known methods in the art.

"Adhesive layer" refers to any optically clear material that bonds two adjacent layers (e.g., conductive layer and substrate) together without affecting the physical, electrical or optical properties of either layer. Optically clear adhesive material are well known in the art, including without limitation: acrylic resins, chlorinated olefin resins, resins of vinyl chloride-vinyl acetate copolymer, maleic acid resins, chlorinated rubber resins, cyclorubber resins, polyamide resins, cumarone indene resins, resins of ethylene-vinyl acetate copolymer, polyester resins, urethane resins, styrene resins, polysiloxanes and the like.

"Barrier layer" refers to a layer that reduces or prevents gas or fluid permeation into the transparent conductor. It has been shown that corroded metal nanowires can cause a significant decrease in the electrical conductivity as well as the light transmission of the conductive layer. The barrier layer can effectively inhibit atmospheric corrosive gas from entering the conductive layer and contacting the metal nanowires in the matrix. The barrier layers are well known in the art, including without limitation: see, e.g. U.S. Patent Application No. 2004/0253463, U.S. Pat. Nos. 5,560,998 and 4,927,689, EP Patent No. 132,565, and JP Patent No. 57,061,025. Moreover, any of the anti-reflective layer, anti-glare layer and the hard coat can also act as a barrier layer.

In certain embodiments, the multi-layer transparent conductor may further comprise a protective film above the conductive layer (e.g., layer 22). The protective film is typically flexible and can be made of the same material as the flexible substrate. Examples of protective film include, but are not limited to: polyester, polyethylene terephthalate (PET), polybutylene terephthalate, polymethyl methacrylate (PMMA), acrylic resin, polycarbonate (PC), polystyrene, triacetate (TAC), polyvinyl alcohol, polyvinyl chloride, polyvinylidene chloride, polyethylene, ethylene-vinyl acetate copolymers, polyvinyl butyral, metal ion-crosslinked ethylene-methacrylic acid copolymers, polyurethane, cellophane, polyolefins or the like; particularly preferable is PET, PC, PMMA, or TAC because of their high strength.

Corrosion Inhibitors

In other embodiments, the transparent conductor may comprise a corrosion inhibitor, in addition to, or in lieu of the barrier layer as described above. Different corrosion inhibitors may provide protection to the metal nanowires based on different mechanisms. It should be understood that an appropriate selection of the corrosion inhibitor(s) can offer a range of protections to the metal nanowires against adverse environmental impacts, including both oxidation and sulfidation.

According to one mechanism, the corrosion inhibitor binds readily to the metal nanowires, forming a protective film on a metal surface. They are also referred to as barrier-forming corrosion inhibitors.

In one embodiment, the barrier-forming corrosion inhibitor includes certain nitrogen-containing and sulfur-containing organic compounds, such as aromatic triazoles, imidazoles and thiazoles. These compounds have been demonstrated to form stable complexes on a metal surface to provide a barrier between the metal and its environment. For example, benzotriazole (BTA) is a common organic corrosion inhibitor for copper or copper alloys (Scheme 1). Alkyl substituted benzotriazoles, such as tolytriazole and butyl benzyl triazole, can also be used. (See, e.g., U.S. Pat. No. 5,270,364.) Additional suitable examples of corrosion inhibitors include, but are not limited to: 2-aminopyrimidine, 5,6-dimethylbenzimidazole, 2-amino-5-mercapto-1,3,4-thiadiazole, 2-mercaptopyrimidine, 2-mercaptobenzoxazole, 2-mercaptobenzothiazole, and 2-mercaptobenzimidazole.

SCHEME 1

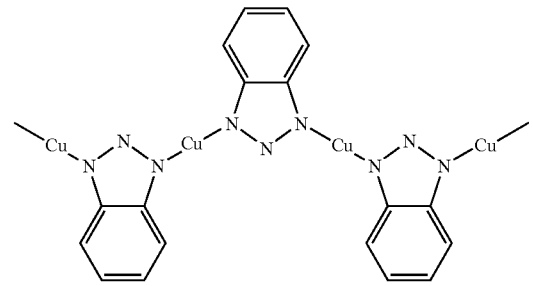

Another class of barrier-forming corrosion inhibitors includes biomolecules that show a particular affinity to the metal surface. These include small biomolecules, e.g. cysteine, and synthetic peptides and protein scaffolds with fused peptide sequences with affinity for metals, e.g. EEEE; see, e.g. U.S. application Ser. Nos. 10/654,623, 10/665,721, 10/965,227, 10/976,179, and 11/280,986, U.S. Provisional Application Ser. Nos. 60/680,491, 60/707,675 and 60/680, 491.

Other barrier-forming corrosion inhibitors include dithiothiadiazole, alkyl dithiothiadiazoles and alkylthiols, alkyl being a saturated $C_6$-$C_{24}$ straight hydrocarbon chain. This type of corrosion inhibitor can self-assemble on a metal surface to form a monolayer (Scheme 2), thereby protecting the metal surface from corroding.

SCHEME 2

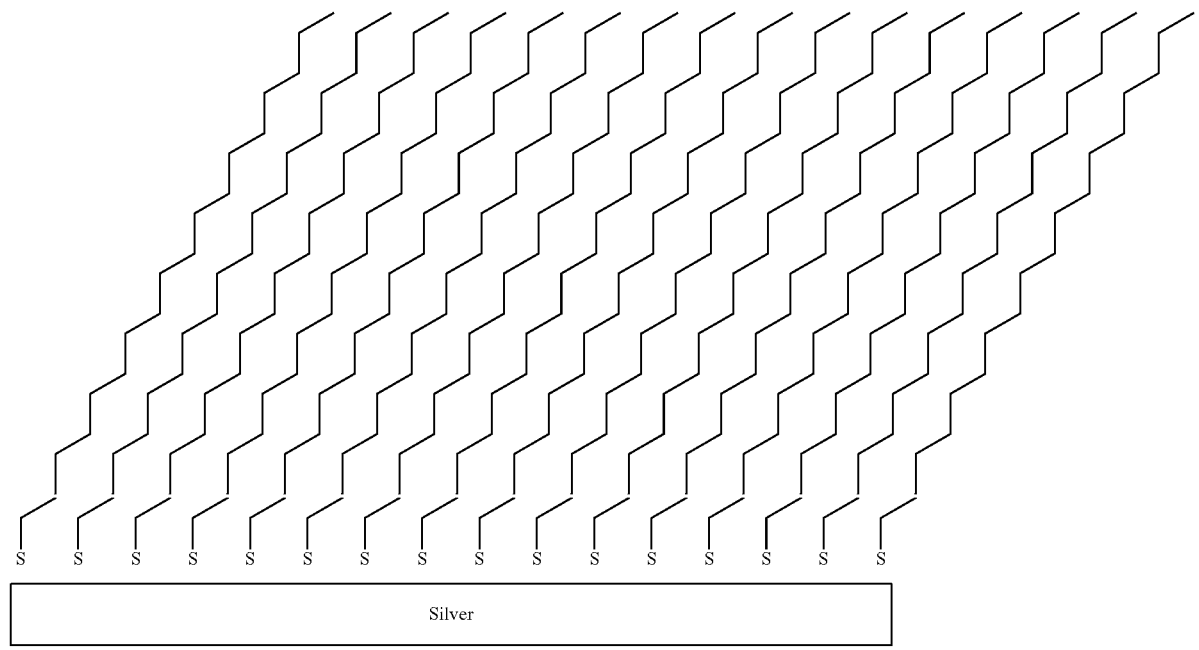

In a particular embodiment, the transparent conductor can comprise a reservoir containing a corrosion inhibitor, providing a continuous supply of the corrosion inhibitor in the vapor phase. The corrosion inhibitors suitable for such sustained delivery include "vapor phase inhibitors" (VPI). VPIs are typically volatile solid materials that sublime and form a monolayer on the surfaces of the metal nanowires. Advantageously, VPIs can be delivered to the metal surfaces and replenished in a sustained manner for long-lasting protection. Suitable VPIs include barrier-forming inhibitors such as triazoles, dithiothiadiazole, alkyl dithiothiadiazoles and alkylthiols, as described herein.

Figure 12:
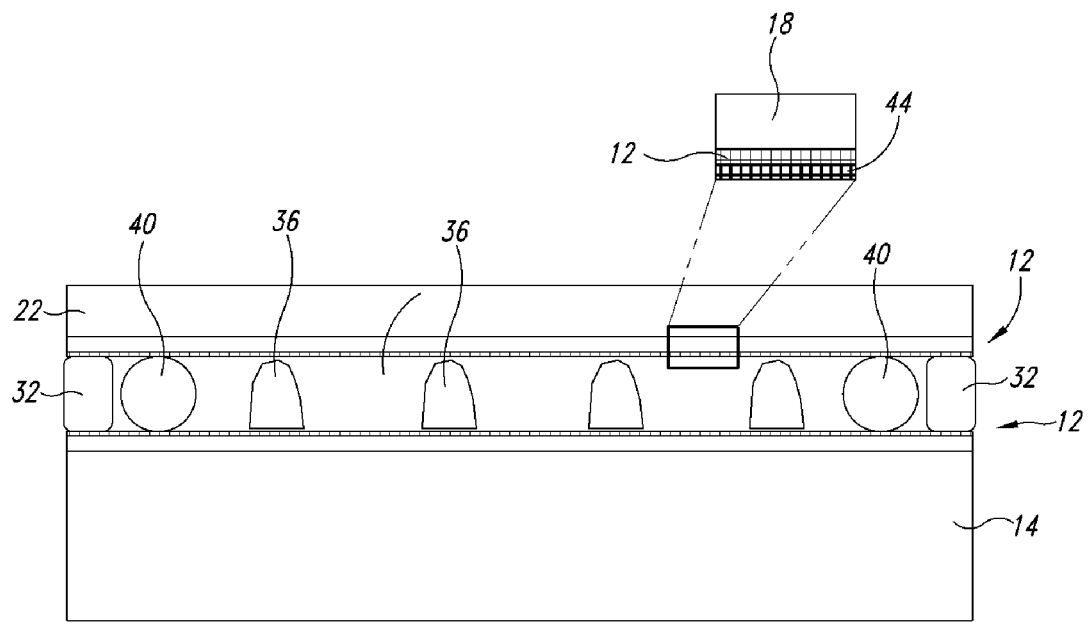
FIG. 12 shows a transparent conductor structure having a reservoir for delivering a vapor phase inhibitor (VPI).

FIG. 12 illustrates such a transparent conductor structure suitable for a touch screen. More specifically, edge seals 32 and spacers 36 are positioned between two conductive layers 12. In the space between the two conductive layers 12, one or more reservoirs 40 are present. The reservoirs 40 are microscopic and are sparsely distributed such that their presence does not cause a reduction in the transmittance of the transparent conductor. The reservoir contains a corrosion inhibitor which can be incorporated into a polymer matrix or impregnated into a porous material from which it can be sublimated into the vapor phase to form a monolayer 44 on the surface of the metal nanowires (see, inset).

According to another mechanism, a corrosion inhibitor binds more readily with a corrosive element (e.g., $H_2S$) than with the metal nanowires. These corrosion inhibitors are known as "scavengers" or "getters", which compete with the metal and sequester the corrosive elements. Examples of $H_2S$ scavengers include, but are not limited to: acrolein, glyoxal, triazine, and n-chlorosuccinimide. (See, e.g., Published U.S. Application No. 2006/0006120.)

In certain embodiments, the corrosion inhibitor (e.g., $H_2S$ scavengers) can be dispersed in the matrix provided its presence does not adversely affect the optical or electrical properties of the conductive layer.

In other embodiments, the metal nanowires can be pre-treated with a corrosion inhibitor before or after being deposited on the substrate. For example, the metal nanowires can be pre-coated with a barrier-forming corrosion inhibitor, e.g., BTA and dithiothiadiazole. In addition, the metal nanowires can also be treated with an anti-tarnish solution. Metal anti-tarnish treatments are known in the art. Specific treatments targeting $H_2S$ corrosion are described in, e.g., U.S. Pat. No. 4,083,945, and U.S. Published Application No. 2005/0148480.

In yet other embodiments, the metal nanowires can be alloyed or plated with another metal less prone to corrosion by atmospheric elements. For example, silver nanowires can be plated with gold, which is less susceptible to oxidation and sulfidation.

In certain embodiments, the transparent conductors described herein can be fabricated by various coating methods, including sheet coating and high throughput web coating. In other embodiments, a laminating method can be used. Advantageously, the fabrication processes described herein do not require vacuum deposition, in contrast to the current fabrication of the metal oxide films. Instead, the fabrication processes can be carried out using conventional solution-processing equipment. Moreover, the fabrication processes are compatible with directly patterning the transparent conductor.

Nanowire Deposition and Transparent Conductor Fabrication

In certain embodiments, it is thus described herein a method of fabricating a transparent conductor comprising: depositing a plurality of metal nanowires on a substrate, the metal nanowires being dispersed in a fluid; and forming a metal nanowire network layer on the substrate by allowing the fluid to dry.

The metal nanowires can be prepared as described above. The metal nanowires are typically dispersed in a liquid to facilitate the deposition. It is understood that, as used herein, "deposition" and "coating" are used interchangeably. Any non-corrosive liquid in which the metal nanowires can form a stable dispersion (also called "metal nanowires dispersion")

can be used. Preferably, the metal nanowires are dispersed in water, an alcohol, a ketone, ethers, hydrocarbons or an aromatic solvent (benzene, toluene, xylene, etc.). More preferably, the liquid is volatile, having a boiling point of no more than 200° C., no more than 150° C., or no more than 100° C.

In addition, the metal nanowire dispersion may contain additives and binders to control viscosity, corrosion, adhesion, and nanowire dispersion. Examples of suitable additives and binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene gylcol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., Zonyl® by DuPont).

In one example, a nanowire dispersion, or "ink" includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl® FSN, Zonyl® FSO, Zonyl® FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, and hydroxy ethyl cellulose. Examples of suitable solvents include water and isopropanol.

The nanowire concentration in the dispersion can affect or determine parameters such as thickness, conductivity (including surface conductivity), optical transparency, and mechanical properties of the nanowire network layer. The percentage of the solvent can be adjusted to provide a desired concentration of the nanowires in the dispersion. In preferred embodiments the relative ratios of the other ingredients, however, can remain the same. In particular, the ratio of the surfactant to the viscosity modifier is preferably in the range of about 80 to about 0.01; the ratio of the viscosity modifier to the metal nanowires is preferably in the range of about 5 to about 0.000625; and the ratio of the metal nanowires to the surfactant is preferably in the range of about 560 to about 5. The ratios of components of the dispersion may be modified depending on the substrate and the method of application used. The preferred viscosity range for the nanowire dispersion is between about 1 and 100 cP.

Optionally, the substrate can be pre-treated to prepare a surface to better receive the subsequent deposition of the nanowires. Surface pre-treatments serve multiple functions. For example, they enable the deposition of a uniform nanowire dispersion layer. In addition, they can immobilize the nanowires on the substrate for subsequent processing steps. Moreover, the pre-treatment can be carried out in conjunction with a patterning step to create patterned deposition of the nanowires. As will be discussed further in more detail below, pre-treatments include solvent or chemical washing, heating, deposition of an optionally patterned intermediate layer to present an appropriate chemical or ionic state to the nanowire dispersion, as well as further surface treatments such as plasma treatment, UV-ozone treatment, or corona discharge.

Following the deposition, the liquid is removed by evaporation. The evaporation can be accelerated by heating (e.g., baking). The resulting nanowire network layer may require post-treatment to render it electrically conductive. This post-treatment can be a process step involving exposure to heat, plasma, corona discharge, UV-ozone, or pressure as described below.

In certain embodiments, it is thus described herein a method of fabricating a transparent conductor comprising: depositing a plurality of metal nanowires on a substrate, the metal nanowires being dispersed in a fluid; forming a metal nanowire network layer on the substrate by allowing the fluid to dry, coating a matrix material on the metal nanowire network layer, and curing the matrix material to form a matrix.

"Matrix material" refers to a material or a mixture of materials that can cure into the matrix, as defined herein. "Cure", or "curing", refers to a process where monomers or partial polymers (fewer than 150 monomers) polymerize and/or cross-link so as to form a solid polymeric matrix. Suitable polymerization conditions are well known in the art and include by way of example, heating the monomer, irradiating the monomer with visible or ultraviolet (UV) light, electron beams, and the like. In addition, "solidification" of a polymer/solvent system simultaneously caused by solvent removal is also within the meaning of "curing".

The degree of curing can be controlled by selecting the initial concentrations of monomers and the amount of the cross-linkers. It can be further manipulated by adjusting curing parameters such as the time allowed for the polymerization and the temperature under which the polymerization takes place, and the like. In certain embodiments, the partially cured matrix can be quenched in order to arrest the curing process. The degree of curing or polymerization can be monitored, for example, by the molecular weight of the curing polymer or by the optical absorbance at wavelengths indicative of the reactive chemical species.

Thus, in certain embodiments, the matrix material comprises a polymer, which may be fully or partially cured. Optically clear polymers are known in the art. Examples of suitable polymeric matrices include, but are not limited to: polyacrylates (or "acrylates") such as polymethacrylates, polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, silicone-epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), silicone-siloxane, polyvinylchloride (PVC), polyacetates, polynorbornenes, synthetic rubbers (e.g. EPR, SBR, EPDM), and fluoropolymers (e.g., polyvinylidene fluoride, polytetrafluoroethylene (TFE) or polyhexafluoropropylene), copolymers of fluoro-olefin and hydrocarbon olefin (e.g., Lumiflon®), and amorphous fluorocarbon polymers or copolymers (e.g., CYTOP® by Asahi Glass Co., or Teflon® AF by Du Pont).

In other embodiments, the matrix material comprises a prepolymer. A "prepolymer" refers to a mixture of monomers or a mixture of oligomers or partial polymers that can polymerize and/or crosslink to form the polymeric matrix, as described herein. It is within the knowledge of one skilled in the art to select, in view of a desirable polymeric matrix, a suitable monomer or partial polymer.

In a preferred embodiment, the prepolymer is photo-curable, i.e., the prepolymer polymerizes and/or cross-links upon exposure to irradiation. As will be described in more detail, matrices based on photo-curable prepolymers can be patterned by exposure to irradiation in selective regions. In other embodiments, the prepolymer is thermal-curable, which can be patterned by selective exposure to a heat source.

Typically, the matrix material is a liquid. The matrix material may optionally comprise a solvent. Any non-corrosive solvent that can effectively solvate or disperse the matrix material can be used. Examples of suitable solvents include water, an alcohol, a ketone, tetrahydrofuran, hydrocarbons (e.g. cyclohexane) or an aromatic solvent (benzene, toluene, xylene, etc.). More preferably, the solvent is volatile, having a boiling point of no more than 200° C., no more than 150° C., or no more than 100° C.

In certain embodiments, the matrix material may comprise a cross-linker, a polymerization initiator, stabilizers (including, for example, antioxidants, and UV stabilizers for longer product lifetime and polymerization inhibitors for greater shelf-life), surfactants and the like. In other embodiments, the matrix material may further comprise a corrosion inhibitor.

As noted herein, the transparent conductors can be fabricated by, for example, sheet coating, web-coating, printing, and lamination.

(a) Sheet Coating

Sheet coating is suitable for coating a conductive layer on any substrate, in particular, rigid substrates.

Figure 13A:
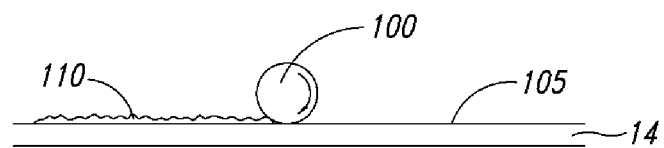
FIGS. 13A-13D show an example of a fabrication process of a transparent conductor.
Figure 13B:
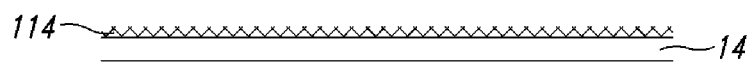

FIGS. 13A-13B show an embodiment of the fabrication of the transparent conductor by sheet coating. A metal nanowires dispersion (not shown) can be initially deposited to the substrate 14. A roller 100 can be rolled across a top surface 105 of the substrate 14, leaving a metal nanowires dispersion layer 110 on the top surface 105 (FIG. 13A). The layer 110 is allowed to dry and a metal nanowire network layer 114 is formed on the surface 105 (FIG. 13B).

The substrate may require a pre-treatment to enable the deposition of a uniform nanowire dispersion layer 110 that adheres to the substrate for subsequent processing steps. This treatment can include solvent or chemical washing, heating, deposition of an optionally patterned intermediate layer to present an appropriate chemical or ionic state to the nanowire dispersion, as well as further surface treatments such as plasma treatment, UV-ozone treatment, or corona discharge.

For example, an intermediate layer can be deposited on the surface of the substrate to immobilize the nanowires. The intermediate layer functionalizes and modifies the surface to facilitate the binding of the nanowires to the substrate. In certain embodiments, the intermediate layer can be coated on the substrate prior to depositing the nanowires. In other embodiments, the intermediate layer can be co-deposited with the nanowires.

In certain embodiments, multifunctional biomolecules such as polypeptides can be used as the intermediate layer. Polypeptide refers to a polymeric sequence of amino acids (monomers) joined by peptide (amide) bonds. The amino acid monomers in a polypeptide can be the same or different. Amino acids having side chain functionalities (e.g., amino or carboxylic acid groups) are preferred. Examples of suitable polypeptides thus include poly-L-lysine, poly-L-glutamic acid and the like. The polypeptide can be coated on the substrate prior to the nanowire deposition. Alternatively, the polypeptide can be co-deposited on the substrate with the nanowire dispersion. Many substrates, including glass, polyester substrates (e.g., polyethylene terephthalate) exhibit affinities for polypeptides.

Advantageously, the intermediate layer can be deposited in a predetermined pattern, which enables the deposition of the nanowires according to the same pattern.

Other pre-treatment methods can also be carried out in conjunction with a patterning step in order to perform patterned depositions. For example, plasma surface treatment can be carried out through an aperture mask having a desired pattern. The surface of the substrate therefore comprises at least one pre-treated regions and at least one untreated region. Nanowires deposited on the pre-treated region adhere to the substrate better than they adhere to the untreated region. Accordingly, a patterned deposition can be achieved by removing the nanowires on the untreated region by, e.g., washing.

It should be understood that the pre-treatments described above also apply to other methods of fabricating transparent conductors in accordance with the description below.

The nanowire network layer formed may further require a post-treatment to render it electrically conductive. This post-treatment can be a process step involving exposure to heat, plasma, corona discharge, UV-ozone, or pressure, as will be discussed in more detail below.

Figure 13C:
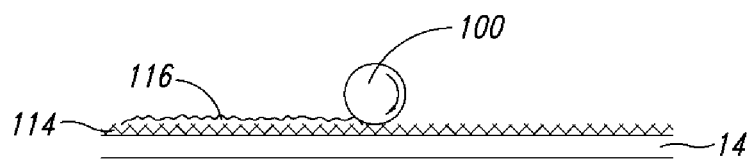
Figure 13D:
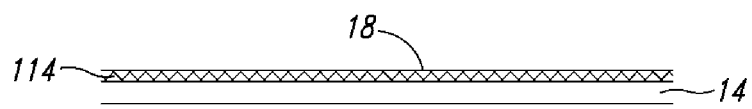

In some embodiments, a matrix material can be coated on the nanowire network layer 114 to form a matrix material layer 116 (FIG. 13C). As shown in FIG. 13D, the matrix material layer 116 is allowed to cure to obtain a matrix and the structures of FIGS. 10A-10E, can be obtained.

It is understood that a brush, a stamp, a spray applicator, a slot-die applicator or any other suitable applicator can be used in the place of the roller 100. Additionally, as discussed further below, reverse and forward gravure printing, slot die coating, reverse and forward bead coating and draw down table can also be used to deposit nanowires onto a substrate. Advantageously, a roller or stamp having recesses of a predetermined pattern can be used to coat a patterned metal nanowires dispersion layer, or matrix material layer, thus printing a patterned conductive layer (e.g., Gravure printing). The conductive layer can also be patterned by spraying the nanowire or matrix formulation onto the substrate through an aperture mask. If the matrix material layer is deposited or cured in a patterned layer, the pattern can be transferred into the metal nanowire layer by removing sufficient numbers of them to drop the concentration of nanowires below the percolation threshold. Nanowires can be removed by washing or brushing them away with a suitable solvent or by transferring them to a tacky or adhesive roller.

It is further understood that additional depositions or coatings can be carried out, while allowing for drying or curing between two consecutive coating step. For example, any number of the performance-enhancing layers can be coated in the same manner as described above.

(b) Web Coating

Web-coating has been employed in the textile and paper industries for high-speed (high-throughput) coating applications. It is compatible with the deposition (coating) processes for transparent conductor fabrication. Advantageously, web-coating uses conventional equipment and can be fully automated, which dramatically reduces the cost of fabricating transparent conductors. In particular, web-coating produces uniform and reproducible conductive layers on flexible substrates. Process steps can be run on a fully integrated line or serially as separate operations.

Figure 14A:
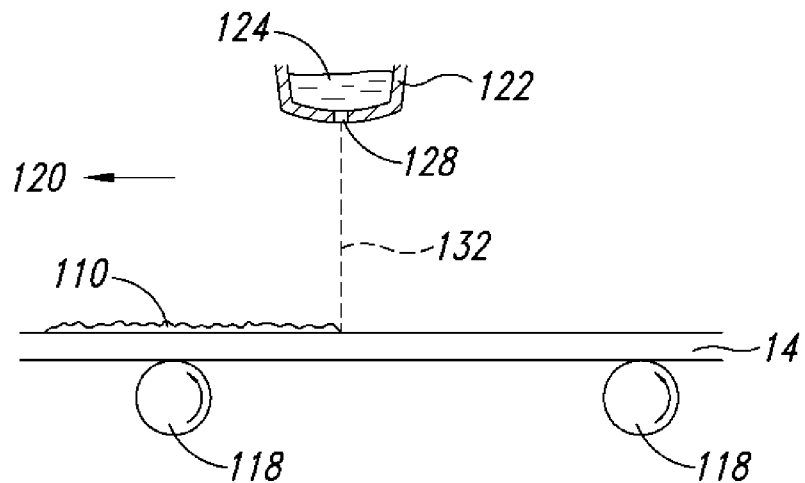
FIG. 14A shows an example of a fabrication process of a transparent conductor by web coating.

FIG. 14A shows an embodiment in which a flexible substrate in the form of a film or web can be coated continuously along a moving path. More specifically, a substrate 14 mounted on reels 118 is drawn by a motor (not shown) and moves along a traveling path 120. The substrate can be fed to the reels directly or via a conveyor belt system (not shown). A storage tank 122 is positioned above the substrate 14. The storage tank 122 contains a metal nanowires dispersion 124 for metal nanowires deposition. An aperture 128 in the storage tank 122 delivers a continuous stream of metal nanowire dispersion 132 on the substrate 14 to form a layer 110 on a top surface 105 of the substrate 14.

It is understood that the matrix material is stored in another storage tank (not shown), and the matrix material can be coated in the same manner as described above.

It is further understood that any dispensing device can be used in the place of the storage tank, including a spraying device (e.g., an atomizer that delivers pressurized dispersions), a brushing device, a pouring device and the like. Like the sheet coating, a printing device can also be used to provide patterned coatings.

Figure 14B:
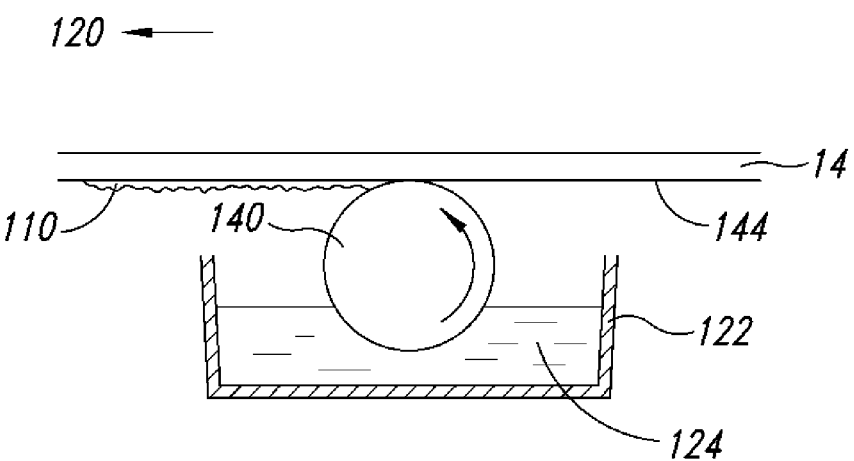
FIG. 14B shows another example of a fabrication process of a transparent conductor by web coating.

FIG. 14B shows an alternative method of web-coating in which the coating is carried out on a bottom surface of a substrate. Like the method illustrated in FIG. 14A, a substrate 14 moves along a traveling path 120. A coating roller 140 is positioned below the substrate and partially submerged in a metal nanowire dispersion 124 stored in a storage tank 122. The coating roller 140 delivers a metal nanowire dispersion layer 110 on a bottom surface 144 of the substrate 14. Coating roller 140 can rotate in the direction of the traveling path 120 or in the opposite direction. The coating of the matrix material can be carried out in the same manner.

In the processes described in FIGS. 14A and 14B, it is noted that various surface treatments can be applied prior to or after each deposition step. As will be described in more detail below, surface treatments can enhance the transparency and/or conductivity of the conductive layers formed. Suitable surface treatments include, but are not limited to solvent or chemical washing, plasma treatments, Corona discharge, UV/ozone treatment, pressure treatment and combinations thereof.

Figure 15A:
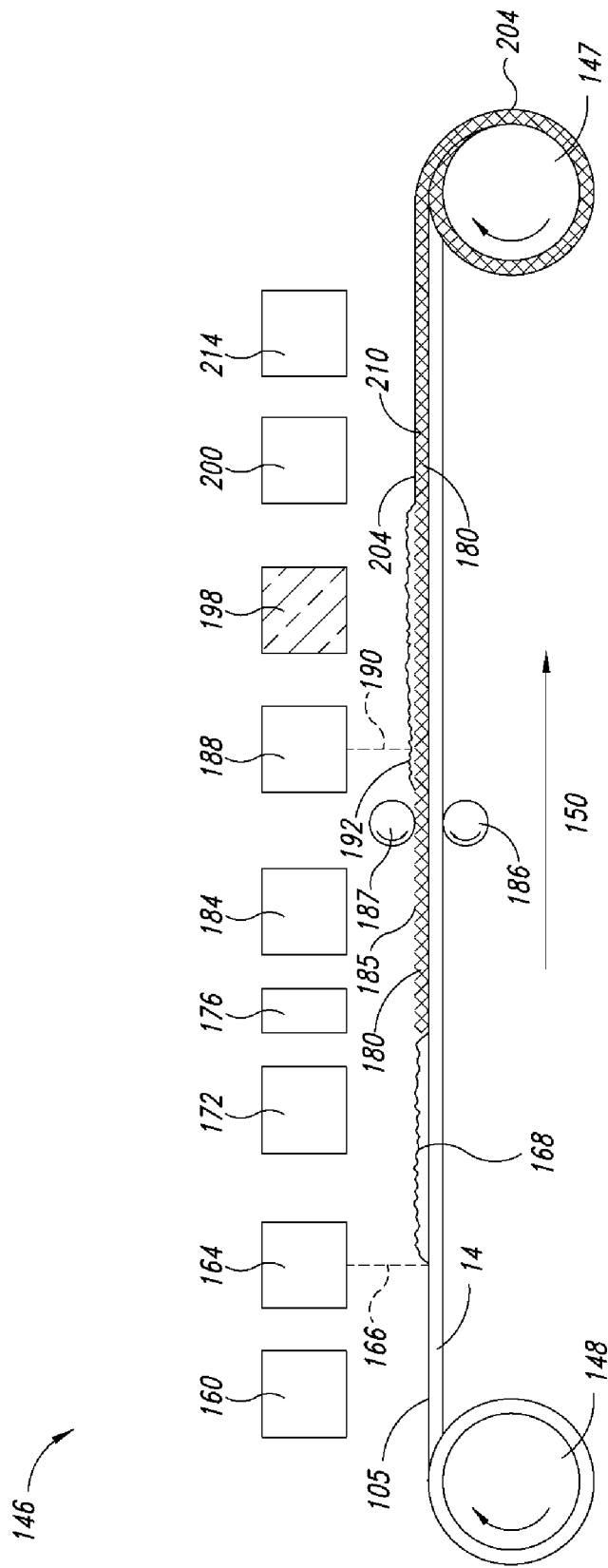
FIG. 15A shows a web coating system and a flow process for fabricating a transparent conductor.

FIG. 15A shows a comprehensive process flow for fabricating a transparent conductor. As shown, a web-coating system 146 includes a take-up reel 147 that is driven by a motor (not shown). The take up reel 147 draws a substrate 14 (e.g., a flexible polymer film) from a supply reel 148 along a traveling path 150. The substrate 14 is then subjected to sequential treatments and coating processes along the traveling path 150. It will become apparent to one skilled in the art that the speed of the reel, the speed of deposition, the concentration of the matrix material, and the adequacy of the drying and curing processes are among the factors that determine the uniformity and the thickness of the conductive layer formed.

Moreover, in certain embodiments, pre-treatments are conducted to prepare the substrate for the subsequent coating processes. More specifically, the substrate 14 can be optionally surface-treated at a pre-treatment station 160 to improve the efficiency of the subsequent nanowire deposition. In addition, surface treatment of the substrate prior to the deposition can enhance the uniformity of the nanowires later deposited.

The surface treatment can be carried out by known methods in the art. For example, plasma surface treatment can be used to modify the molecular structure of the surface of the substrate. Using gases such as argon, oxygen or nitrogen, plasma surface treatment can create highly reactive species at low temperatures. Typically, only a few atomic layers on the surface are involved in the process, so the bulk properties of the substrate (e.g. the polymer film) remain unaltered by the chemistry. In many instances, plasma surface treatment provides adequate surface activation for enhanced wetting and adhesive bonding. As an illustrative example, oxygen plasma treatment can be carried out in a March PX250 system, using the following operating parameters: 150 W, 30 sec, $O_2$ flow: 62.5 sccm, pressure: ~400 mTorr.

In other embodiments, the surface treatment may include depositing an intermediate layer on the substrate. As noted above, the intermediate layer typically exhibits affinities for both the nanowires and the substrate. Thus, the intermediate layer is capable of immobilizing the nanowires and causing the nanowires to adhere to the substrate. Representative materials suitable as the intermediate layer include multifunctional biomolecules, including polypeptides (e.g., poly-L-lysine.)

Other exemplary surface treatments include surface washing with a solvent, Corona discharge and UV/ozone treatment, all of which are known to one skilled in the art.

The substrate 14 thereafter proceeds to a metal nanowires deposition station 164, which delivers a metal nanowire dispersion 166, as defined herein. The deposition station can be a storage tank as described in FIG. 14A, a spraying device, a brushing device, and the like. A metal nanowires dispersion layer 168 is deposited on the surface 105. Alternatively, a printing device can be used to apply a patterned coating of the metal nanowires dispersion on the substrate. For example, a stamp or roller having recesses of a predetermined pattern can be used. The stamp or roller can be continuously dipped into a metal nanowire dispersion by known methods in the art.

The layer 168 can be optionally rinsed at a rinsing station 172. Thereafter, the layer 168 is dried at a drying station 176 to form a metal nanowire network layer 180.

Optionally, the network layer 180 can be treated at a post-treatment station 184. For example, surface treatment of the metal nanowires with argon or oxygen plasma can improve the transparency and the conductivity of the network layer 180. As an illustrative example, Ar or $N_2$ plasma can be carried out in a March PX250 system, using the following operating parameters: 300 W, 90 sec (or 45 sec), Ar or $N_2$ gas flow: 12 sccm, pressure ~300 mTorr. Other known surface treatments, e.g., Corona discharge or UV/ozone treatment, may also be used. For example, the Enercon system can be used for a Corona treatment.

As a part of the post-treatment, the network layer can further be pressure treated. More specifically, the network layer 180 is fed through rollers 186 and 187, which apply pressure to the surface 185 of the network layer 180. It should be understood that a single roller could also be used.

Advantageously, the application of pressure to a metal nanowire network fabricated in accordance with a method described herein can increase the conductivity of the conducting layer.

In particular, pressure may be applied to one or both surfaces of a conducting sheet transparent conductor fabricated in accordance with a method described herein by use of one or more rollers (e.g., cylindrical bars), one or both of which may, but need not, have a length dimension larger than a width dimension of the conducting layer. If a single roller is used, the network layer may be placed on a rigid surface and the single roller rolled across the exposed surface of the conducting layer using known methods while pressure is applied to the roller. If two rollers are used, the network layer may be rolled between the two rollers as shown in FIG. 15A.

In one embodiment, from 50 to 10,000 psi may be applied to the transparent conductor by one or more rollers. It is also considered that from 100 to 1000 psi, 200 to 800 psi or 300 to 500 psi may be applied. Preferably, pressure is applied to a transparent conductor prior to the application of any matrix material.

"Nip" or "pinch" rollers may be used if two or more rollers are used to apply pressure to the conducting sheet. Nip or pinch rollers are well understood in the art and discussed in, for example, 3M Technical Bulletin "Lamination Techniques for Converters of Laminating Adhesives," March, 2004, which is hereby incorporated by reference in its entirety.

It was determined that application of pressure to a metal nanowire network layer improved the conductivity thereof either before or after application of a plasma treatment as discussed above, and may be done with or without a previous or subsequent plasma treatment. As shown in FIG. 15A, the rollers 186 an 187 may be rolled across the surface 185 of the network layer 180 a single or multiple times. If the rollers are rolled across the network layer 180 multiple times, the rolling may be carried out in the same direction with respect to an axis parallel to the rolled surface of the sheet (e.g., along the traveling path 150) or in different directions (not shown).

Figure 15B:
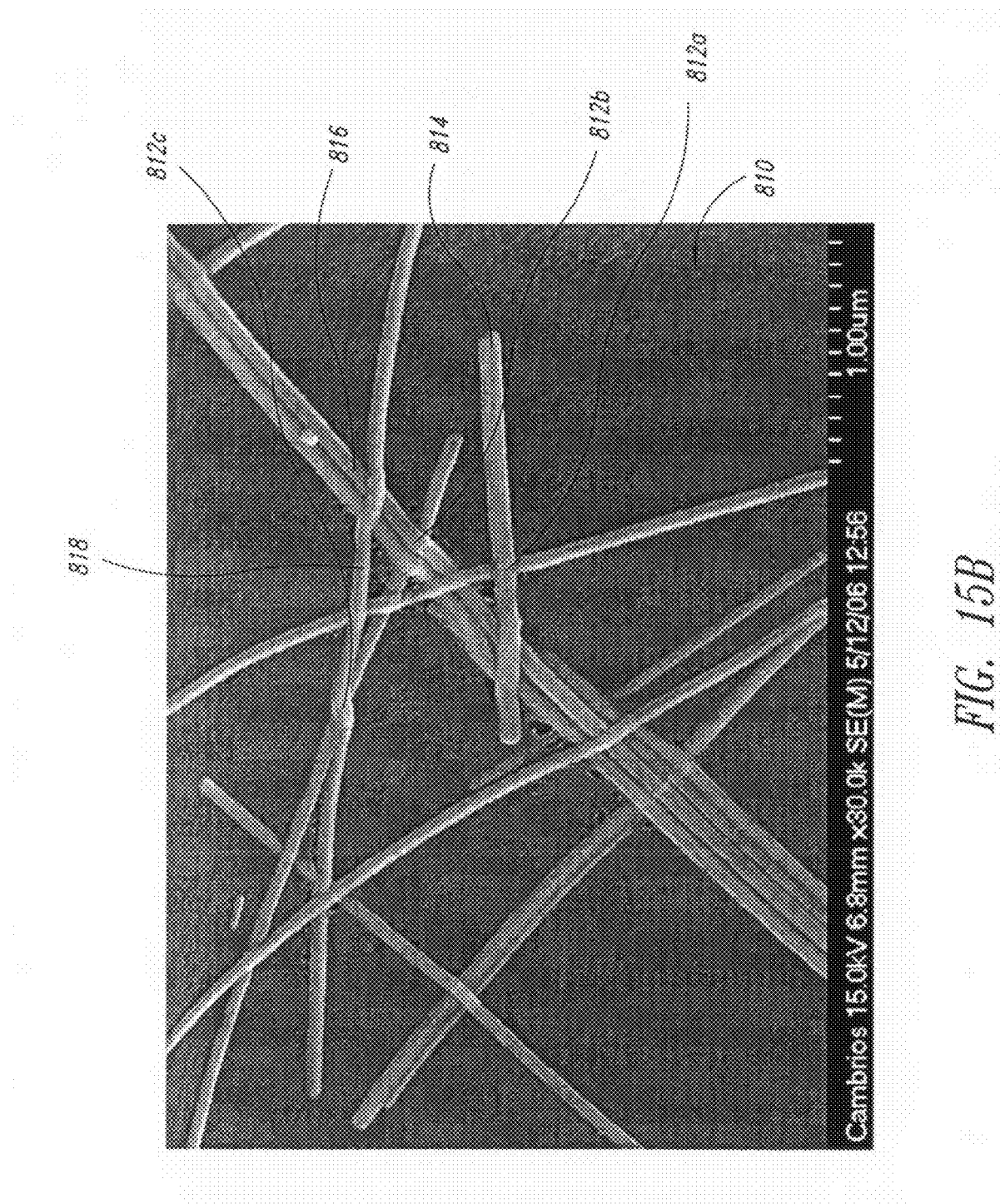
FIG. 15B shows an SEM image of a conductive layer following a post-treatment of pressure application.

FIG. 15B is an SEM image of a portion of a metal nanowire conductive network 810 after application of from about 1000 psi to about 2000 psi using a stainless steel roller. Conductive network 810 includes a plurality of nanowire crossing points such as crossing points 812a, 812b and 812c. As shown, at least the top nanowires 814, 816, and 818 at each of crossing points 812a, 812b and 812c have flattened cross sections where the intersecting wires have been pressed into each other by the application of pressure, thereby enhancing the connectivity as well as the conductivity of the nanowire conductive network.

The application of heat may also be used at this point as a post-treatment. Typically, the transparent conductor exposed to anywhere from 80° C. to 250° C. for up to 10 min, and more preferably is exposed to anywhere from 100° C. to 160° C. for anywhere from about 10 seconds to 2 minutes. The transparent conductor can also be exposed to temperatures higher than 250° C. and can be as high as 400° C., depending on the type of substrate. For example, glass substrate can be heat-treated at a temperature range of about 350° C. to 400° C. However, post treatments at higher temperatures (e.g., higher than 250° C.) may require the presence of a non-oxidative atmosphere, such as nitrogen or a noble gas.

The heating can be carried out either on-line or off-line. For example, in an off-line treatment, the transparent conductor can be placed in a sheet-drying oven set at a given temperature for a predetermined amount of time. Heating a transparent conductor in such a way can improve the conductivity of a transparent conductor fabricated as described herein. For example, a transparent conductor fabricated using a reel-to-reel process as described herein was placed in a sheet drying oven set at a temperature of 200° C. for 30 seconds. Before this heat post-treatment, the transparent conductor had a surface resistivity of about 12 k$\Omega$/□, which dropped to about 58$\Omega$/□ after the post-treatment.

In another example, a second, similarly prepared transparent conductor was heated in a sheet oven at 100° C. for 30 seconds. The resistivity of the second transparent conductor dropped from about 19 k$\Omega$/□ to about 400$\Omega$/□. It is also considered that the transparent conductor may be heated using methods other than a sheet oven. For example, an infrared lamp could be used as either an in-line or off-line method to heat the transparent conductor. RF currents may also be used to heat the metal nanowire network. RF currents may be induced in a metal nanowire network by either broadcast microwaves or currents induced through electrical contacts to the nanowire network.

Additionally, a post-treatment that applies both heat and pressure to the transparent conductor can be used. In particular, to apply pressure, the transparent conductor can be placed through one or more rollers as described above. To simultaneously apply heat, the rollers may be heated. The pressure applied by the rollers is preferably from 10 to 500 psi and more preferably from 40 to 200 psi. Preferably, the rollers are heated to between about 70° C. and 200° C. and more preferably to between about 100° C. and 175° C. Such application of heat in combination with pressure can improve the conductivity of a transparent conductor. A machine which may be used to apply both appropriate pressure and heat simultaneously is a laminator by Banner American Products of Temecula, Calif. Application of heat in combination with pressure can be done either before or after deposition and curing of a matrix or other layers as described below.

Another post-treatment technique that can be used to increase conductivity of a transparent conductor is to expose the metal wire conductive network of a transparent conductor fabricated as disclosed herein to a metal reducing agent. In particular, a silver nanowire conductive network can preferably be exposed to a silver reducing agent such as sodium borohydride for, preferably, anywhere from about 10 seconds to about 30 minutes, and more preferably from about 1 minute to about 10 minutes. As would be understood by one of ordinary skill in the art, such exposure can be done either in-line or off-line.

As noted above, such a treatment can increase the conductivity of a transparent conductor. For example, a transparent conductor of silver nanowires on a substrate of PET and prepared according to a reel-to-reel method disclosed herein was exposed to 2% $NaBH_4$ for 1 minute, which was then rinsed in water and dried in air. Before this post-treatment the transparent conductor had a resistivity of about 134$\Omega$/□ and after this post-treatment, the transparent conductor had a resistivity of about 9$\Omega$/□. In another example, a transparent conductor of silver nanowires on a glass substrate was exposed to 2% $NaBH_4$ for 7 minutes, rinsed in water and air-dried. Before this post-treatment the transparent conductor had a resistivity of about 3.3 M$\Omega$/□ and after this post-treatment, the transparent conductor had a resistivity of about 150$\Omega$/□. Reducing agents other than sodium borohydride can be used for this post treatment. Other suitable reducing agents include other borohydrides such as sodium borohydride; boron nitrogen compounds such as dimethyl aminoborane (DMAB); and gas reducing agents, such as hydrogen gas ($H_2$).

Thereafter, the substrate 14 proceeds to a matrix deposition station 188, which delivers a matrix material 190, as defined herein. The matrix deposition station 188 can be a storage tank as described in FIG. 14A, a spraying device, a brushing device, a printing device and the like. A layer of the matrix material 192 is thus deposited on the network layer 180. Advantageously, the matrix material can be deposited by a printing device to form a patterned layer.

The layer 192 is then allowed to cure at a curing station 200. Where the matrix material is a polymer/solvent system, the layer 192 can be cured by allowing the solvent to evaporate. The curing process can be accelerated by heating (e.g., baking). When the matrix material comprises a radiation-curable prepolymer, the layer 192 can be cured by irradiation. Depending on the type of the prepolymer, thermal curing (thermally induced polymerization) can also be used.

Optionally, a patterning step can be carried out before the layer of the matrix material 192 is cured. A patterning station 198 can be positioned after the matrix deposition station 188 and before the curing station 200. The patterning step will be discussed in more detail below.

The curing process forms a conductive layer 204 comprising the metal nanowires network layer 180 in a matrix 210. The conductive layer 204 can be further treated at a post-treatment station 214.

In one embodiment, the conductive layer 204 can be surface treated at the post-treatment station 214 to expose a portion of the metal nanowires on the surface of the conductive layer. For example, a minute amount of the matrix can be etched away by solvent, plasma treatment, Corona discharge or UV/ozone treatments. Exposed metal nanowires are particularly useful for touch screen applications.

In another embodiment, a portion of the metal nanowires is exposed on the surface of the conductive layer 204 following the curing process (see, also, FIGS. 10C and 10D), and an etching step is not needed. In particular, when the thickness of the matrix material layer 192 and surface tension of the matrix formulation are controlled appropriately, the matrix will not wet the top portion of the metal nanowire network and a portion of the metal nanowires will be exposed on the surface of the conductive layer.

The conductive layer 204 and the substrate 14 are then drawn up by the take-up reel 147. This flow process of fabrication is also referred to as a "reel-to-reel" or "roll-to-roll" process. Optionally, the substrate can be stabilized by traveling along a conveyor belt.

In the "reel-to-reel" process, multiple coating steps can be carried out along the traveling path of a moving substrate. The web coating system 146 therefore can be customized or otherwise adapted to incorporate any number of additional coating stations as needed. For example, coatings of the performance-enhancing layers (anti-reflective, adhesive, barrier, anti-glare, protective layers or films) can be fully integrated into the flow process.

Advantageously, the reel-to-reel process is capable of producing uniform transparent conductors at high-speed and low cost. In particular, due to the continuous flow of the coating process, the coated layers do not have trailing edges.

(c) Lamination

Despite its versatility, the "reel-to-reel" process is not compatible with a rigid substrate, such as glass. While rigid substrates can be coated by sheet coating and can possibly be carried on a conveyor belt, they typically experience edge defects and/or lack of uniformity. In addition, sheet coating is a lower throughput process, which can significantly increase the cost of production.

Thus, it is described herein a lamination process for fabricating a transparent conductor through the use of a flexible donor substrate. This process is compatible with both rigid substrates and flexible substrates. More specifically, the lamination process comprises: coating a conductive layer on a flexible donor substrate, the conductive layer including a plurality of metal nanowires which can be embedded in a matrix; separating the conductive layer from the flexible donor substrate; and transferring the conductive layer to a substrate of choice. Advantageously, the coating steps onto the flexible donor substrate can be carried out by a reel-to-reel process because the donor substrate is flexible. The conductive layer formed thereof can then be transferred to a substrate of choice, which can be rigid or flexible, through standard lamination processes. If only nanowires are deposited onto the flexible donor substrate and no matrix material is used, a lamination adhesive may be used to attach the conductive layer to the substrate of choice.

"Flexible donor substrate" refers to a flexible substrate in the form of a sheet, film, web, and the like. The flexible donor substrate is not particularly limited so long as it can be separated from the conductive layer. The flexible donor substrate can be any of the flexible substrates as described herein. In addition, the flexible donor substrate can be woven or non-woven textile, paper, and the like. The flexible donor substrate need not be optically clear.

In certain embodiments, the flexible donor substrate can be pre-coated with a release layer prior to the coating of the conductive layer. "Release layer" refers to a thin layer adhered to the donor substrate and onto which a conductive layer can be formed by web coating. The release layer must allow for an easy removal of the donor substrate from the conductive layer without damaging the conductive layer. Typically, the release layer is formed of a material having low surface energy, including but not limited to: silicon based polymers, fluorinated polymers, starch, and the like.

Figure 16A:
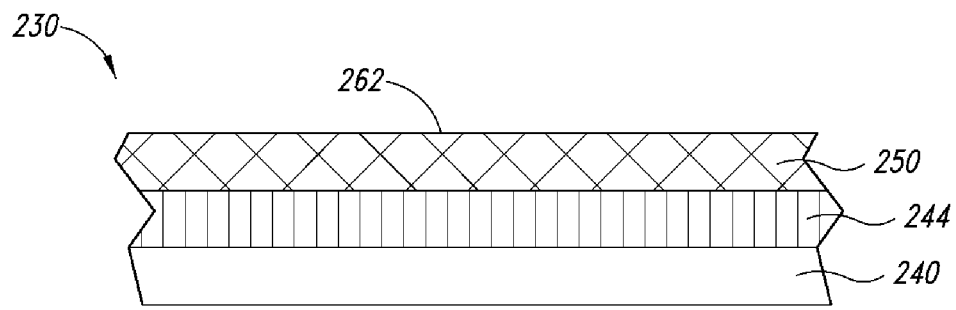
FIGS. 16A-16C show an example of a lamination process.

FIG. 16A illustrates an example of a laminated structure 230 comprising, a flexible donor substrate 240, a release layer 244 coated on the flexible donor substrate 240, and a conductive layer 250 coated on the release layer 244.

The laminated structure 230 can be fabricated in the same manner as described in connection with FIG. 15A, using the flexible donor substrate. Prior to the metal nanowire deposition, the release layer 244 is deposited or coated on the flexible donor substrate. The conductive layer 250 can be formed by metal nanowires deposition followed by matrix deposition, as described herein.

Figure 16B:
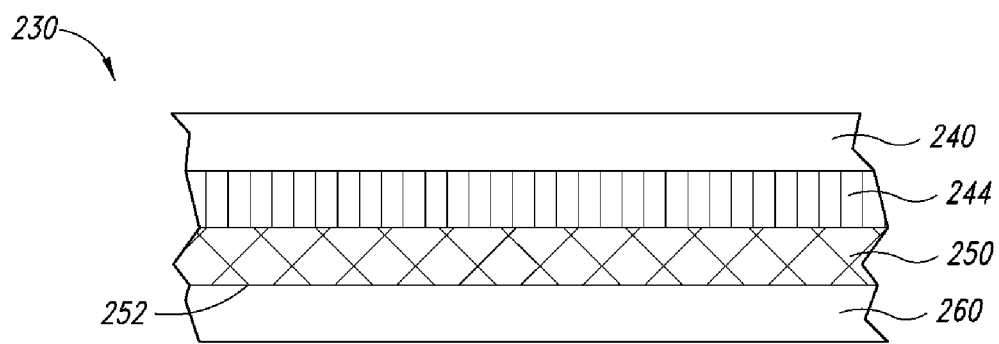
Figure 16C:
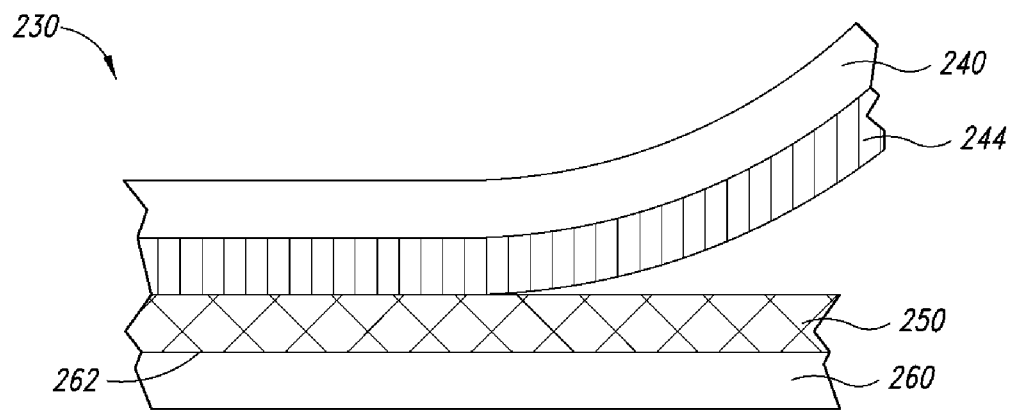

The conductive layer is then uniformly transferred to a substrate of choice. In particular, a rigid substrate (e.g., glass), which is typically not adaptable to the reel-to-reel coating process, can be laminated with the conductive layer. As shown in FIG. 16B, the laminated structure 230 is transferred to a substrate 260 (e.g., glass) by contacting a surface 262 of the conductive layer 250 to the substrate 260. In certain embodiments, the polymeric matrix (e.g., PET, PU, polyacrylates) provides adequate adhesion to the substrate 260. Thereafter, as shown in FIG. 16C, the flexible donor substrate 240 can be removed by detaching the release layer 244 from the conductive layer 250.

Figure 17A:
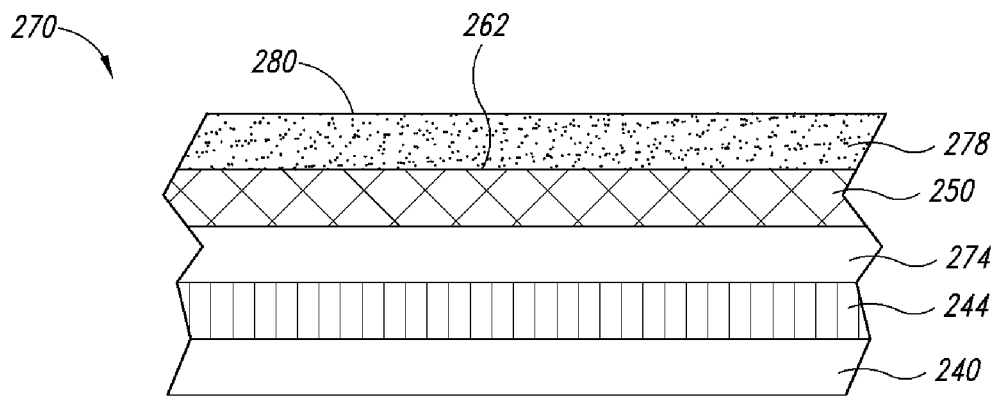
FIGS. 17A-17C show another example of a lamination process.

In other embodiments, an adhesive layer can be used to provide a better bonding between the conductive layer and the substrate during the lamination step. FIG. 17A shows a laminated structure 270 comprising, in addition to the flexible donor substrate 240, the release layer 244 and the conductive layer 250, an overcoat 274 and an adhesive layer 278. The adhesive layer 278 has an adhesive surface 280.

The laminated structure 270 can be fabricated by a reel-to-reel process as described in connection with FIG. 15A, with the understanding that the web coating system 146 is adapted to provide additional stations for coating the adhesive layer and the overcoat. The adhesive layer is as defined herein (e.g., polyacrylates, polysiloxanes), and can be pressure sensitive, hot-melted, radiation-curable, and/or thermally curable. The overcoat can be one or more of the performance-enhancing layers, including a hard coat, an anti-reflective layer, an protective film, a barrier layer, and the like.

Figure 17B:
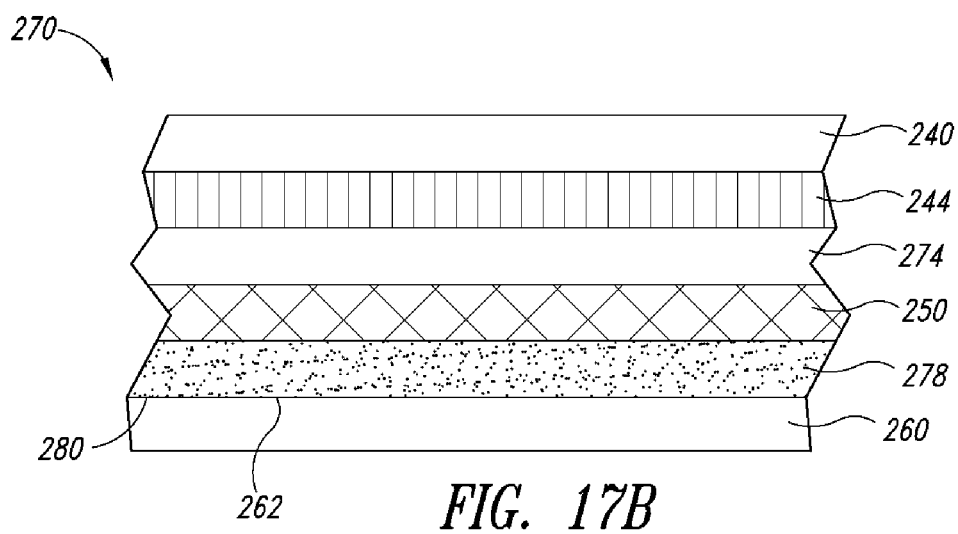
Figure 17C:
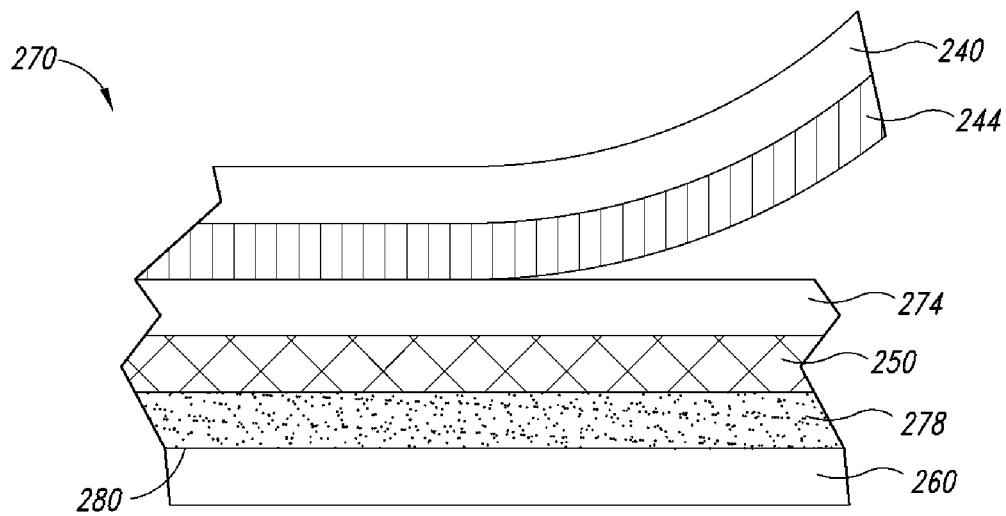

In FIG. 17B, the laminated structure 270 is bonded with the substrate 260 via the adhesive surface 280. Thereafter, as shown in FIG. 17C, the flexible donor substrate 240 is removed by detaching the release layer 244 from the overcoat 274.

In certain embodiments, heat or pressure can be used during the lamination process to enhance the bonding between the adhesive layer (or the conductive layer in the absence of an adhesive layer) and the substrate.

In other embodiments, a release layer is not necessary due to an affinity differential of the conductive layer with respect to the flexible donor substrate and the substrate of choice. For example, the conductive layer may have a much higher affinity to glass than to a textile donor substrate. After the lamination process, the textile donor substrate can be removed while the conductive layer is firmly bonded with the glass substrate.

In certain embodiments, a patterned transfer is possible during the lamination process. For example, the substrate can be heated by a thermal gradient, which affords heated regions and unheated regions on the substrate according to a predetermined pattern. Only the heated regions will be laminated with the conductive layer due to an enhanced affinity (e.g., adhesion), therefore providing a patterned conductive layer on the substrate. Heated regions on a substrate can be generated, for example, by a nichrome wire heater positioned beneath the areas of a substrate to be heated.

In other embodiments, a patterned transfer can be affected by a pressure gradient based on a pressure-sensitive affinity displayed by certain matrix materials or adhesives. For example, a patterned laminating roller can be used to apply different pressures according to a predetermined pattern. The patterned laminating roller can also be heated to further the affinity differential between pressured region and unpressured region.

In yet other embodiments, the conductive layer can be pre-cut (e.g., die cut) according to a predetermined pattern, prior to the lamination process. After transferring the pre-cut conductive layer to the substrate, the conductive layer of the predetermined pattern is retained while the rest is removed along a pre-cut contour.

Patterning

Figure 18:
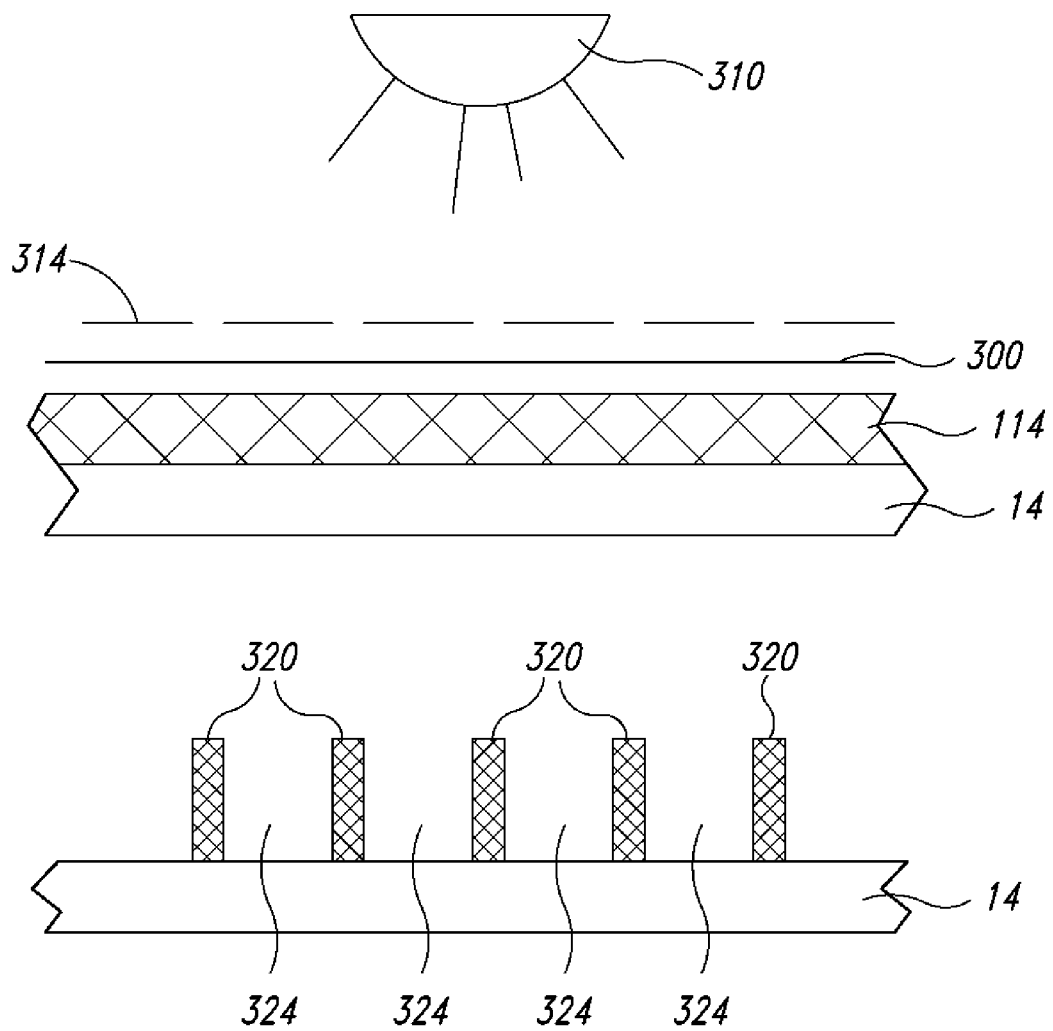
FIG. 18 shows an example of photo-patterning a conductive layer.

As noted above, a patterned conductive layer can be formed by selectively curing a prepolymer coating according to a pattern. The curing process can be carried out photolytically or thermally. FIG. 18 illustrates an embodiment in which a conductive layer is photo-patterned. More specifically, the metal nanowire network layer 114 is deposited on the substrate 14 according to a method described herein (e.g., FIGS. 13A-13D). It should be understood that the substrate 14 can be any substrate, including a flexible donor substrate.

Thereafter, a prepolymer coating 300 is deposited on the network layer of metal nanowires 114. An irradiation source 310 provides the photon energy for curing the prepolymer coating. A mask 314 is positioned between the prepolymer coating 300 and the irradiation source 310. Upon exposure, only regions exposed to the irradiation are cured (i.e., regions 320); the prepolymer coating and nanowires in the uncured regions 324 can be removed by washing or brushing with a suitable solvent or by lifting them off with a tacky roller.

Photo-curable prepolymers are well known in the art. In certain embodiments, the photo-curable prepolymer includes a monomer comprising one or more double bonds or functional groups, e.g. hydrides or hydroxyl groups, suitable for chain extension and crosslinking. In other embodiments, the photo-curable prepolymer comprises a partial polymer or oligomer that contains one or more double bonds or functional groups, e.g. hydrides or hydroxyls, suitable for crosslinking or chain extension.

Examples of monomers containing a double bond are alkyl or hydroxyalkyl acrylates or methacrylates, such as methyl, ethyl, butyl, 2-ethylhexyl and 2-hydroxyethyl acrylate, isobornyl acrylate, methyl methacrylate and ethyl methacrylate, silicone acrylates, acrylonitrile, acrylamide, methacrylamide, N-substituted (meth)acrylamides, vinyl esters such as vinyl acetate, vinyl ethers such as isobutyl vinyl ether, styrene, alkyl- and halostyrenes, N-vinylpyrrolidone, vinyl chloride and vinylidene chloride.

Examples of monomers containing two or more double bonds are the diacrylates of ethylene glycol, propylene glycol, neopentyl glycol, hexamethylene glycol and of bisphenol A, and 4,4'-bis(2-acryloyloxyethoxy)diphenylpropane, trimethylolpropane triacrylate, pentaerythritol triacrylate or tetraacrylate, vinyl acrylate, divinylbenzene, divinyl succinate, diallyl phthalate, triallyl phosphate, triallyl isocyanurate or tris(2-acryloylethyl)isocyanurate.

Examples of partial polymers include, but are not limited to, acrylicized epoxy resins, acrylicized polyesters, polyesters containing vinyl ether or epoxy groups, polyurethanes and polyethers, unsaturated polyester resins. In a preferred embodiment, the prepolymer is an acrylate. The term "acrylate" refers to a monomer comprising an acryloyl moiety (e.g., methacrylate). "Acrylate" may also refer to a partial polymer or polymer formed by polymerizing monomers comprising an acryloyl moiety. Examples of the acrylates are as discussed herein.

Optionally, a photo-initiator can be used to initiate the polymerization and/or crosslinking reactions. The photo-initiator absorbs the photon energy and produces radicals, which initiates a cascade of radical polymerization, including chain-extension and cross-linking. Photo-initiators are well known in the art. Examples of suitable photo-initiators include, but are not limited to, oxime esters, phenyl ketones, onium salts, and phosphine oxides, see, e.g. U.S. Pat. Nos. 6,949,678, 6,929,896, and 6,803,392; N. Buhler & D. Bellus, "Photopolymers as a powerful tool in modern technology", Pure & Appl. Chem., Vol. 67, No. 1, pp. 25-31, 1995; J. Crivello in Advances in Polymer Science, Vol. 62, pp. 1-48 (1984). In a preferred embodiment, the photo-initiator is Ciba Irgacure™ 754. Typically, with the use of the photo-initiator, the prepolymer coating can cure within 5 minutes, more preferably within 30 seconds.

In other embodiments, thermal-patterning can be carried out using an insulating thermal mask (e.g., an aperture mask), which only exposes regions of a matrix material layer to be cured to a heat source. Alternatively, in a mask-less approach, laser direct-write technology can be used to directly "write" a heated pattern on the prepolymer coating layer. Thermally-curable matrix materials are known to one skilled in the art. For example, the matrix material can be an epoxy, a resin and a sol-gel composite material.

Both the photo-patterning method and thermal-patterning method are compatible with the "reel-to-reel" process described above. For example, a photo-patterning station 198 can be a part of the web coating system 146, as shown in FIG. 15A. The photo-patterning station 198 can be configured in a number of ways to allow for continuous exposure and curing of the prepolymer coating.

Figure 19A:
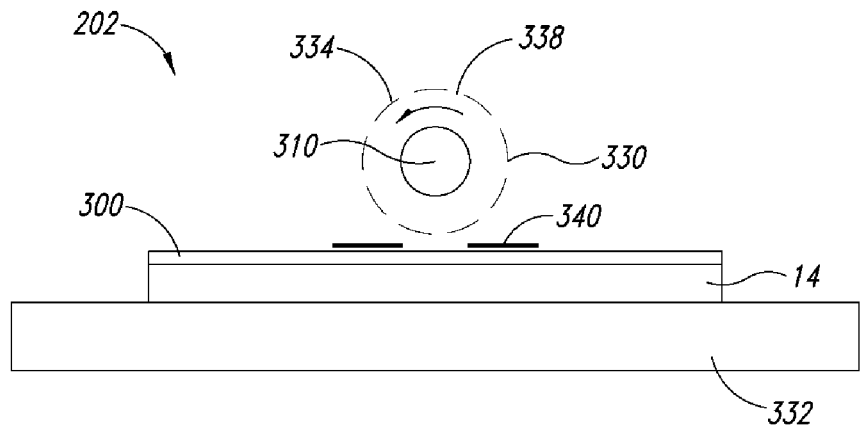
FIGS. 19A-19B show an example of a continuous photo-patterning method suitable for a web coating process.

In one embodiment, as shown in FIG. 19A, a rotating cylinder 330 is part of the photo-patterning station 198 (the web coating system 146 is not shown). The substrate 14, coated with a prepolymer coating 300, is moved along by a conveyor belt 332. The rotating cylinder rotates at the same speed as the conveyor belt 332. The irradiation source 310 is positioned within the rotating cylinder 330. An exterior 334 of the rotating cylinder 330 is patterned, perforated or otherwise provided with openings 338 to allow the light to irradiate the prepolymer coating 300. Optionally, a guard slit or a collimator 340 for preventing any stray light can be positioned closely above the moving substrate.

Figure 19B:
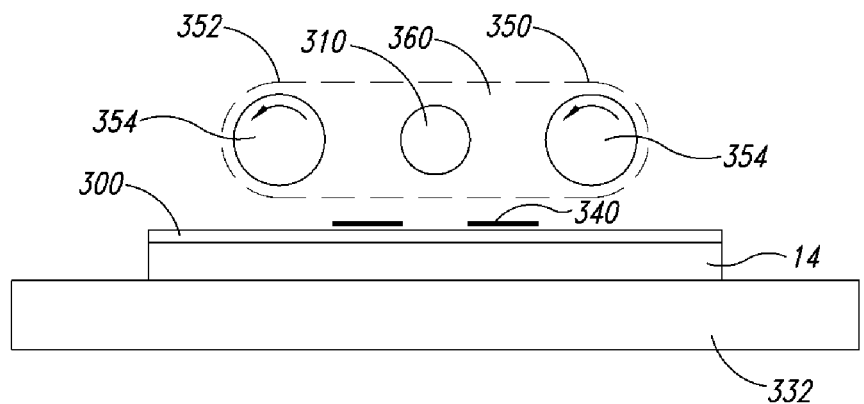

In a related configuration, as shown in FIG. 19B, a patterning belt 350 having a patterned or perforated exterior 352 can be used. The patterning belt 350 is driven by rollers 354, one of which is connected to a motor (not shown). The patterning belt 350 moves at the same speed as the moving conveyor belt 332, allowing continuous exposure of the prepolymer coating 300 to the irradiation source 310 through openings 360. Optionally, a guard slit 340 can be used.

Figure 20:
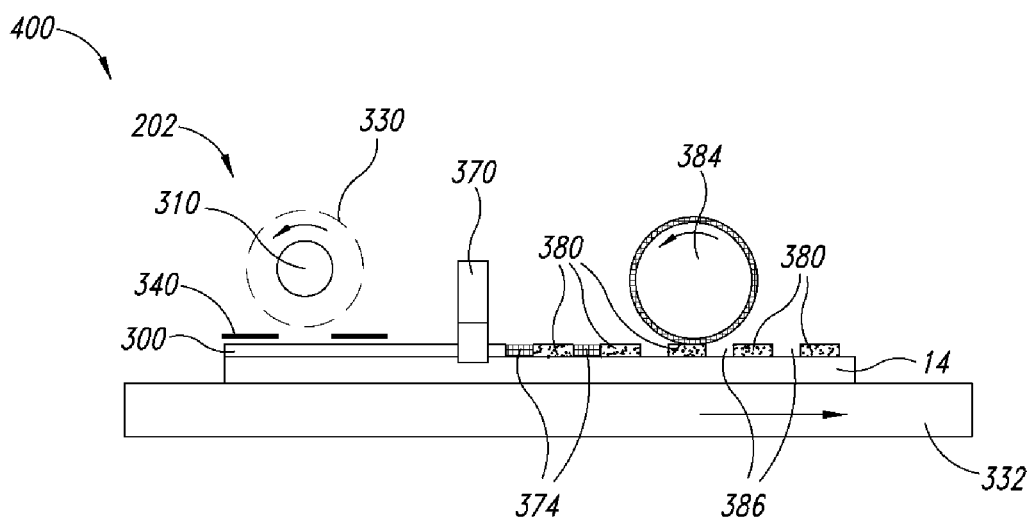
FIG. 20 shows a partial system and a process of fabricating a patterned transparent conductor.

FIG. 20 shows a partially integrated system 400 for forming a patterned conductive layer on a substrate. The system 400 can be fully integrated into the web coating system 146. In particular, the photo-patterning station 198 is identical to the one shown in FIG. 19A. Following the photo exposure and curing, the prepolymer coating 300 is cured at selective regions and will be further treated at a washing station 370 to remove any uncured prepolymer. The substrate 14, now comprising cured regions 380 and bare metal nanowires regions 374, moves to a rotating tacky roller 384. The tacky roller 384 contacts and removes the bare metal nanowires regions 374. Following the removal of the bare metal nanowires, the substrate is coated with conductive regions 380 among non-conductive regions 386.

In a further embodiment, a conductive layer can be patterned by etching. Depending on the composition of the conductive layer, various etching solutions can be used to dissolve and remove portions of the conductive layer in the unmasked areas.

In one embodiment, an acid-etching solution comprising nitric acid ($HNO_3$) can be used. Typically, the nitric acid is present at 0.01-40%, more typically, the nitric acid is present at 0.01-10%. The acid-etching solution may further comprise a trace amount (e.g., about 1-100 ppm) of potassium permanganate ($KMnO_4$). In one embodiment, the acid-etching solution comprises about 1% $HNO_3$, 1% $NaNO_3$ and a trace amount (several parts per million) of potassium permanganate ($KMnO_4$). The etching solution converts metal nanowires to soluble metal salt, which can be removed by washing. For example, silver nanowires can be converted to silver salt ($Ag^+$), which can be rinsed off by a solvent, e.g., water.

In certain embodiments, the etching solution does not affect or dissolve a matrix composed of fully or partially cured polymer. Patterning can be carried out by depositing and curing a polymeric matrix material on a nanowire layer according to a desired pattern. Once the matrix is cured (either fully or partially) to attain an acceptable degree of hardness and physical form, the matrix protects the nanowires embedded therein from being etched away during a subsequent etching step. The nanowires in the unprotected areas (where the matrix material is not polymerized or where no matrix is present) can be etched and removed. Thus, one embodiment describes a method of patterning, the method comprising: forming a conductive layer on a substrate, the conductive layer comprising a plurality of nanowires; forming a matrix on the conductive layer according to a pattern, the pattern comprising nanowires protected by a matrix and unprotected nanowires; and etching the conductive layer to dissolve the unprotected nanowires. The unprotected nanowires can be either removed or left in place.

It has been found that the amount of $KMnO_4$ in the acid-etching solution described herein can impact the etching power. For example, the amount of $KMnO_4$ in the acid etching solution can affect the rate of etching. Typically, higher concentration of $KMnO_4$ results in faster etching. Accordingly, adjusting the concentration of $KMnO_4$ in the acid etching solution can modulate the etching efficiency without changing the acidity of the etching solution.

It has also been observed that higher concentration of $KMnO_4$ in the acid etching solution may cause more effective diffusion of the etching solution into the matrix, which results in faster or more complete dissolution of the nanowires in situ. For example, as shown in Examples 9, 10 and 11, when $KMnO_4$ is present in the etching solution at less than 20 ppm, the matrix (of a standard thickness of about 150 nm) can protect the nanowires embedded therein from being etched. When the amount of $KMnO_4$ is increased to about 20 ppm, while the concentrations of $HNO_3$ and $NaNO_3$ remain constant, the etching solution diffuses into the matrix (about 150 nm thick) and dissolves the nanowires embedded therein.

As will be discussed in more detail in connection with Example 11, a thick overcoat (about 1 μm) can effectively prevent the diffusion of an acid-etching solution and protect the nanowire from being etched, while the nanowire/matrix unprotected by the thick overcoat was dissolved by the acid-etching solution (e.g., 20 ppm $KMnO_4$, 1% $HNO_3$ and 1% $NaNO_3$.)

Thus, in one embodiment, an etching solution can be selected that is capable of diffusing into the matrix and dissolving the nanowires. In these embodiments, conductive layers comprising nanowires in a matrix can be etched by using a protective mask (e.g., a photoresist). Thus, patterning can be carried out according to standard photolithography methods, by which the nanowires in the unmasked region are etched.

In a further embodiment, etching the unmasked region comprises etching the matrix in the unmasked region using a first etchant; and etching the nanowires in the unmasked region using a second etchant. For example, a first etchant (e.g., hydrogen peroxide) can be used to remove the matrix to expose or deprotect the nanowires in the unmasked region. Thereafter, a second etchant, such as the acid-etching solution discussed herein, can be used to dissolve or remove the nanowires that are no longer protected by the matrix.

Thus, other embodiments describe a method of patterning the transparent conductor using a mask. The mask acts as a thick overcoat, protecting the nanowire/matrix layer underneath. The method comprises: forming a conductive layer on a substrate, the conductive layer comprising a matrix and a plurality of electrically conductive nanowires embedded therein; placing a mask on the conductive layer to define a masked region and an unmasked region; and etching the unmasked region using an acid-etching solution to form a patterned conductive region. The method may further comprise removing the etched region to form a pattern.

Other factors that can contribute to etching efficiency include, but are not limited to, the degree of curing of the matrix. For example, given the same etching solution and same monomers, a matrix formed by partially cured polymer tends to dissolve more readily than a matrix formed by fully cured polymer. After patterning, the partially cured matrix may undergo an additional curing step to fully cure the matrix.

More efficient etching can also be achieved by activating an etching surface of the transparent conductor prior to etching. Such a pre-treatment is particularly beneficial to a wet-etching process, in which a liquid etchant comes into contact with the etching surface of the transparent conductor. Typically, the etching surface of the transparent conductor can be a top surface of the nanowire/matrix layer or, in some instances, a top surface of an overcoat layer. The matrix layer and the overcoat layer protect the underlying nanowires from corrosive elements and abrasion. Their presence, however, may cause poor wetting of the liquid etchant. Pre-treating the etching surface of the transparent conductor can activate the surface and improve its wetting behavior. As a result, the liquid etchant can gain access to the metal nanowires protected by the matrix and/or the overcoat layer.

Thus, the method of patterning described above can further comprise pre-treating an etching surface of the conductive layer to improve its wetting behavior.

The change in the wetting behavior can be assessed by water contact angle measurements. Water contact angle refers to the angle at which a liquid/vapor interface meets a solid surface (i.e., the etching surface). Typically, a higher water contact angle is correlated with poorer wetting of the solid surface. As shown in Table 1, depending on the types of treatment, the water contact angles are substantially reduced by about 50% to 80% after surface treatments.

TABLE 1

| Surface Treatment | Water Contact Angle (°) | |
|---|---|---|
| | without surface treatment | With surface treatment |
| Oxygen Plasma | 62.4 | 12.5 |
| UV ozone | 63.5 | 34.5 |

As further described in detail in Example 13, using etchants of the same strength, the rate of etching surface-treated transparent conductors is significantly improved as compared to the rate of etching untreated transparent conductors.

Accordingly, transparent conductor films can be efficiently patterned by pre-treating the regions to be etched.

Moreover, by adjusting the strength of the etchants, it is possible to create a patterned transparent conductor film with substantially uniform optical properties. In these incidences, it is believed that the nanowires are not completely etched away, even though the nanowire network has been rendered less conductive.

Thus, in a further embodiment, a conductive layer can be patterned by creating a non-conductive region, or region having an altered resistivity that is not necessarily non-conductive, without etching or removing the nanowires. In this way, any change in optical characteristics (i.e. transparency and haze) of the region having altered resistivity can be relatively minimal. Instead of etching or removing the nanowires, the resistivity of the conductive medium (i.e., the interconnected nanowire network) is altered in selected regions according to a predetermined pattern. More specifically, this embodiment provides a method comprising: forming a conductive layer on a substrate, the conductive layer comprising a matrix and a network of electrically conductive nanowires embedded therein; and treating a region of the conductive layer to alter the resistivity of the network of electrically conductive nanowires within the region, thereby forming a patterned conductive layer including a treated region having a first resistivity and an untreated region having a second resistivity. The treated region may, but need not be, rendered non-conductive. As used herein, "non-conductive" refers to a surface resistivity of at least $10^6 \Omega/\square$.

In addition, disclosed is a transparent conductor including a substrate and a patterned conductive layer having a network of electrically conductive nanowires embedded in a matrix. The patterned conductive layer defines a first region of the transparent conductor in which the network has a first resistivity and a second region of the transparent conductor in which the network has a second resistivity. The change in optical characteristics (i.e. transmission and haze) between the two regions is relatively small. For example, without limitation, the difference in the transmission and haze, respectively, of the first region differs from that of the second region by less than 0.7% and 0.62%, respectively, while the change in resistance between the two regions is greater than about $1500 \Omega/\square$.

In certain embodiments, an optically clear conductive layer can be treated according to the patterning method described herein without affecting the optical properties of the treated region. As further illustrated Example 14, the change in optical properties, including transmission (T) and haze (H), was relatively small before and after the patterning step. In such an "invisible patterning" method, the conductive layer remains optically uniform in appearance; but is only conductive in the untreated region according to a predetermined pattern, the treated areas having been rendered nonconductive or having a different conductivity.

In the present embodiment, altering the resistivity of the nanowire network can be accomplished by, without limitation, destroying or degrading the electrical conductivity of the connections between the nanowires or rendering the nanowires themselves non-conductive. In one example, treating the electrically conductive nanowire network comprises chemically transforming the electrically conductive nanowires to non-conductive nanowires or wires having higher resistivity. Such chemical transformation may include, for example, oxidation, sulfidation, or any other process that converts the underlying conductive material of the nanowire to an electrically insulating material. For example, conductive nanowires formed by elemental metal or metal alloys (e.g., silver) can be rendered non-conductive when the metal is converted to an electrically insulating and insoluble metal salt (e.g., silver chloride.) In this example, the elemental silver can be initially oxidized and converted to silver ion ($Ag^+$). The oxidation can be further driven to completion in the presence of an anion (e.g., $Cl^-$), with which the positively charged silver ion can form an insoluble salt (AgCl). Other examples of anions that readily precipitate metal ions into insoluble metal salts include, for example, bromide, iodide and sulfate.

Examples of suitable oxidizing agents include, but are not limited to, peroxides (e.g., hydrogen peroxide), persulfates (e.g., ammonium persulfate), peroxo compounds (e.g., sodium or potassium peroxodisulfate), halogens or halogen-based oxidizing salts (e.g., chlorine or hypochlorite salts), oxidizing metal salts (e.g., palladium, manganese, cobalt, copper or silver salts), organic oxidizing agents such as 7,7', 8,8'-tetracyanoquinodimethane (TCNQ), and gaseous oxidizing agents such as air, oxygen, ozone and the like.

In various embodiments, and as illustrated in Examples 14 and 15 below, the concentration of the oxidizing agent, type of agent and time of exposure to the agent may determine the extent of the chemical transformation of the conductive layer. It is possible that a strong and/or more concentrated oxidizing agent may cause the nanowires and the matrix layer to dissolve (see, e.g., Example 14.)

In certain embodiments, in addition to, or instead of, transforming the underlying material of the nanowires from conductive to less conductive or non-conductive, it is also possible that the nanowires may be physically compromised. For example, the nanowires may become broken or shortened, thereby reduce the level of their interconnectivity. As a result, the overall resistivity of the treated region increases compared to the untreated region, in part due to the formation of the electrically insulating material and in part due to the breakdown of the interconnectivity among the nanowires. It is noted that such changes in the physical structures of the nanowires may occur on a microscopic level only, thus would not affect the macroscopic appearance of the conductive layer. Accordingly, the conductive layers described herein may be treated to form conductive patterns that are optically uniform.

Optionally, a pre-treatment step can be carried out prior to forming an invisible pattern by improving the wetting behavior of the etching surface and changing the surface energy. As discussed, oxygen plasma and UV ozone are examples of suitable pre-treatments.

Applications of the Nanowire-Based Transparent Conductors

The transparent conductors as described herein can be used as electrodes in a wide variety of devices, including any device that currently makes use of transparent conductors such as metal oxide films. Examples of suitable devices include flat panel displays such as LCDs, plasma display panels (PDP), color filters for colored flat panel displays, touch screens, electromagnetic shielding, functional glasses (e.g., for electrochromic windows), optoelectronic devices including EL lamps and photovoltaic cells, and the like. In addition, the transparent conductors herein can be used in flexible devices, such as flexible displays and touch screens.

(a) Liquid Crystal Display

An LCD is a flat panel display that displays an image by controlling light transmissivity by an external electric field. Typically, the LCD includes a matrix of liquid crystal cells (or "pixels"), and a driving circuit for driving the pixels. Each liquid crystal cell is provided with a pixel electrode for applying an electric field to the liquid crystal cell with respect to a common electrode. If each of the pixel electrodes is connected to a thin film transistor (TFT) together they function as a switching device, i.e., the pixel electrode drives the liquid crystal cell in accordance with a data signal applied via the TFT.

The TFT LCD panel comprises two substrates with the liquid crystal cells interposed in between. The pixel electrodes are provided on a lower substrate for each liquid crystal cell, whereas the common electrode is integrally formed on the entire surface of an upper, opposing substrate. The lower substrate, also referred to as a TFT array substrate or TFT backplane, thus comprises an array of thin film transistors connected to corresponding pixel electrodes. The upper opposing substrate, comprises the common electrode which may be coated on a color filter which combination may be referred to as the color filter substrate.

Conventionally, the pixel electrode is made of a highly transmissive ITO film in order to allow sufficient light to transmit through. As noted above, ITO films are costly to fabricate and may be susceptible to cracking if used on a flexible substrate. The nanowire-based transparent conductor films described herein offer an alternative approach in TFT pixel electrode fabrication.

Generally speaking, the thin film transistors described herein can be fabricated according to any known methods in the art. The nanowire-based pixel electrode can be formed by coating the TFT back-plane with a nanowire transparent conductor film, followed by a patterning step. Alternatively, a patterned transparent conductor layer can be preformed prior to coating. Patterning of the nanowire-based transparent conductor film can also be achieved according to the high throughput methods described herein.

In addition to being patternable, the nanowire-based transparent conductor films also have the conformability and high temperature resistance required for TFT LCD manufacturing and applications, i.e., as part of a TFT-based switching device.

Figure 22:
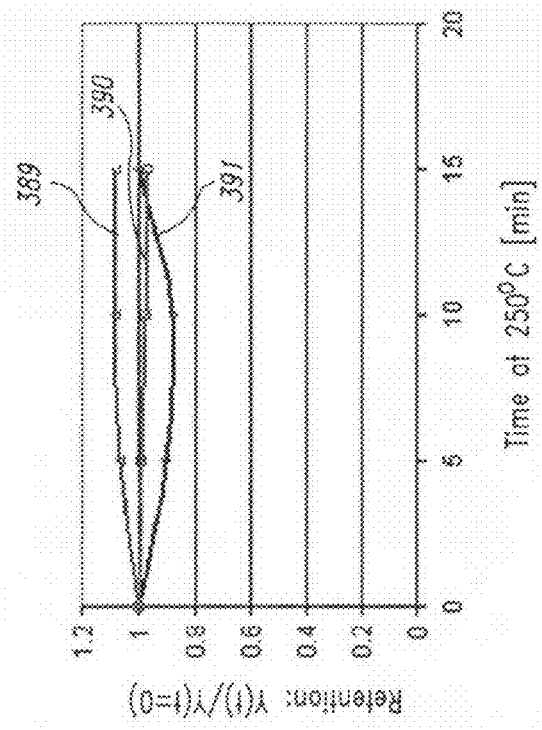
FIG. 22 is a graphic representation showing temperature resistance of nanowire-based transparent conductor film.
Figure 21A:
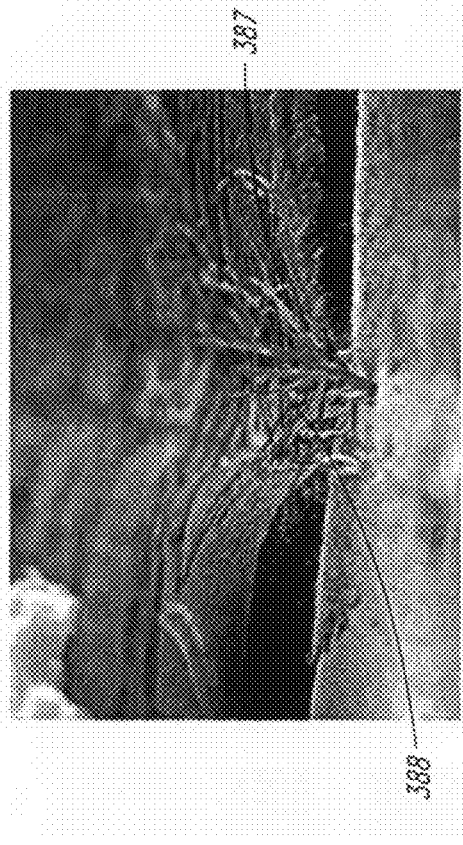
FIGS. 21A-21B are SEM images showing the conformality of a nanowire-based transparent conductor film.
Figure 21B:
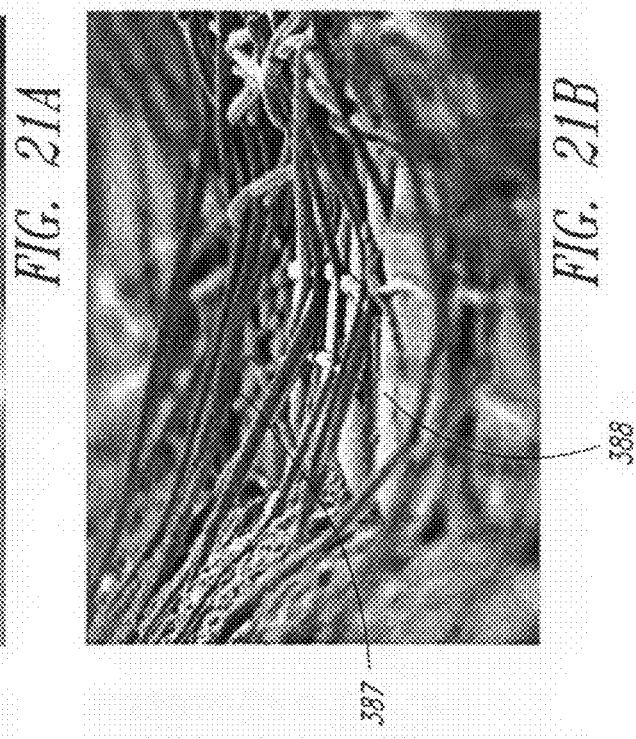

FIG. 21A is an SEM image showing the conformality of a nanowire-based transparent conductor film over a substrate with a profile or relief feature in the surface thereof. As shown, the transparent conductor film 387 at least partially conforms to a groove 388 on the substrate. The substrate is a color filter and groove 388 has a width of about 2 µm to 3 µm. Larger or smaller width grooves may also be conformally covered with a transparent conductor film. For example, grooves having a width down to 0.1 µm to 2 µm and up to 3 µm or greater can be coated conformally. Additionally, substrates having profiles or relief features other than grooves may be at least partially conformally coated with a nanowire-based transparent conductor film. For example, and without limitation, a profile or relief feature could include a step, ramp, shoulder and/or a concave or convex curb. FIG. 21B shows a magnified image of FIG. 21A. As shown, the nanowire network remains intact and conforms to the groove 388. FIGS. 21A-21B illustrate that nanowire-based transparent conductor films are sufficiently conformal with a surface topology of, for example, a TFT. That a nanowire network at least partially conforms to a profile or relief feature of a substrate advantageously allows conductivity across such a profile or relief feature and may be more robust that a conductive layer that would simply bridge a profile or relief feature without conforming thereto. Nanowire-based transparent conductor film can withstand the temperature conditions during fabrication and operation of the LCD. More specifically, their optical and electrical properties show relatively little fluctuation. FIG. 22 is a graphic representation of the temperature resistance of nanowire-based transparent conductor film. The optical and electrical properties (e.g., haze, transmission and sheet resistance) were measured at time (t) on the X axis. The retentions [Y(t)/Y(0)], shown as 389, 390 and 391 for haze, transmission and sheet resistance, respectively, were plotted against the time (t). All three lines are nearly linear and have slopes close to 1, indicating that the retentions of the optical and electrical properties remain nearly constant at high temperature within the tested time frame.

The nanowire-based conductive film is also a suitable material for forming via contacts in a LCD-TFT plate due to its ability to conformally coat a surface with a profile or relief feature. For a typical LCD-TFT plate, vias are etched in the passivation layer SiNx to connect the drain. Currently, sputtered ITO films are used to establish via contact. The sputter ITO film can, however, be replaced by the nanowire-based conductive film described herein.

A typical process comprises spin-coating a metal nanowire dispersion (e.g., silver nanowire, HPMC and Zonyl®) into a via followed by a post-baking step, e.g., at 180° C. for 90 seconds. Typically, a further post-treatment is needed to establish via contacts. Exemplary post-treatments include one or more of the following methods: running higher current through the coated vias, rinsing the coated vias with deionized (DI) water rinsing, treating with argon (Ar) plasma or UV ozone, coating with additional conductive materials, and adjusting wire density or dimensions.

In particular, nanowire-coated vias rinsed with DI water or treated with Ar plasma are shown to have established contacts in vias as small as 5 µm. It is believed that rinsing or plasma treatment cleans the surface of the electrode at the bottom of the via as well as the nanowires, thereby providing a more pristine contact between the electrode and the nanowires and reducing contact resistance.

The nanowire-based transparent conductor films are compatible with all the TFT configurations currently used in the LCD technology. In general, thin film transistors fall into two broad categories: a bottom-gate type and a top-gate type. In the bottom-gate TFT, a gate electrode is disposed below an active layer, whereas in the top-gate TFT, a gate electrode is disposed above an active layer. The bottom-gate thin-film transistors typically have superior reliability in comparison with the top-gate thin-film transistor. These structural configurations are described in more detail in, for example, Modern Liquid Crystal Process Technologies '99 (Press Journal, 1998, pp. 53 to 59) and Flat Panel Display 1999 (Nikkei BP, 1998, pp. 132 to 139). Moreover, depending on the type of material that forms the active area, thin film transistors can also be based on amorphous silicon, polycrystalline silicon and organic semiconductors.

Figure 23:
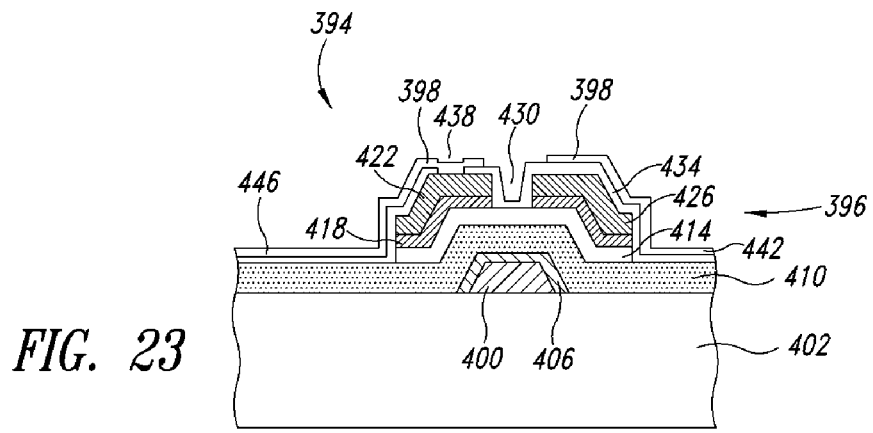
FIG. 23 is a cross-sectional view of a switching device of a TFT backplane according to one embodiment.

FIG. 23 shows the cross-sectional view of a switching device of a TFT backplane according to one embodiment. As shown, the switching device 394 comprises a bottom-gate thin film transistor 396 and a nanowire-based pixel electrode 398. The thin film transistor includes a gate electrode 400 formed on a substrate 402. The gate electrode can be a metal layer (e.g., Mo—Al—Cd) defined by photolithography. A gate insulating layer 406 overlies the gate electrode 400. The thin film transistor 396 further includes an insulating layer 410, a first semiconductor layer 414 (e.g., amorphous silicon) and a second semiconductor layer 418 (e.g., n+ doped amorphous silicon), all defined to form an island-shaped structure. A source electrode 422 and a drain electrode 426 define a channel 430, exposing a portion of the first semiconductor layer 414 (i.e., active layer). A further protective layer 434 covers the island structure, the source and drain electrodes while exposing a contact hole 438. The protective layer 434 is, for example, a silicon nitride layer. A nanowire-based transparent conductor film 442 is coated over the thin film transistor 396. The nanowire-based transparent conductor film 442 can be deposited and patterned as described herein, to form the pixel electrode 398. In other portions of the TFT backplane, the same nanowire-based transparent conductor film 442 can also be patterned to define a signal line area 446.

In a further embodiment, the switching device described above can be incorporated in a liquid crystal display (LCD) device.

Figure 24:
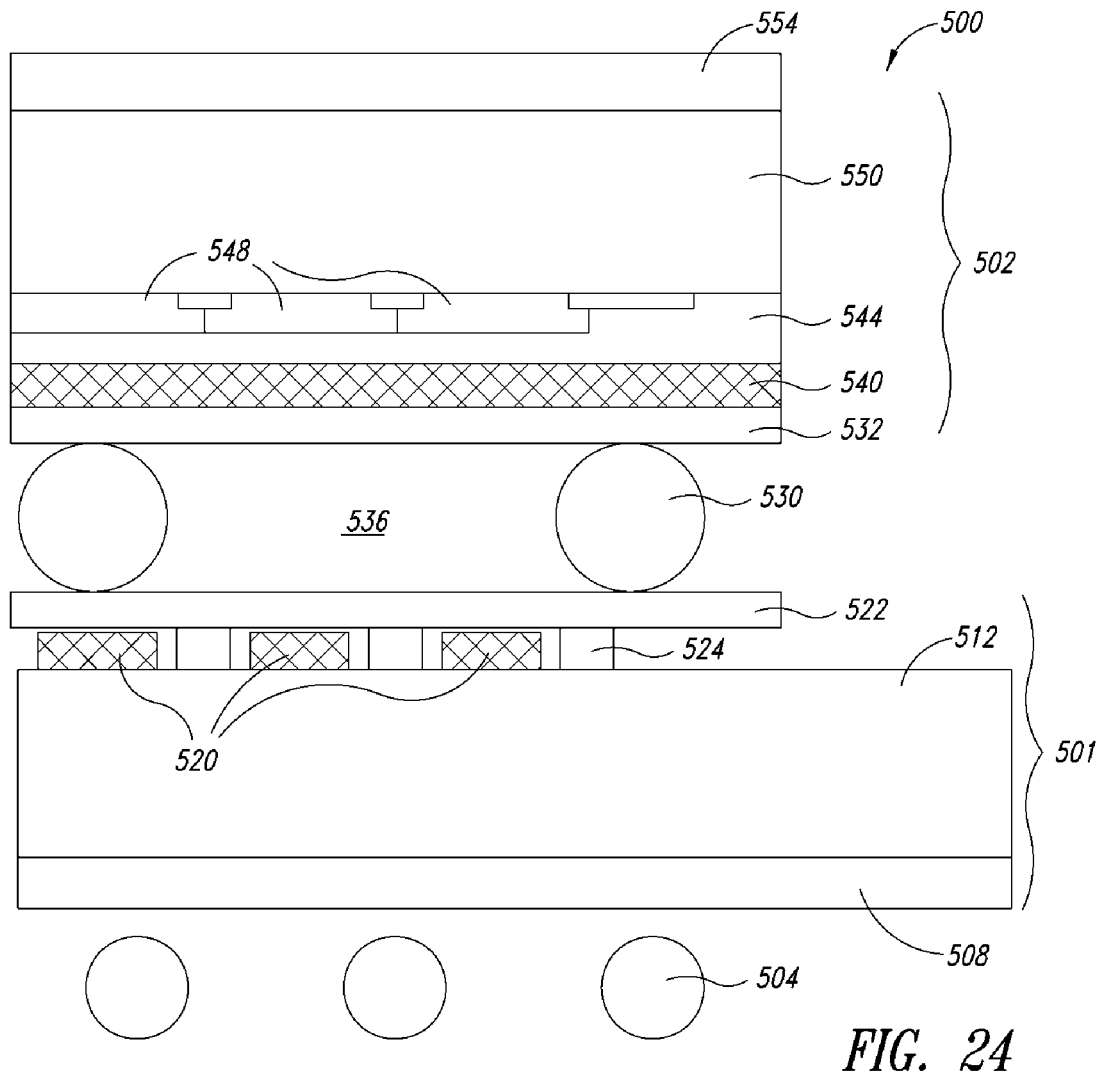
FIG. 24 shows a display device comprising transparent electrodes based on metal nanowires.

FIG. 24 shows schematically an LCD device 500 comprising a TFT backplane 501 and a color filter substrate 502. A backlight 504 projects light through a polarizer 508 and a glass substrate 512. A plurality of first transparent conductor strips 520 are positioned between the bottom glass substrate 512 and a first alignment layer 522 (e.g., a polyimide layer). Each transparent conductor strip 520 alternates with a data line 524. Spacers 530 are provided between the first alignment layer 522 and a second alignment layer 532, the alignment layers sandwiching liquid crystals 536 in between. A plurality of second transparent conductor strips 540 are positioned on the second alignment layer 532, the second transparent conductor strips 540 orienting at a right angle from the first transparent conductor strips 520. The second transparent conductor strips 540 are further coated with a passivation layer 544, a color filter of colored matrices 548, a top glass substrate 550 and a polarizer 554. Advantageously, the transparent conductor strips 520 and 540 can be patterned and transferred in a laminating process onto the bottom glass substrate, and the alignment layer, respectively. Unlike the conventionally employed metal oxide strips (ITO), no costly deposition or etching processes are required.

Figure 25:
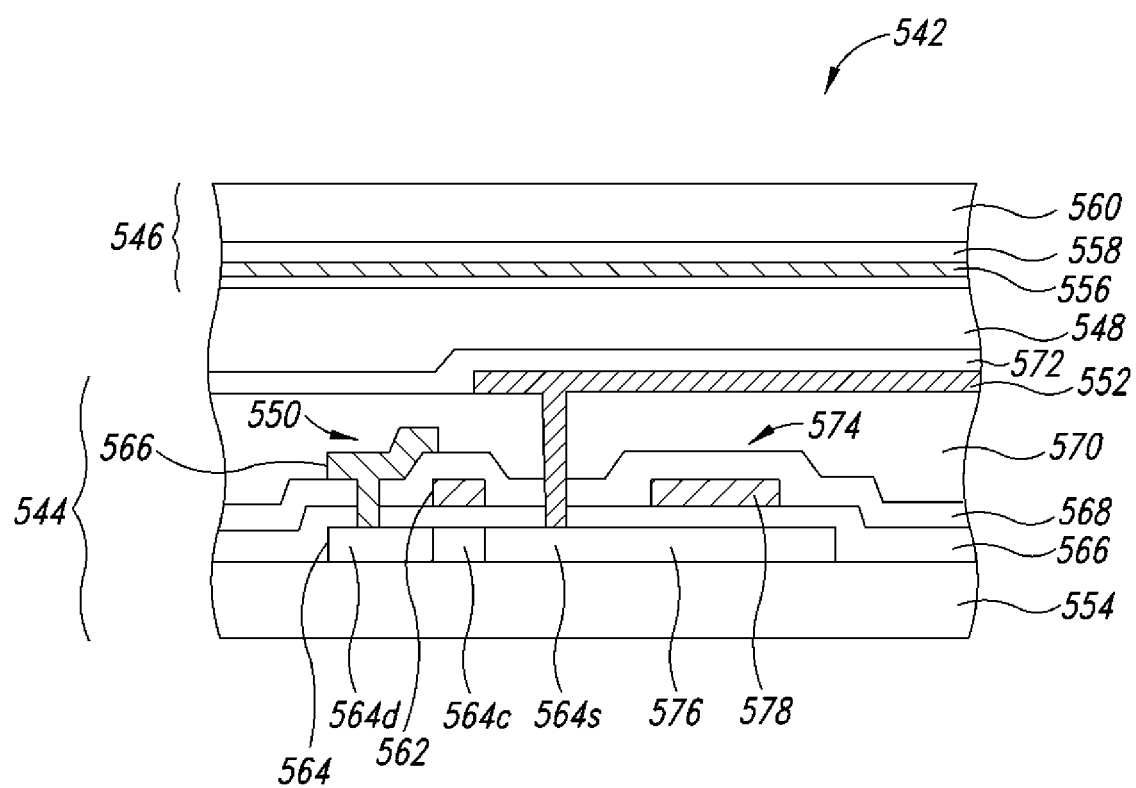
FIG. 25 shows a cross-sectional view of a LCD based on a top-gate TFT according to one embodiment.

FIG. 25 shows a cross-sectional view of a LCD based on a top-gate TFT according to another embodiment. As shown, the LCD 542 has a TFT substrate 544 and a color filter substrate 546 with a liquid crystal layer 548 interposed between them. As noted above, in the TFT substrate 544, thin film transistors 550 and pixel electrodes 552 are arranged in a matrix configuration on a bottom transparent substrate 554. A common electrode 556, to which a common voltage can be supplied and a color filter 558 are disposed on a top transparent substrate 560. A voltage applied between the pixel electrode 552 and the common electrode 556, which are facing each other with the liquid crystal 548 between them, drives the liquid crystal cells (pixels).

The thin film transistor 550 disposed for each of the pixels on the bottom transparent substrate 554 is a top-gate type TFT, whose gate electrode 562 is located above an active layer 564. The active layer 564 of the TFT is patterned on the bottom substrate 554 according to known methods in the art. A gate insulating layer 566 overlies and covers the active layer 564. The part of the active layer 564 facing the gate electrode 562 is a channel region 564c. A drain region 564d and a source region 564s with an impurity doped are positioned at respective sides of the channel region 564c. The drain region 564d of the active layer 564 is connected to a data line, which functions also as a drain electrode 566, through a contact hole formed in an interlayer insulating layer 568 covering the gate electrode 562. Also, an insulating layer 570 is disposed to cover the data line and the drain electrode 566. A nanowire-based transparent conductor film forming the pixel electrode 552 is positioned on the insulating layer 570. The pixel electrode 552 is connected to the source region 564s of the active layer 564 through a contact hole. A first alignment layer 572 may be positioned on the pixel electrode.

FIG. 25 further shows a storage capacitance element 574, which can be disposed for each pixel. The storage capacitance element maintains the electric charge corresponding to the display contents, which should be applied to the liquid crystal capacitance, when the TFT is not selected. Therefore, the voltage change of the pixel electrode 552 can be maintained, enabling the display contents to be kept unchanged during one sequence.

As shown, the source region 564s of the active layer 564 functions also as a first electrode 576 of the storage capacitance element 574. A second electrode 578 of the storage capacitance element 574 can be formed simultaneously with and in the same layer as the gate electrode 562. The gate insulating layer 566 also works as a dielectric between the first electrode 576 and the second electrode 578. The gate electrode 566 (i.e., gate line) and the second electrode 578 (i.e., a storage capacitance line) are arranged in parallel. They are oriented at a right angle from the pixel electrode 552 to define the matrix of pixels.

It should be understood that for both of the bottom-gate and top-gate TFT configurations, the active layer can be any acceptable semiconductor material. Typically, amorphous silicon is widely used due to the ease and economy of the deposition and patterning steps. Polycrystalline silicon can also be used. Because polycrystalline silicon has better current-driving capability than amorphous silicon, it provides superior performance when used in a switching device. Low temperature deposition of polycrystalline silicon is possible and has been reported as an alternative approach to manufacturing polycrystalline silicon-based TFT, see, e.g., U.S. Pat. No. 7,052,940. In addition, organic semiconductor material can also be used. In certain embodiments, an organic π conjugate compound can be used as the organic semiconductor material that forms the active layer of an organic TFT. The π conjugate compounds are known in the art, which include without limitation: polypyrroles, polythiophenes (may be optionally doped with $C_{60}$), polypyrenes, polyacetylene and polybenzothiophenes, and the like. More examples of the organic semiconductor materials suitable for the organic TFTs are described in, for example, U.S. Pat. No. 7,018,872.

As discussed herein, the TFT backplane is positioned in an LCD opposite to a color filter substrate (see, e.g., FIGS. 24 and 25). The color filter substrate typically comprises a transparent substrate, a black matrix (or a light-shielding layer) and an array of colored pixels. Typically, the colored pixels are arranged on the transparent substrate in a pattern. The black matrix forms a grid around each colored pixel. In certain embodiments, each colored pixel is associated with a color. In other embodiments, each colored pixel can be further divided into smaller colorant areas (referred to as subpixels), each subpixel being associated with a color. Typically, primary colors such as red (R), green (G) and blue (B) are used. For example, repeating arrays of RGB triads are capable of producing color images of a wide variety of colors. The colored pixels or subpixels are not limited to primary colors, other colors such as white, yellow or cyan can also be used.

In addition, the color filter substrate comprises a common electrode, which is a reference electrode to the pixel electrode in the TFT backplane. In certain embodiments, the common electrode can be formed of the nanowire-based transparent conductor as described herein.

Depending on the mode of an LCD, the relative positions of the common electrode and the unit color filters can be different in a TN (twisted nematic) mode from that in an IPS (In-plane-switching) mode.

Figure 26A:
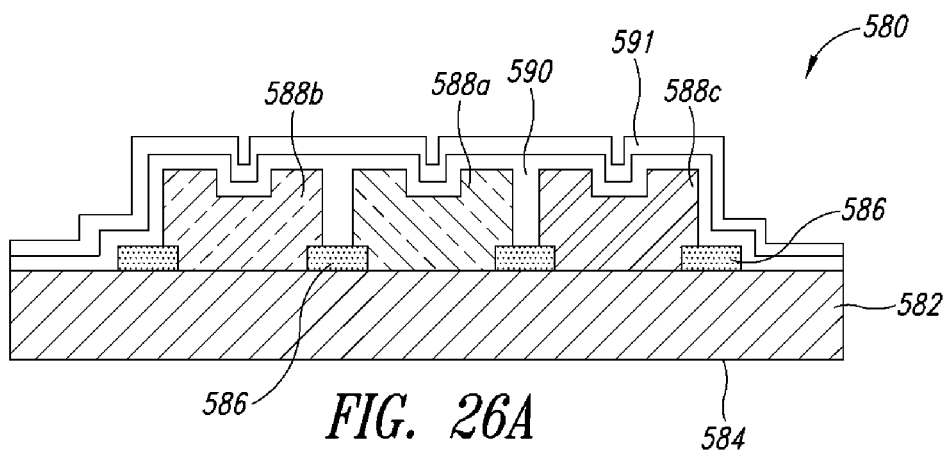
FIG. 26A shows a cross-sectional view of a color filter substrate in a TN mode LCD according to one embodiment.

FIG. 26A shows a cross-sectional view of a color filter substrate in a TN mode LCD according to one embodiment. The color filter substrate 580 includes a transparent substrate 582 having a displaying surface 584. The transparent substrate 582 can also be referred as a top or upper transparent substrate due to its spatial relation to the TFT backplane in a final LCD configuration (e.g., 560 in FIG. 25). The color filter substrate 580 further includes a black matrix (or light-shielding layer) 586 disposed in a lattice shape, and is formed on the transparent substrate 582 opposite from the displaying surface 584. External light is reflected by the black matrix and comes out of the displaying surface 584. The black matrix 586 can be made of a metal oxide and/or metal film (e.g., chrome/chrome oxide). Alternatively, the black matrix can be made of organic resins.

The color filter substrate 580 may comprise a plurality of colored pixels, such as first, second and third colored pixels 588a, 588b and 588c for transmitting red (R), green (G) and Blue (B) color lights, respectively. They are formed on at least one portion of the transparent substrate 582 free of the black matrix 586. The first, second and third colored pixels 588a, 588b and 588c are made from, for example, an acrylic resin or polyimide group resin dispersed with pigments, and is formed separately from the black matrix 586 to prevent color-mixing. In addition to the primary colors (e.g., RGB), the color filter substrates may contain other colors, for example RGBW or RG1G2B.

A common electrode 590 formed of a nanowire-based transparent conductor film is positioned on the colored pixels 588a, 588b and 588c. In addition to being a reference electrode to the pixel electrode (not shown), the common electrode also protects the color filters from contacting the liquid crystal layer (not shown). Optionally, a further protective layer 591 can overlie the common electrode 590. The further protective layer can be a transparent insulator such as polyimide. Such a protective layer may also serves as an alignment layer (see, e.g., 532 in FIG. 24), which directs the polarization directions of the liquid crystal through, for example, rubbing at about 250° C.

Figure 26B:
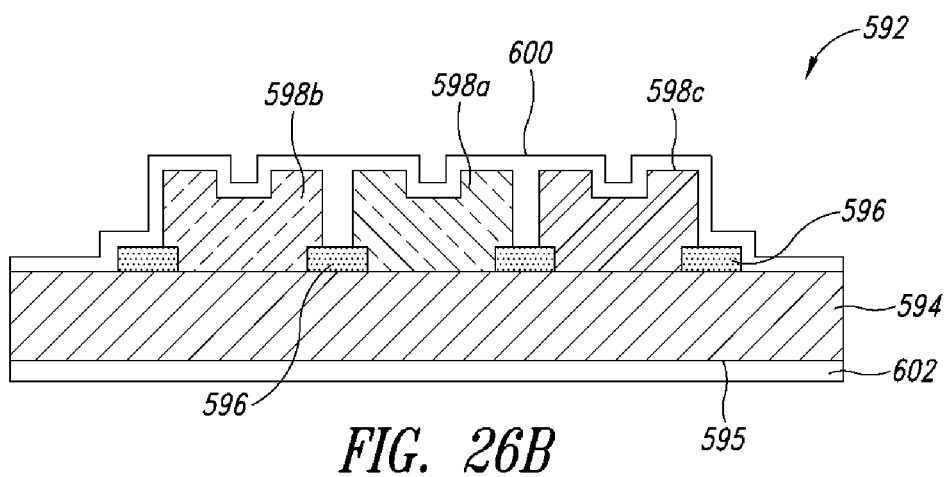
FIG. 26B shows a cross-sectional view of a color filter substrate in an IPS mode LCD according to another embodiment.

FIG. 26B shows a cross-sectional view of a color filter substrate in an IPS mode LCD according to another embodiment. The color filter substrate 592 includes a transparent substrate 594 having a displaying surface 595. A black matrix 596 is disposed on the transparent substrate 594 opposite from the displaying surface 595. First, second and third colored pixels 598a, 598b and 598c for transmitting R, G and B color lights, respectively are formed on at least one portion of the transparent substrate 594 free of the black matrix 596. A protective layer 600 is formed on the first to third colored pixels 598a, 598b and 598c and protect them from contacting with the liquid crystal (not shown). The protective layer 600 is typically a transparent insulator, such as polyimide. A common electrode 602 based on conductive nanowires is formed on the displaying surface 595 of the transparent substrate 594. In the case of IPS display, the common electrode 602 serves as an electrostatic discharge layer to avoid charging of the color filter plate.

The color filter substrate can be fabricated according to known methods in the art. The optical transparence and the electrical conductivity of the nanowire-based transparent conductor film make it suitable as an alternative electrode material in the color filter substrate of an LCD, regardless of the mode. The nanowire-based transparent conductor film can be coated or transferred from a laminated structure directly onto commercial color filters according to the methods described herein. A transparent conductive layer as described herein can also be used in a color-on-array display structure or other LCD structures using a transparent electrode.

(b) Plasma Display Panel

A plasma display panel emits visible light by exciting fluorescent materials (e.g., phosphors) with ultraviolet light generated by a plasma discharge. The plasma display panel employs two insulating substrates (e.g., glass plates), each insulating substrate having electrodes and barrier ribs formed thereon to define individual cells (pixels). These cells are filled with one or more inert gases (e.g., Xe, Ne or Kr), which can be ionized under an electrical field to produce the plasma. More specifically, address electrodes are formed behind the cells, along a rear glass plate. Transparent display electrodes, along with bus electrodes, are mounted in front of the cells, on a front glass plate. The address electrodes and the transparent display electrodes are orthogonal from one another and cross paths at the cells. In operation, a control circuitry charges the electrodes, creating a voltage difference between the front and back plates and causing the inert gases to ionize and form the plasma.

Metal oxide transparent conductors (e.g., ITO) are conventionally used as the transparent display electrodes on the upper glass plate to allow the plasma-generated visible light through. Current processing steps, notably, the sintering of the bus electrode and firing a front dielectric layer, can require high processing temperatures (up to 400 to 550° C.). For example, in order to obtain adequate transparency, the front dielectric layer (which covers and protects the display electrode and bus electrodes) is fired at about 570-580° C. At these temperatures, the resistivity of the ITO increases by about three-fold.

Nanowire-based transparent conductors are suitable electrode materials for the display electrodes in a PDP. They are demonstrated to be electrically and optically stable at high temperatures (e.g., at 300° C.). They can be patterned at the required features sizes (e.g., 100-300 μm) for PDPs; in particular, they can be patterned by the high-throughput methods described herein.

Figure 27:
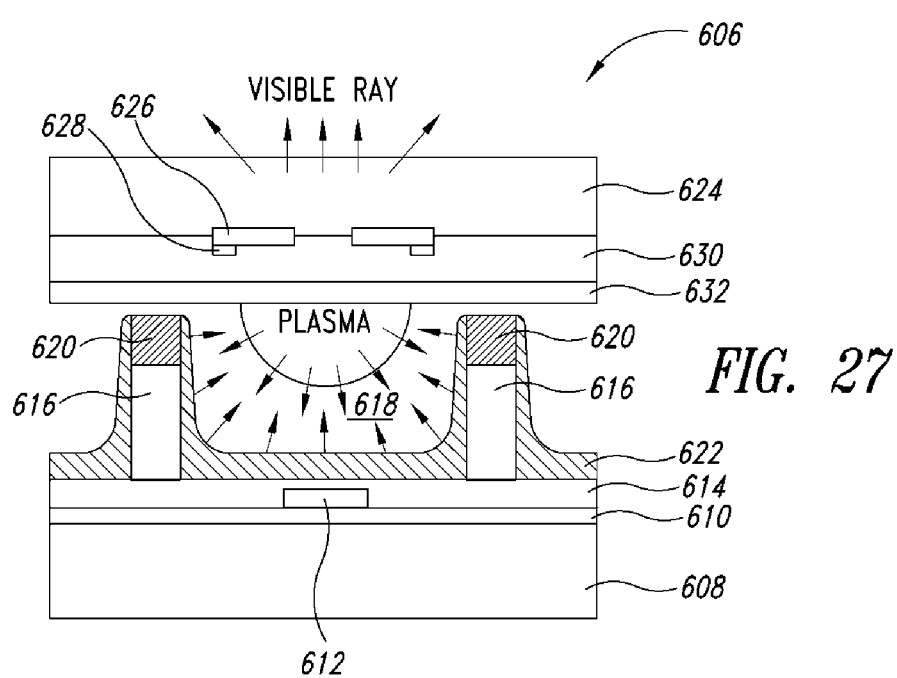
FIG. 27 shows a cross-sectional view of a PDP according to one embodiment.

FIG. 27 shows a cross-sectional view of a PDP according to one embodiment. The PDP 606 includes: a lower transparent substrate 608; a lower insulation layer 610 formed on the lower transparent substrate 608; an address electrode 612 formed on the lower insulation layer 608; a lower dielectric layer 614 formed on the address electrode 612 and the lower insulation layer 610; isolation walls 616 defining a discharging cell 618; black matrix layers 620 positioned on the isolation walls 616; a fluorescent layer 622 formed on the sides of the black matrix layer 620 and the isolation wall 616 and on the lower insulation layer 608; an upper transparent substrate 624; a display electrode 626 formed on the upper transparent substrate 624 and positioned at a right angle in relation to the address electrode 612; a bus electrode 628 formed on a portion of the display electrode 626; an upper dielectric layer 630 formed on the bus electrode 628, the display electrode 626 and the upper transparent substrate 624; and a protection layer (e.g., MgO) 632 formed on the upper dielectric layer 630. The display electrodes are formed by conductive nanowire films and patterned according to methods described herein.

It should be understood that the nanowire-based transparent conductor films are suitable for any other configurations of PDP in which transparent electrodes are positioned on a display panel such that light can transmit with acceptable efficiency to create an image on the display panel.

(c) Touch Screens

In a further embodiment, the transparent conductor described herein forms part of a touch screen. A touch screen is an interactive input device integrated onto an electronic display, which allows a user to input instructions by touching the screen. A touch screen device typically comprises two opposing electrically conductive layers separated by a spacer layer. The conductive layers are optically clear to allow light and image to transmit through. Currently available touch screens typically employ metal oxide conductive layers (e.g., ITO films). As noted above, ITO films are costly to fabricate and may be susceptible to cracking if used on a flexible substrate. In particular, ITO films are typically deposited on glass substrates at high temperature and in vacuo. In contrast, the transparent conductors described herein can be fabricated by high throughput methods and at low temperatures. They also allow for diverse substrates other than glass. For example, flexible and durable substrates such as plastic films can be coated with nanowires and become surface-conductive.

Figure 28:
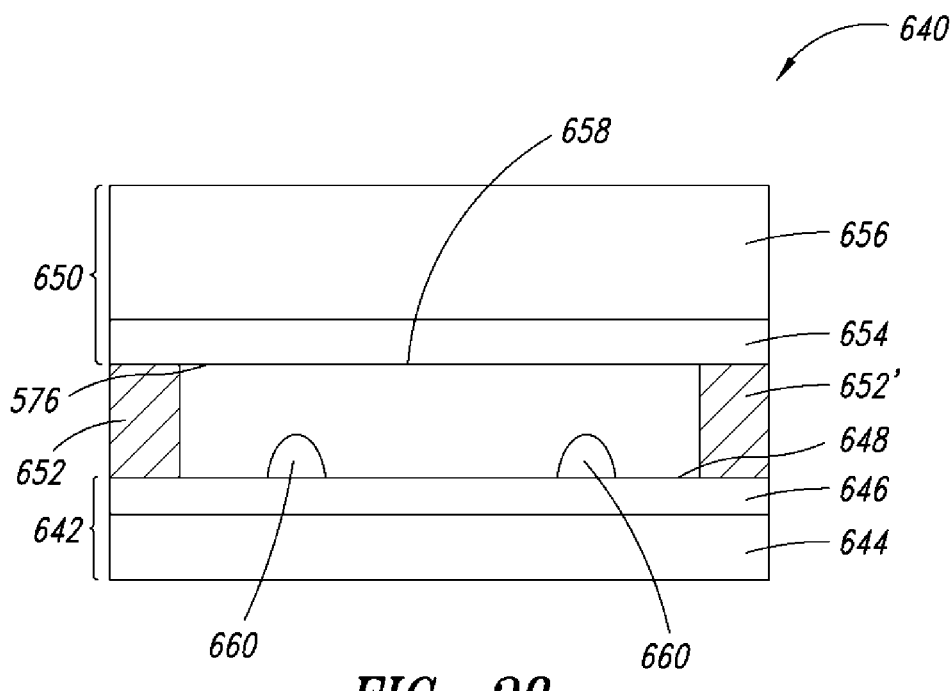
FIG. 28 shows a touch screen device comprising two transparent conductors based on metal nanowires.

Thus, FIG. 28 shows schematically a resistive touch screen device 640 according to one embodiment. The device 640 includes a bottom panel 642 comprising a first substrate 644 coated or laminated with a first conductive layer 646, which has a top conductive surface 648. An upper panel 650 is positioned opposite from the bottom panel 642 and separated therefrom by adhesive enclosures 652 and 652' at respective ends of the device 640. The upper panel 650 includes a second conductive layer 654 coated or laminated on a second substrate 656. The second conductive layer 654 has an inner conductive surface 658 facing the top conductive surface 648 and is suspended over spacers 660.

When a user touches the upper panel 650, the inner conductive surface 658 and the top conductive surface 648 of the bottom panel 642 come into electrical contact. A contact resistance is created, which causes a change in the electrostatic field. A controller (not shown) senses the change and resolves the actual touch coordinate, which information is then passed to an operating system.

According to this embodiment, either or both first and second conductive layers are based on conductive nanowire layers, as described herein. The inner conductive surface 658 and the top conductive surface 648 each have surface resistivity in the range of about 10-1000Ω/□, more preferably, about 10-500Ω/□. Optically, the upper and bottom panels have high transmission (e.g., >85%) to allow for images to transmit through.

In certain embodiments, the transparent conductive layer can be further coated with a protective layer (e.g., a dielectric overcoat), which improves the durability of the transparent conductive layer. However, making electrical contact with the underlying metal nanowires may become problematic because contact resistance cannot be reliably created due to the intervening dielectric overcoat(s). In addition, even slight variations in thickness in the overcoat may result in non-contact points on the film. Thus, in these embodiments, the overcoat layer is incorporated with conductive particles to create reliable electrical contacts and to improve contact resistance.

Figure 28A:
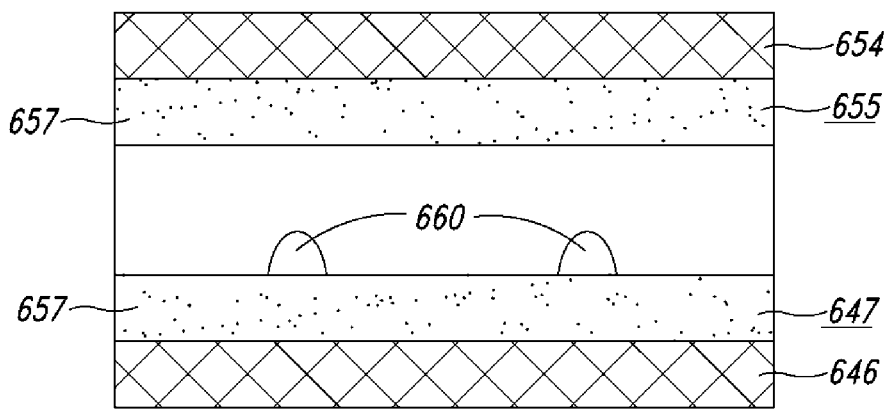
FIG. 28A shows two opposing transparent conductors coated with overcoats in a touch screen device.

FIG. 28A schematically shows two opposing conductive layers with respective overcoats. More specifically, the first conductive layer 646 is coated with a first overcoat 647 and the second conductive layer 654 is coated with a second overcoat 655. The first and second overcoats are embedded with conductive particles 657. The presence of the conductive particles in the dielectric overcoats increases their surface conductivity and provides electrical connection between the underlying nanowire-filled conductive layers.

Compared to the respective underlying nanowire-filled transparent conductive layer, the overcoat can tolerate much higher resistivity. Unlike the nanowires in the underlying conductive layer 646 or 654, which must form a conductive network above the electrical percolation threshold to ensure an in-plane conductivity (e.g., between 10-1000Ω/□ in resistivity), the conductive particles in the overcoat do not need to reach the electrical percolation threshold. For example, the sheet resistance of the overcoat can be as high as $10^8 \Omega/\square$. Even at this level, the resistivity through the overcoat is low enough for touch screen applications.

The overcoat can be formed of any of the optically clear polymeric matrix materials described herein. The thickness of the overcoat is typically less than 2 μm or less than 1 μm. Typically, a thicker overcoat is likely to result in a higher contact resistance.

Any type of nano-sized conductive particles can be used. Examples of suitable conductive particles include, but are not limited to, ITO, ZnO, doped ZnO, metallic nanowires, metallic nanotubes or carbon nanotubes (CNT) as described herein. The sizes of the conductive particles are typically lower than 200 nm to maintain an acceptable level of haze. More typically, they are lower than 100 nm. Because the loading level of the conductive particles is so low, their presence typically does not affect the optical transmission. On the other hand, the presence of the conductive particles may provide a certain degree of surface roughness that serves to reduce glare.

In certain embodiments, the conductive particles can be a mixture of highly conductive particles (e.g., metal nanowires) and low-conductivity particles (e.g., ITO or ZnO powders). While the metal nanowires do not have to form a conductive network within the matrix (i.e., above the electrical percolation threshold), they provide a high-conductivity path over a relatively large distance. The current will be mostly transported in these nanowires while the low-conductivity particles will provide the electrical connection between the nanowires. Advantageously, the sheet resistance of the overcoat can be controlled in a wider range by adjusting the ratio of the nanowires to low-conductive particles. Since the nanowires do not have to form a percolative network, it is expected that the resistivity of the final overcoat film will be in a more linear relationship with the nanowire concentration and stable at higher sheet resistances than using the low-conductivity powders alone. The mixture of the metal nanowires and conductive powders can be co-deposited with a matrix material in a one-pass process. Alternatively, in a two-pass process, a nanowire layer can be deposited (without necessarily forming a percolative network) prior to depositing the overcoat layer embedded with the low-conductive particles.

The first and second substrates can be a variety of materials, as described herein. For example, the first substrate can be rigid (e.g., glass, or rigid plastic such as polycarbonate or polyacrylate) while the second substrate can be a flexible film. Alternatively, for a flexible touch screen application, both substrates can be flexible films (e.g., plastic).

As known in the art, touch screen devices may also be made including only a single substrate having a transparent conductor and both this type of touch screen device and the two conductor type described above may include a third transparent conductor that functions as an electrostatic discharge layer. The transparent conductor described herein may be used in any of these types of touch panel devices. Additionally, nanowire-based transparent conductors used in such devices may be patterned as described herein or any other way known in the art.

(d) Photovoltaic Cells

Solar radiation provides a usable energy in the photon range of approximately 0.4 eV to 4 eV. Optoelectronic devices such as photovoltaic (PV) cells can harvest and convert certain photon energies in this range to electrical power. Photovoltaic cells are essentially semiconductor junctions under illumination. Light is absorbed by the semiconductor junction (or diode) and electron-hole pairs are generated on both sides of the junction, i.e., in the n-type emitter and in the p-type base. These charge carriers—electrons from the base and holes from the emitter—then diffuse to the junction and are swept away by the electric field, thus producing electric current across the device.

The semiconductor junction can be formed in a homojunction cell by doping a single material (e.g., crystalline silicon) to form p-type and n-type sides. Either PN structure or P-i-N structure can be used.

A heterojunction can be formed by contacting two different semiconductors. Typically, the two semiconductors have different band gaps. The one with the higher bandgap is selected for its transparency and positioned as a top layer or window layer. The one with the lower bandgap forms a bottom layer, which functions as a light-absorbing material. The window layer allows almost all incident light to reach the bottom layer, which readily absorbs light.

Multi-junction cells have been developed to capture a larger portion of the solar spectrum. In this configuration, individual heterojunction cells are stacked in such a way that sunlight falls first on the material having the largest bandgap. Photons not absorbed in the first cell are transmitted to the second cell, which then absorbs the higher-energy portion of the remaining solar radiation while remaining transparent to the lower-energy photons. These selective absorption processes continue through to the final cell, which has the smallest bandgap.

In excitonic PV cells, instead of a p-doped and n-doped region, the materials of different band gaps are used to split and exciton via charge transfer from one semiconductor to the other. After charge separation, the charges are swept away due to built in potential which is created due to the difference in work function between the contact electrodes for charge collection. Organic photovoltaic cells, for example, work this way where one semiconductor can be a polythiophene and the other C60. Polythiophene absorbs light and an exciton is created. The electron jumps from polythiophene to C60 (lower energy state for the electron). The holes move along the polythiophene backbone until they are collected as do the electrons by hopping between buckyballs.

Ohmic metal-semiconductor contacts are provided to both the n-type and p-type sides of the solar cell. In multi-junction cells, they are also interposed between two adjacent cells. Electrons that are created on the n-type side, or have been "collected" by the junction and swept onto the n-type side, may travel through the wire, power the load, and continue through the wire until they reach the p-type semiconductor-metal contact.

Because transparent conductors (e.g., ITO) allow light to pass through a window layer to the active light absorbing material beneath, as well as serve as ohmic contacts to transport photo-generated charge carriers away from that light absorbing material, they are desired as contact materials for solar cells.

Nanowire-based transparent conductor films described herein can be used as one or more contacts in a solar cell.

Unlike the conventional metal oxide transparent conductor, nanowire-based transparent conductor can be formed on a flexible substrate by high through-put methods. They also do not require the special deposition (in vacuum) that makes the use of metal oxide layers costly in solar cell applications.

Figure 29A:
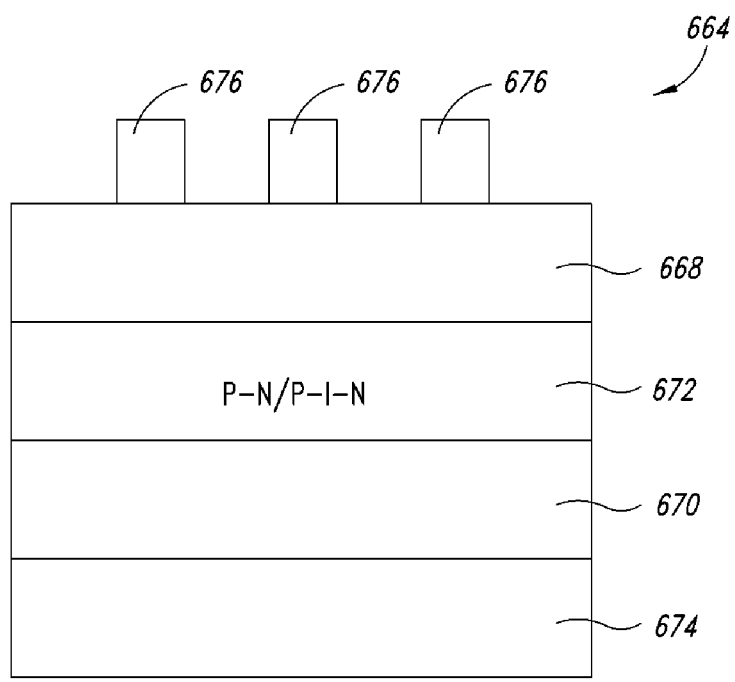
FIG. 29A shows a homojunction solar cell structure according to one embodiment.

Thus, one embodiment describes a homojunction solar cell comprising a top contact, a semiconductor diode, and a bottom contact, wherein one or both of the top contact and bottom contact can be made of nanowire-based transparent conductor film. FIG. 29A shows a homojunction solar cell 664. The solar cell 644 includes a top contact 668, a bottom contact 670, and a semiconductor diode 672 interposed therebetween.

The semiconductor diode can be, for example, a PN structure with the p-doped silicon on the top and N-doped silicon on the bottom. The silicon is typically crystalline silicon. As a more economical alternative, polycrystalline silicon can be used according to known methods in the art. The semiconductor diode can also be formed of amorphous silicon, in which case, a P-i-N structure is preferred.

The top contact and the bottom contact can be prepared by the methods described herein. The top contact is typically optically clear and comprises a light incidence surface, i.e., the surface that light initially enters in the solar cell.

Optionally, a substrate 674 can be present underneath the bottom contact 670. Also optionally, bus bars 676 can be formed overlying the top contact. The bus bars 676 can also be formed by patterned nanowire-based transparent conductor films.

Figure 29B:
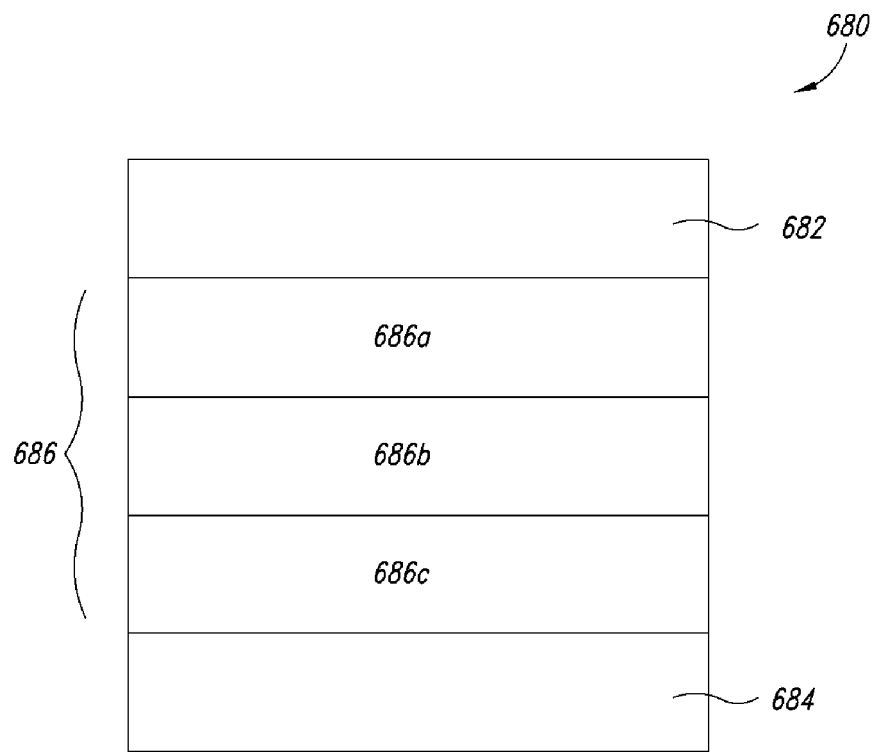
FIG. 29B shows a heterojunction solar cell structure according to another embodiment.

FIG. 29B shows a heterojunction solar cell according to another embodiment. As shown, the heterojunction solar cell 680 includes a top contact 682, a bottom contact 684, and a semiconductor heterojunction layer 686 interposed therebetween. One or both of the top contact 682 and bottom contact 684 can be made of nanowire-based transparent conductor film.

In certain embodiments, the semiconductor heterojunction layer 686 comprises a three-layer structure (e.g., N-i-P). Thus, it may comprise a doped top semiconductor layer 686a, an undoped middle semiconductor layer 686b and a doped bottom semiconductor layer 686c. In certain embodiment, the first semiconductor layer 686a has a higher bandgap than the third semiconductor layer 686c.

The first, second and third semiconductor layers can be deposited as thin film layers. Suitable semiconductor materials include, but are not limited to, organic semiconductor materials (as discussed herein), cadmium telluride (CdTe), copper indium gallium selenide (CIGS), copper indium selenide (CIS), and the like. For example, in a typical CdTe cell, the top layer is p-type cadmium sulfide (CdS), the middle layer is intrinsic CdTe, and the bottom layer is n-type zinc telluride (ZnTe).

It is also possible for the semiconductor heterojunction layer 686 to include only the top semiconductor layer 686a and the bottom semiconductor layer 686c in a NP structure.

Heterojunction cells based on thin film semiconductor layers save material cost, compared to that of silicon-based solar cells. However, due to inferior performance of thin film semiconductor layers, such devices are less efficient than the polysilicon-based cells in energy conversion. Thus, in one embodiment, a multijunction cell is described in connection with FIG. 29C. As shown, the multijunction cell 690 includes, sequentially from top to bottom: a top contact 692, a first cell 694, a tunnel layer 696, a second cell 698 and a bottom contact 700, wherein the top contact 692 and the bottom contact 700 are made of nanowire-based transparent conductor films. For purpose of simplicity, the multijunction cell 690 is shown to include only two cells. It should be understood, however, that additional cells can be fabricated in similar fashion.

Both the first cell 692 and the second cell 698 have similar 3-layer structures as the single junction solar cell 680 shown in FIG. 29B. The first cell is closer to an impinging light and should therefore be selected to have a larger bandgap than that of the second cell. In doing so, the first cell is transparent to the lower energy photons, which can be absorbed by the second cell 698.

The first and second cells are separated by a tunnel layer 696 to allow the flow of electrons between the cells. The tunnel layer 696 can be a PN diode comprising oppositely doped semiconductor layers.

The top contacts 692 and the bottom contacts 700 are nanowire-based transparent conductor films. They can be prepared by the methods described herein.

The solar cell 690 can include additional layers such as substrates, bus bars, anti-reflective films and the like, as will be recognized by one skilled in the art. Further, it should be understood that the nanowire-based transparent conductor films are suitable as one or more contacts in any solar cell configurations.

(e) Electroluminescent Devices.

Electroluminescence (EL) is the result of radiative recombination of electrons and holes in a material (usually a semiconductor). The excited electrons release their energy as photons as they return to their ground state. Prior to recombination, electrons and holes are separated either as a result of doping of the material to form a p-n junction (in semiconductor electroluminescent devices such as LEDs), or through excitation by impact of high-energy electrons accelerated by a strong electric field (as with the phosphors in electroluminescent displays).

EL devices are useful as, for example, backlighting for displays. They typically comprise two electrodes sandwiching an EL material, with at least one of the electrodes being transparent. Thin film designs of EL devices are possible by employing thin conductive films. Advantageously, patterned lighting can be achieved by using a patterned transparent conductor as one of the electrodes. Conventionally, polymeric conductive films such as poly(dioxythiophene) (PDOT) are used and patterned as the transparent conductor.

The nanowire-based transparent conductor films described herein are suitable as a transparent electrode in an EL device. Thus, FIG. 30 shows a thin film EL device according to one embodiment. The EL device 710 comprises, sequentially from the top: a top electrode 712, a dielectric layer 714, an EL material layer 716, a transparent electrode 718, an optional barrier layer 720, and an optional overcoat 722.

The transparent electrode 718 is formed by a nanowire layer, as described herein. The optical transmission and surface conductivity of a nanowire layer make it suitable as the transparent electrode. Moreover, as discussed in more detail in Example 8, the nanowires can be formulated into a screen printable ink composition. The ink composition can be printed to provide patterned electrodes, which is compatible with the current manufacturing process for patterning PDOT layer. Other patterning methods can also be used, including stamping, slot-die, and the like.

The EL material layer 716 can be any acceptable EL material, for example, phosphor. The optional barrier layer 720 can be a fluoropolymer (e.g., Kyner) to keep out adverse environmental factors, such as moisture.

(f) Electrostatic Dissipative Material—Anti-Static Coating

Electrostatic discharge (ESD) is a single-event, rapid transfer of electrostatic charge between two objects, usually resulting when two objects at different potentials come into direct contact with each other. Electrostatic charge build-up occurs as a result of an imbalance of electrons on the surface of a material. ESD is one of the major causes of device failures in the semiconductor industry.

Electrically conductive materials (e.g., conductive films or coatings) are effective as electrostatic dissipative materials by channeling harmful electrostatic charge away. Typically, a conductive layer having a surface resistivity of no more than $10^8 \Omega/\square$ is effective in mitigating or eliminating electrostatic charge build-up. More typically, an anti-static coating has a surface resistivity of between about $10^6 \Omega/\square$ and $10^7 \Omega/\square$.

Accordingly, nanowire-based conductive layers described herein are suitable as anti-static coatings. Any of the structures described in, for example, FIGS. 10B-10F, can be used as anti-static coating on a substrate in need thereof. Thus, one embodiment provides a method for providing electromagnetic shielding comprising; providing a composite including a plurality of metallic nanowires and a matrix material; applying the composite to a substrate in need of electromagnetic shielding; and forming a conductive layer including the plurality of metallic nanowires dispersed in the matrix material, the conductive layer having a surface conductivity of no more than $10^8 \Omega/\square$.

In certain embodiment, the anti-static coating is optically clear such that the underlying substrate is visible. In another embodiment, an optically clear substrate (e.g., plastic) coated with nanowire-based conductive layer can be used as a packaging material for electronics. The optical transparency allows for a direct visualization of the content in the package.

The transparent conductor structures, their electrical and optical properties, and the methods of fabrication are illustrated in more detail by the following non-limiting examples.

EXAMPLES

Example 1

Synthesis of Silver Nanowires

Silver nanowires were synthesized by the reduction of silver nitrate dissolved in ethylene glycol in the presence of poly(vinyl pyrrolidone) (PVP) following the "polyol" method described in, e.g. Y. Sun, B. Gates, B. Mayers, & Y. Xia, "Crystalline silver nanowires by soft solution processing", *Nanoletters*, (2002), 2(2) 165-168. A modified polyol method, described in U.S. application Ser. No. 11/766,552, in the name of Cambrios Technologies Corporation, produces more uniform silver nanowires at higher yields than does the conventional "polyol" method. This application is incorporated by reference herein in its entirety.

Example 2

Preparation of a Transparent Conductor

An Autoflex EBG5 polyethylene terephthalate (PET) film 5 μm thick was used as a substrate. The PET substrate is an optically clear insulator. The light transmission and haze of the PET substrate are shown in Table 2. Unless specified otherwise, the light transmission was measured using the methodology in ASTM D1003.

An aqueous dispersion of silver nanowires was first prepared. The silver nanowires were about 70 nm to 80 nm in width and around 8 μm in length. The concentration of the silver nanowires (AgNW) was about 0.5% w/v of the dispersion, resulting in an optical density of about 0.5 (measured on a Molecular Devices Spectra Max M2 plate reader). The dispersion was then coated on the PET substrate by allowing the nanowires to sediment onto the substrate. As understood by one skilled in the art, other coating techniques can be employed e.g., flow metered by a narrow channel, die flow, flow on an incline and the like. It is further understood that the viscosity and shear behavior of the fluid as well as the interactions between the nanowires may affect the distribution and interconnectivity of the nanowires coated.

Thereafter, the coated layer of silver nanowires was allowed to dry by water evaporation. A bare silver nanowire film, also referred to as a "network layer", was formed on the PET substrate. (AgNW/PET) The light transmission and haze were measured using a BYK Gardner Haze-gard Plus. The surface resistivity was measured using a Fluke 175 True RMS Multimeter. The results are shown in Table 2. The interconnectivity of the nanowires and an areal coverage of the substrate can also be observed under an optical or scanning electron microscope.

The matrix material was prepared by mixing polyurethane (PU) (Minwax Fast-Drying Polyurethane) in methyl ethyl ketone (MEK) to form a 1:4 (v/v) viscous solution. The matrix material was coated on the bare silver nanowire film by spin-coating. Other known methods in the art, for example, doctor blade, Meyer rod, draw-down or curtain coating, can be used. The matrix material was cured for about 3 hours at room temperature, during which the solvent MEK evaporated and the matrix material hardened. Alternatively, the curing can take place in an oven, e.g., at a temperature of 50° C. for about 2 hours.

A transparent conductor having a conductive layer on the PET substrate (AgNW/PU/PET) was thus formed. The conductive layer of the silver nanowires in the matrix was about 100 nm thick. Its optical and electrical properties were measured and the results are shown in Table 2.

The transparent conductor was further subjected to a tape test. More specifically, a 3M Scotch® 600 adhesive tape was firmly applied to the surface of the matrix and then removed, for example, by peeling. Any loose silver nanowires were removed along with the tape. After the tape test, the optical and electrical properties of the transparent conductor were measured and the results are shown in Table 2.

By way of comparison, a matrix-only film was formed on a PET substrate (PU/PET) under the same conditions as described above. The optical properties (light transmission and haze) and the electrical properties of the PU/PET are also provided in Table 2.

As shown in Table 2, the matrix-only film on PET (PU/PET) had a slightly higher light transmission as well as haze value than a PET substrate. Neither was conductive. By comparison, the bare silver nanowire film on PET was highly conductive, registering a surface resistivity of 60Ω/□. The deposition of the bare silver nanowire film on the PET lowered the light transmission and increased the haze. However, the bare silver nanowire film on PET was still considered optically clear with a light transmission of more than 80%. The optical and electrical properties of the bare silver nanowire film on PET were comparable or superior to metal oxide films (e.g., ITO) formed on PET substrates, which typically range from 60 to 400Ω/□.

As further shown in Table 2, the transparent conductor based on silver nanowires in the polyurethane matrix had an almost identical light transmission as the bare silver nanowire film on PET, and a slightly higher haze. The resistivity of the transparent conductor remained the same as the bare silver nanowire film, indicating that the coating of the matrix material did not disturb the silver nanowire film. The transparent conductor thus formed was optically clear, and had a comparable or superior surface resistivity to metal oxide films (e.g., ITO) formed on PET substrates.

In addition, the tape test did not alter the resistivity or the light transmission of the transparent conductor, and only slightly increased the haze.

TABLE 2

| Transparent Media | Light Transmission (%) | Haze (%) | Resistivity (Ω/□) |
| --- | --- | --- | --- |
| PET | 91.6 | 0.78 | non-conductive |
| PU/PET | 92.3 | 0.88 | non-conductive |
| AgNW/PET | 87.4 | 4.76 | 60 |
| AgNW/PU/PET | 87.2 | 5.74 | 60 |
| After tape test | 87.2 | 5.94 | 60 |

Example 3

Accelerated $H_2S$ Corrosion Tests

Sulfides, such as hydrogen sulfide ($H_2S$), are known corrosive agents. The electrical properties of the metal nanowires (e.g., silver) can potentially be affected in the presence of the atmospheric sulfides. Advantageously, the matrix of the transparent conductor serves as a gas permeation barrier. This prevents, to certain degree, the atmospheric $H_2S$ from contacting the metal nanowires embedded in the matrix. Long-term stability of the metal nanowires can be further obtained by incorporating one or more corrosion inhibitors in the matrix, as described herein.

In the United States, the amount of $H_2S$ in the air is about 0.11-0.33 parts per billion (ppb). At this level, corrosion is expected to take place over an extended period of time. Thus, an accelerated $H_2S$ corrosion test was designed to provide an extreme case of $H_2S$ corrosion.

Figure 31:
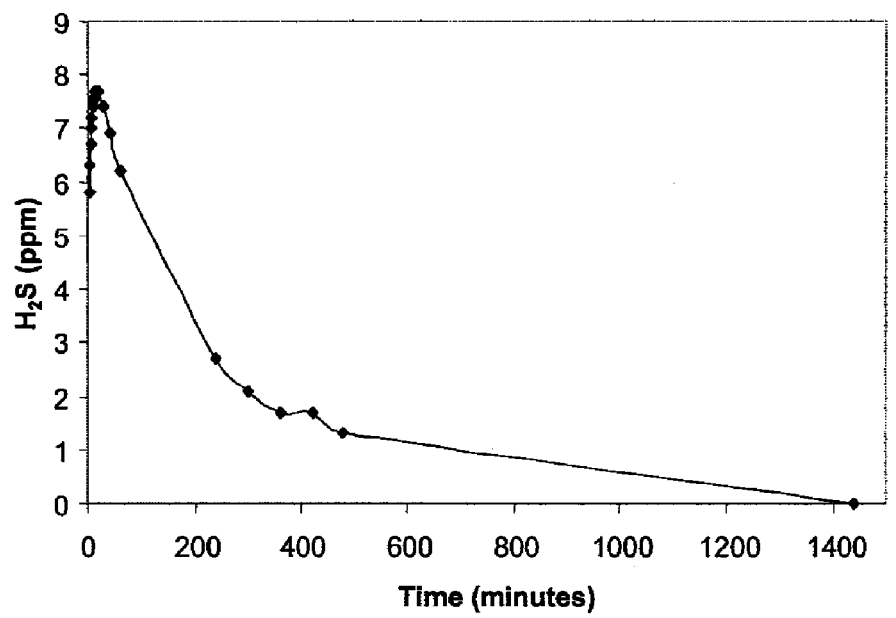
FIG. 31 shows a typical release profile of $H_2S$ gas from freshly cooked egg yolks.

Freshly cooked egg yolks were broken into pieces and sealed in a plastic bag. A $H_2S$ meter (Industrial Scientific, GasBadge Plus—Hydrogen Sulfide Single Gas Monitor) was inserted into the bag to monitor the release of $H_2S$ from the egg yolks. FIG. 31 shows a typical release profile of the $H_2S$ gas over a period of 24 hours. After an initial build-up of the $H_2S$ in the bag, the gas level dropped, indicating that the gas had diffused out of the permeable bag. Nevertheless, the levels of the $H_2S$ gas (peaked at 7.6 ppm) in the bag greatly surpassed the level of the atmospheric $H_2S$ gas.

A bare silver nanowire film on PET was prepared according to Example 2. The film was placed in a plastic bag with freshly cooked egg yolks. The film began to darken within two hours, indicating that the silver had been tarnished and black $Ag_2S$ was formed. In contrast, color changes in films of silver nanowires in polyurethane matrix were not observed until after 2-3 days, indicating that the polyurethane matrix acted as a barrier to slow down the permeation of the $H_2S$ gas.

Example 4

Incorporation of Corrosion Inhibitors

The following samples of conductive films were prepared. A PET substrate was used for each sample. In certain samples, corrosion inhibitors, including benzotriazole, dithiothiadiazole and acrolein, were incorporated during the preparation of the conductive films.

Samples 1-2 were prepared according to the method described herein. No corrosion inhibitor was present.

Sample 1 was a conductive film of bare silver nanowires.

Sample 2 was a conductive film of silver nanowires in a polyurethane matrix.

Samples 3-6 were prepared by first forming a bare silver nanowire film on a PET substrate (i.e., Sample 1). Thereafter, various corrosion inhibitors were incorporated during the coating processes of the matrix material.

Sample 3 was prepared by coating a 0.1 w/v % solution of benzotriazole (BTA) in methyl ethyl ketone (MEK) on the bare silver nanowire film, allowing the solvent to dry after coating, followed by coating the matrix material of polyurethane (PU) in MEK (1:4).

Sample 4 was prepared by first incorporating 1.5 v/v % of dithiothiadiazole in a matrix material PU/MEK (1:4), followed by coating the matrix material on the bare silver nanowire film.

Sample 5 was prepared by first dipping a bare silver nanowire film in a solution of 1.5 v/v % of dithiothiadiazole in MEK, allowing the solvent to dry after dipping, followed by coating with a matrix material PU/MEK (1:4) having 1.5 v/v % of dithiothiadiazole.

Sample 6 was prepared by first incorporating 1.5 v/v % of acrolein in a matrix material PU/MEK (1:4), followed by coating the matrix material on a bare silver nanowire film.

The optical and electrical properties of the Samples 1-6 were measured before and after an accelerated $H_2S$ treatment, as described in Example 3. The results are shown in FIGS. 32A, 32B and 32C.

Figure 32A:
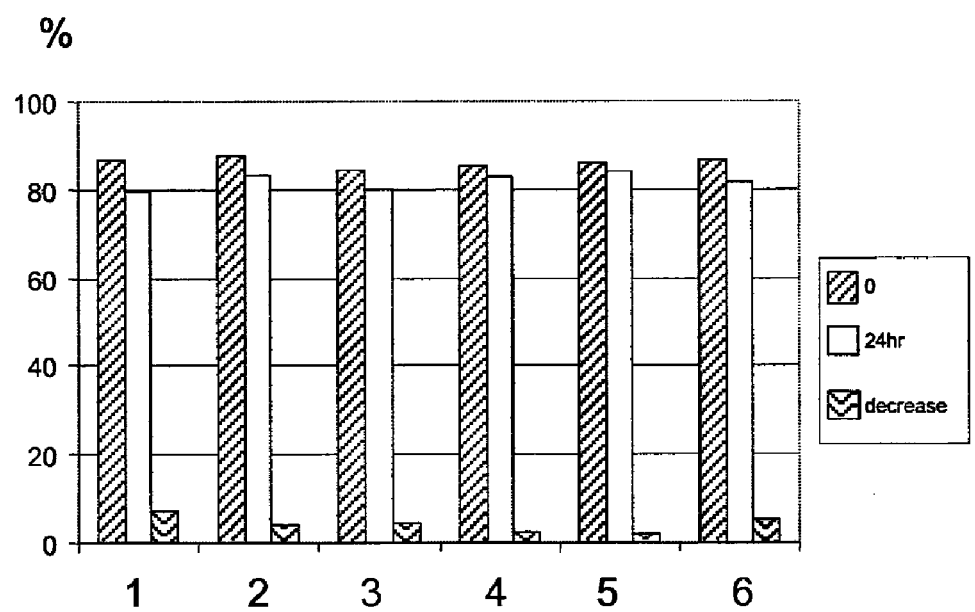
FIG. 32A shows the light transmission of six samples of conductive films before and after an accelerated $H_2S$ corrosion test.

FIG. 32A shows the light transmission measurements of Samples 1-6 before the $H_2S$ treatment and 24 hours after the $H_2S$ treatment. For purpose of comparison, the decrease of light transmission for each sample is also graphed. Prior to the $H_2S$ treatment, all of the samples were shown to be optically clear (having a light transmission higher than 80%). Following 24 hours of the $H_2S$ treatment, all of the samples have experienced decreases in their light transmissions due to different degrees of silver tarnish.

As expected, Sample 1 had the most reduction in light transmission. Samples 3 and 6 did not perform better than the matrix-only sample (Sample 2). Samples 4 and 5, however, had less reduction in light transmission compared to the matrix-only sample, indicating the corrosion inhibitor dithiothiadiazole was effective in protecting the silver nanowires from being corroded.

Figure 32B:
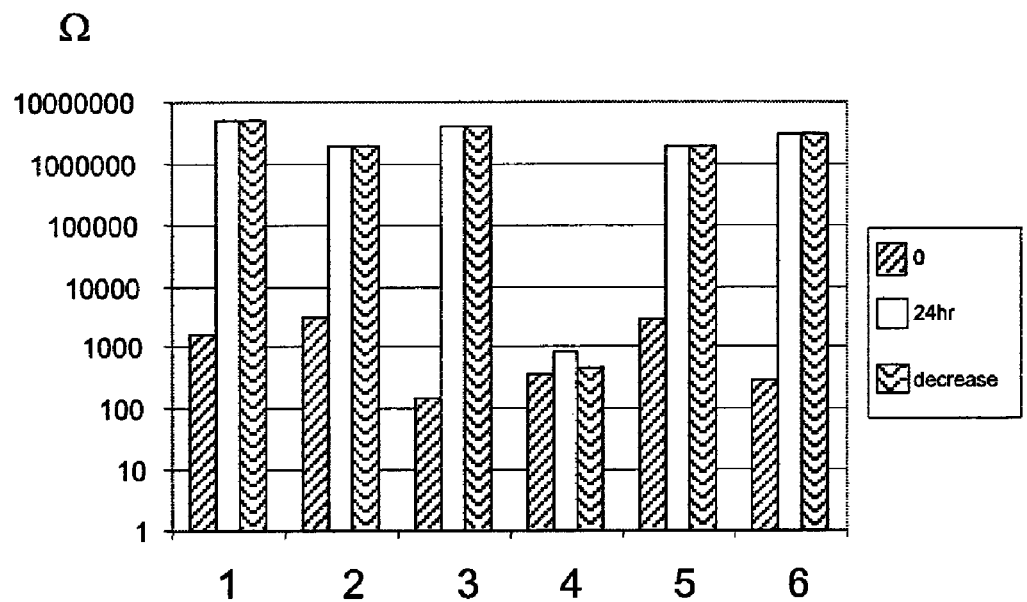
FIG. 32B shows the resistance of six samples of conductive films before and after an accelerated $H_2S$ corrosion test.
Figure 32C:
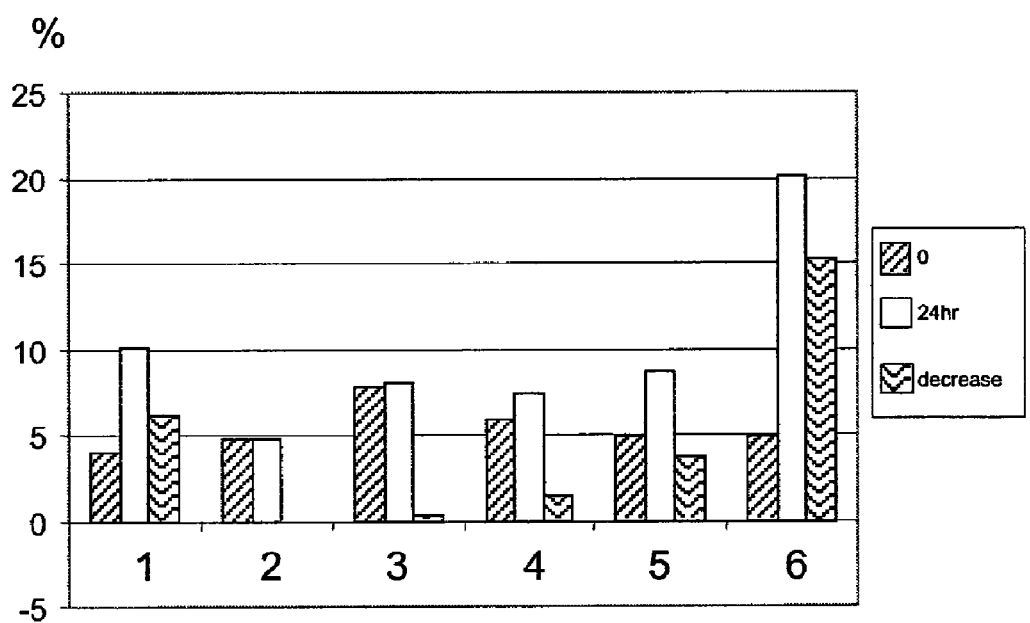
FIG. 32C shows the haze values of six samples of conductive films before and after an accelerated $H_2S$ corrosion test.

FIG. 32B shows the resistance measurements of Samples 1-6 before the $H_2S$ treatment and 24 hours after the $H_2S$ treatment. For purpose of comparison, the decrease of the resistance for each sample is also graphed. As shown, all but Sample 4 experienced dramatic increases in their resistances and effectively became non-conductive, although the onset of the degradation in electrical properties was significantly delayed for some samples. Sample 4 had only a modest increase in its resistance. It is noted that the impacts of $H_2S$ on Sample 4 and Sample 5 differed considerably, despite that both Samples had the same corrosion inhibitor (dithiothiadiazole). This implies that the coating processes may affect the effectiveness of a given corrosion inhibitor.

FIG. 32C shows the haze measurements of Samples 1-6 before the $H_2S$ treatment and 24 hours after the $H_2S$ treatment. For purpose of comparison, the change in the haze for each sample is also graphed. All the samples showed increases in their haze measurements. With the exception of Samples 1 and 6, the haze was within acceptable range (less than 10%) for each of Samples 2-5.

Sample 4 was shown to have the best overall performance in withstanding the corrosive $H_2S$ gas. By incorporating the corrosion inhibitor (dithiothiadiazole) in the matrix, the transparent conductor showed clear advantage over Sample 2 in which no corrosion inhibitor was present.

It is noted that the $H_2S$ levels in these accelerated tests were far greater than the atmospheric $H_2S$. It is therefore expected that transparent conductors prepared similarly as Sample 4 would fare even better in the presence of the atmospheric $H_2S$.

Example 5

Pressure-Treatment of Metal Nanowire Network Layers

Table 3 illustrates the results of two trials of applying pressure to a surface of a silver nanowire network layer (or "network layer") on a substrate.

Specifically, silver nanowires of around 70 nm to 80 nm in width and around 8 μm in length were deposited on an Autoflex EBG5 PET substrate. The substrate was treated with Argon plasma prior to the deposition of the nanowires. A network layer was formed according to the method described in Example 2. No matrix material was applied to the networks prior to the pressure treatment. The Trials listed in Table 2 were carried out using a single stainless steel roller on a rigid bench-top surface. The area of the network layer treated was from 3 to 4 inches wide and from 3 to 4 inches long.

TABLE 3

| Process | Trial 1 R (Ω/square) | Trial 2 R (Ω/square) | Transmission (%) | Haze (%) |
|---|---|---|---|---|
| (original) | 16000 | 400000 | 88.2 | 3.34 |
| 1 roll @ 340 psi | 297 | 690 | 87.3 | 3.67 |
| 1 roll @ 340 psi | 108 | 230 | 87.2 | 4.13 |
| 1 roll @ 340 psi | 73 | 127 | 86.6 | 4.19 |
| 1 roll @ 340 psi | 61 | 92 | 87.1 | 4.47 |
| 1 roll @ 340 psi | 53 | 86 | 86.6 | 4.44 |
| Ar plasma | 38 | 62 | 88.0 | 4.19 |

Prior to any application of pressure, the network layers had the resistance indicated in the "original" row (the network layers were not pre-treated with plasma.) Each row of Table 3 indicates a subsequent single roll across the network layer at approximately 340 psi.

In each trial, the network layer was rolled 5 times. Thereafter, a plasma treatment was applied to the network layer. The resistance after each roll is as listed in the second (first trial) and third (second trial) columns. Variation in transmission and haze for the second trial is as listed in the fourth and fifth columns, respectively. As shown, it was determined that the conductivity of the network layer of each trial was increased by application of pressure to a surface thereof.

As shown above in Table 3, application of pressure to a network layer by a roller can reduce the light transmission of the layer and increase the haze. As shown in Table 4 below, a washing process following the pressure treatment can further improve the transmission and reduce the haze of the network layer.

TABLE 4

| Process | Resistance (Ω/□) | Transmission (%) | Haze (%) |
|---|---|---|---|
| (original) | 700,000 | 86.4 | 4.77 |
| 2 rolls @ 340 psi | 109 | 85.6 | 5.24 |
| soap & water wash | 44 | 86.0 | 4.94 |
| Ar plasma | 24 | 85.9 | 4.81 |

As shown in Table 4, application of pressure to a network layer by twice rolling with a single stainless steel bar at approximately 340 psi on a rigid surface reduced the light transmission and increased the haze of the network layer. Washing the network layer with soap and water after the rolling, however, increased the transmission and decreased the haze. An argon plasma treatment further improved the transmission and haze.

Washing the network with soap and water without rolling is also effective at improving the conductivity to some extent.

Following the pressure or washing treatments, a matrix material can be coated as previously described in Example 2.

Example 6

Photo-Patterning of Conductive Layers

Figure 33:
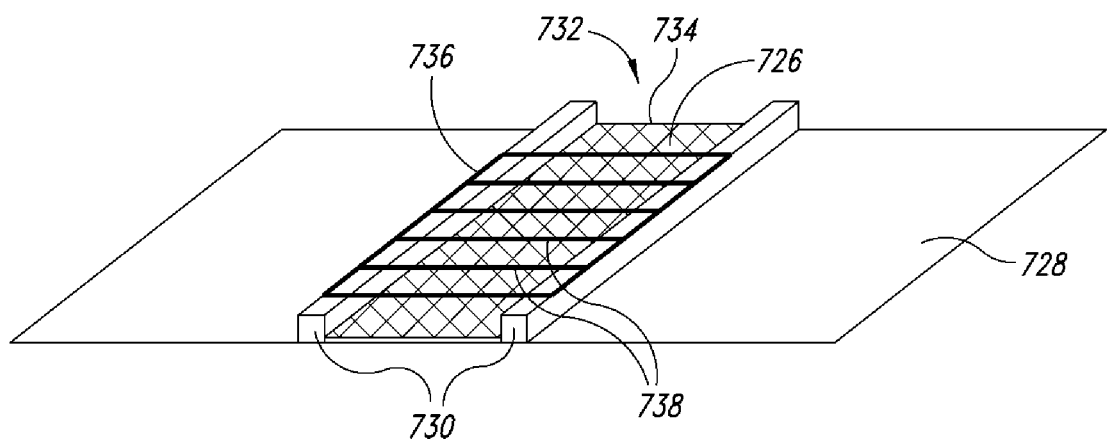
FIG. 33 shows an example of directly patterning a nanowire-based transparent conductive film.

FIG. 33 illustrates one method of directly patterning a nanowire-based transparent conductive film. In this example, a silver nanowire network layer ("network layer") 726 was initially formed on a glass substrate 728 according to the method described in Example 2. Two holders 730 were placed on the glass substrate 726 to define an area 732 for matrix formation. A photo-curable matrix material 734 comprising a mixture of prepolymers was coated over the network layer 726 within the area 732. A mask 736 was placed upon the holders 730. The mask 736 was a glass slide having a array of dark lines 738 of about 500 μm wide. The matrix material was then irradiated under a Dymax 5000 lamp for 90 seconds. The matrix material cured in the regions exposed to light and remained liquid in the regions that were masked by the dark lines.

FIGS. 34A-F show images of a photo-patterned conductive layer under an optical microscope. FIG. 34A shows a conductive film 740 immediately after photo-curing (5×). The lighter region 748 was exposed to UV irradiation and cured. The darker region 744 was masked from the light exposure and the matrix material therein was uncured. Conductive film 740 was further subjected to an adhesive tape or a tacky roll treatment to remove the uncured matrix material and the nanowires in the uncured region 744. FIG. 34B shows the conductive film 740 after the adhesive tape treatment (5×), in which the cured region 748 appears much lighter than the uncured region 744. At higher magnification (FIGS. 34C and 34D, 20×), it can be observed that the uncured region 744 has a lower concentration of nanowires than the cured region 748. This contrast is more apparent in FIGS. 34E and 34F (100×). It was further observed that, following the adhesive tape treatment, the concentration of the nanowires dropped below the percolation threshold in the uncured region 744. Electrical measurements using fine probe tips showed that the uncured region 744 was non-conductive.

Figure 35C:
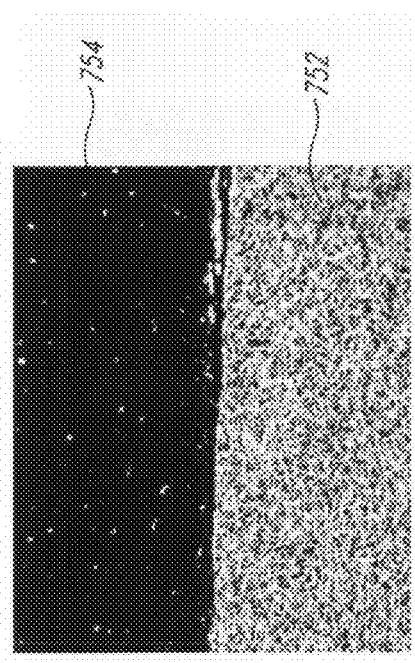
FIGS. 35A-35D show photographs of another exemplary conductive film before and after a solvent treatment.
Figure 35D:
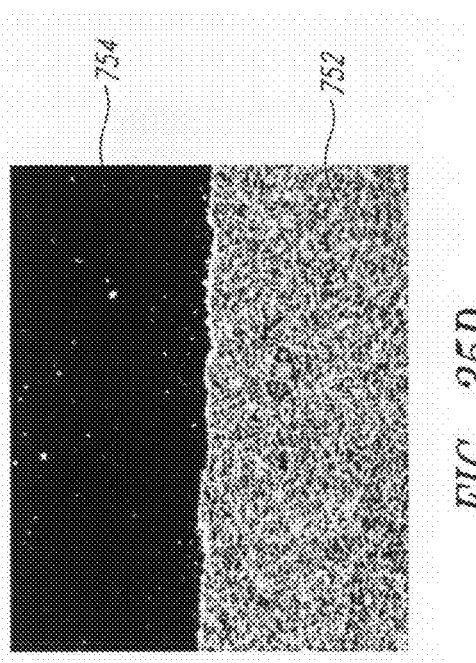
Figure 35A:
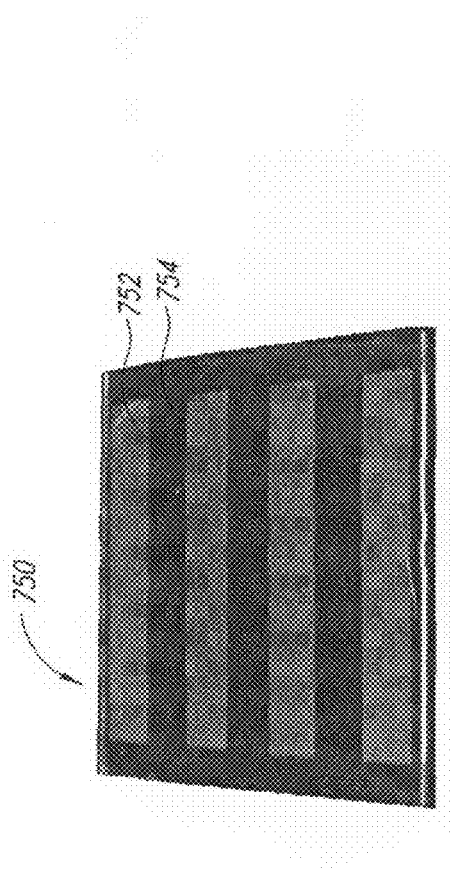
Figure 35B:
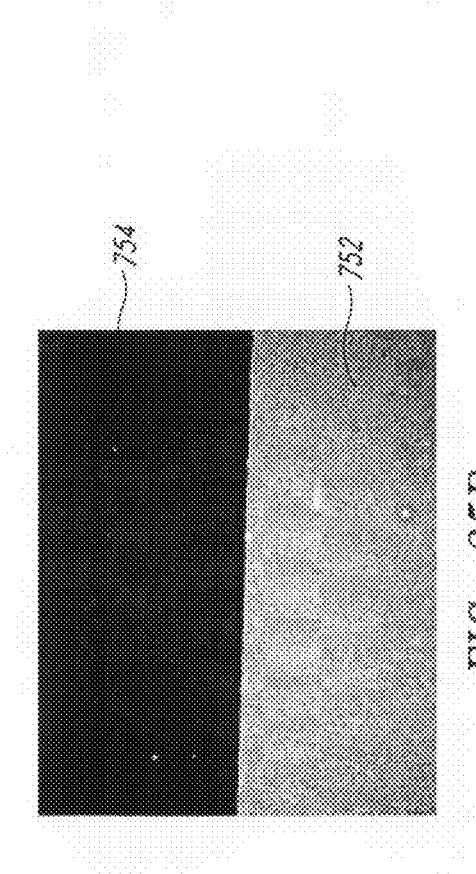

As an alternative to removing the matrix material and nanowires in the uncured region using adhesive tapes or tacky rolls, a solvent may be used to wash the uncured regions. As shown in FIGS. 35A-D, a conductive film 750 was prepared as described above and exposed to UV irradiation through a brass aperture mask. FIG. 35A shows cured regions (conductive regions) 752 and uncured regions 754 after being washed with ethanol and wiped. FIGS. 35B-D illustrate, at increasing magnifications, the contrast of the nanowire concentration in the uncured regions 754 compared to that in the cured regions 752. In the uncured regions 754, most of the uncured matrix material and the silver nanowires had been removed by the ethanol washing. Photo-patterning therefore produces conductive regions and non-conductive region according to a predetermined pattern.

Example 7

Photo-Curable Formulations

The matrix material described in Example 6 can be formulated by combining an acrylate monomer (or prepolymer, as defined herein), a multi-functional acrylate monomer (or prepolymer) and at least one photoinitiator. Any acrylate monomers or prepolymers can be used, such as epoxy acrylates, more specifically, 2-ethylhexyl acrylate, 2-phenoxyethyl acrylate, lauryl acrylate, methacrylates, and the like. Any multi-functional acrylate monomer (or prepolymer) can be used to promote the formation of a crosslinking polymer network. Examples include trimethylolpropane triacrylate (TMPTA), tripropylene glycol diacrylate, bisphenol-A diacrylate, propoxylated (3) trimethylolpropane triacrylate, dipentaerythritol penta-acrylate. Any photoinitiator, for example, ketone based initiators, can be used. Specific examples include: Ciba Irgacure 754, phenyl ketone such as Ciba Irgacure 184, α-hydroxy ketones, glyoxylates, benzophenone, α-amino ketones and the like. More specifically, a fast-curing formulation can be prepared by combining 60%-70% 2-ethylhexyl acrylate, 15%-30% trimethylolpropane triacrylate and about 5% Ciba Irgacure 754.

Other additives can be added to enhance the stability and/or promote the adhesion of the matrix and the nanowires. For example, an adhesion promoter (e.g., silanes) that promotes the coupling between organic matter and inorganic matter can be used. Examples of the silane-type adhesion promoters include GE Silquest A174, GE Silquest A1100 and the like. Antioxidants such as Ciba Irgonox 1010ff, Ciba Irgonox 245, Irgonox 1035 can be used. Moreover, additional or co-initiators can be used to promote the efficiency of the photoinitiator. Examples of coinitiator can include any types of tertiary amine acrylates, such as Sartomer CN373, CN 371, CN384, CN386 and the like. An additional photoinitiator such as Ciba Irgacure OXE01 can be further added.

Below are four exemplary photo-curable formulations suitable as the matrix material used in this example:

Formulation 1
75% 2-ethylhexyl acrylate;
20% trimethylolpropane triacrylate (TMPTA);
1% adhesion promoter (GE Silquest A1100);
0.1% antioxidant (Ciba Irgonox 1010ff) and
4% photoinitiator (Ciba Irgacure 754)

Formulation 2
73.9% 2-ethylhexyl acrylate;
20% trimethylolpropane triacrylate (TMPTA);
1% adhesion promoter (GE Silquest A1100);
0.05% antioxidant (Ciba Irgonox 1010ff) and
5% photoinitiator (Ciba Irgacure 754)

Formulation 3
73.1% tripropylene glycol diacrylate (TPGDA)
22.0% trimethylolpropane triacrylate (TMPTA)
4.9% photoinitiator (Ciba Irgacure 754)
0.03% antioxidant (4-methoxyphenol)

Formulation 4
68% 2-ethylhexyl acrylate;
20% trimethylolpropane triacrylate (TMPTA);
1% adhesion promoter (GE Silquest A1100);
0.1% antioxydant (Ciba Irgonox 1010ff) and
5% photoinitiator I (Ciba Irgacure 754)
5% coinitiator (Sartomer CN373)
1% photoinitiator II (Ciba Irgacure OXE01)

Example 8

Nanowire Dispersion

A nanowire dispersion, or ink, was formulated by combining about 0.08% wt. HPMC, about 0.36% wt. silver nanowires, about 0.005% wt. Zonyl® FSO-100 and about 99.555% wt. water. As an initial step, an HPMC stock solution was prepared. An amount of water equal to about ⅜ of the total desired volume of nanowire dispersion was placed in a beaker and heated to between 80° C. and 85° C. on a hotplate. Enough HPMC to make 0.5% wt. HPMC solution was added to the water and the hotplate was turned off. The HPMC and water mixture was stirred to disperse the HPMC. The remainder of the total amount of water was chilled on ice and then added to the heated HPMC solution and stirred at high RPM for about 20 min. The HPMC solution was filtered through a 40 μm/70 μm (absolute/nominal) Cuno Betapure filter to remove undissolved gels and particulates. Next a stock solution of Zonyl® FSO-100 was prepared. More specifically, 10 g of Zonyl® FSO 100 were added to 92.61 mL of water and heated until the Zonyl® FSO 100 was fully dissolved. The necessary amount of HPMC stock solution to make about 0.08% wt. HPMC solution in the final ink composition was placed in a container. Then, the necessary amount of Di water to make about 99.555% wt. water solution in the final ink composition was added. The solution was stirred for about 15 min. and the necessary amount of silver nanowires to make about 0.36% Ag nanowire solution in the final ink composition were added. Finally, the necessary amount of the Zonyl® FSO-100 stock solution to make about 0.005% wt. Zonyl® FSO-100 solution was added.

Example 9

Acid-Etching (1)

Figures 36A, 36B, 36C:
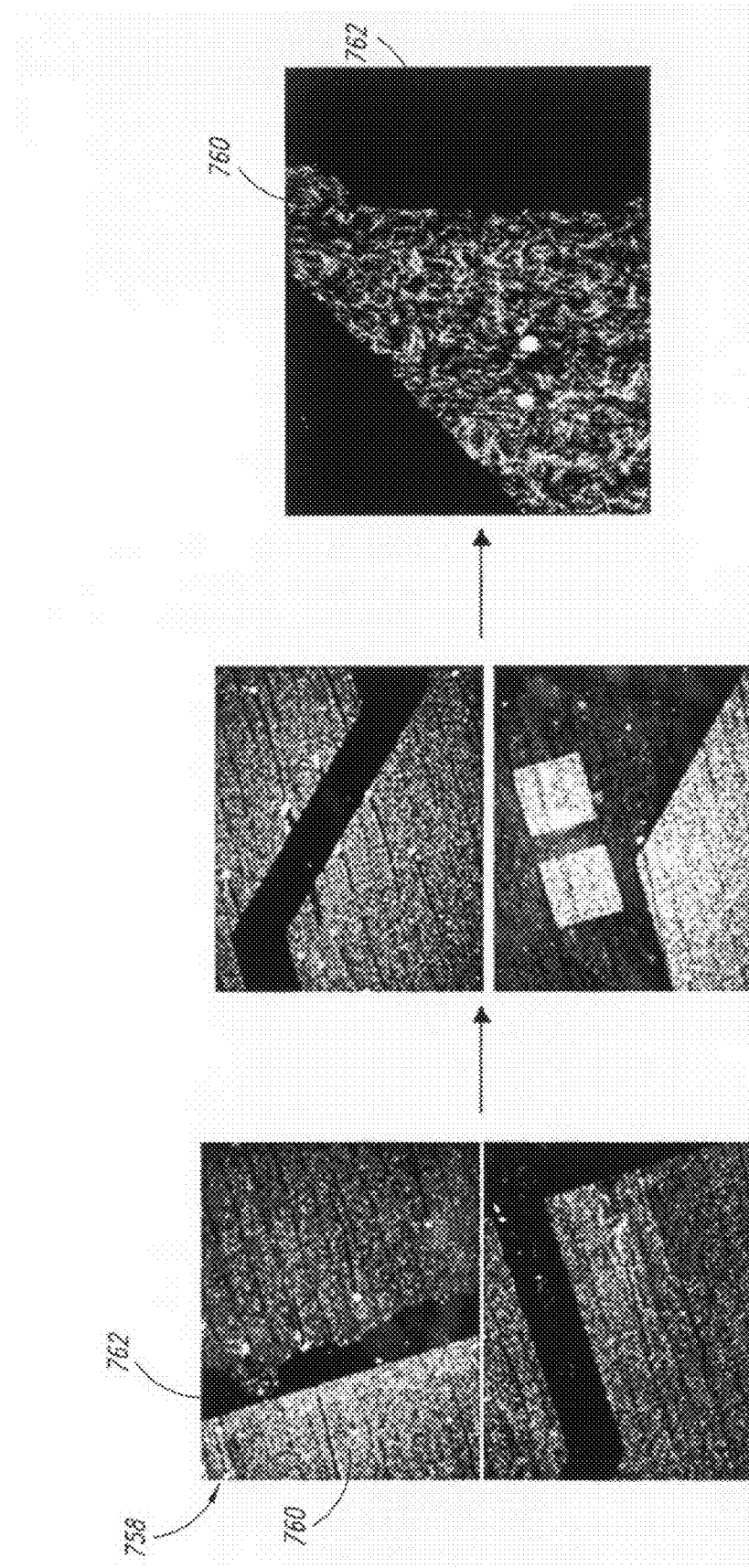
FIGS. 36A-36C show a progression of etching and a final pattern formed on a transparent conductor sheet.

FIGS. 36A-36C show the progression of etching and the final pattern formed on a transparent conductor sheet 758. More specifically, a conductive silver nanowires layer was first formed on a PET substrate. A UV-curable acrylate was deposited on the nanowire layer according to a pattern. The matrix was allowed to dry and partially cured. The matrix was typically about 50 nm-300 nm thick. Surface conductivity was detected in the areas protected by the matrix as well as in the areas unprotected by the matrix.

The transparent conductor sheet was then exposed to an acid-etching solution, which included 1% $HNO_3$, 1% $NaNO_3$ and 5 ppm of $KMnO_4$.

FIG. 36A shows that within one minute, the etching of the silver nanowires had begun from a region adjacent to an area protected by the matrix 760. The dissolution and disruption of the nanowire layer was evident in the area unprotected by the matrix 762.

FIG. 36B shows the transparent conductor sheet two minutes into the etching. More unprotected silver nanowires were dissolved and a well-defined pattern emerged. FIG. 36C shows that at the end of four minutes, all the unprotected silver nanowires had been etched and removed by rinsing the transparent conductor sheet with water. The protected area 760 remain conductive. Optionally, the partially cured matrix in the matrix protected area 760 can be further cured.

Example 10

Acid-Etching (2)

Figure 37B:
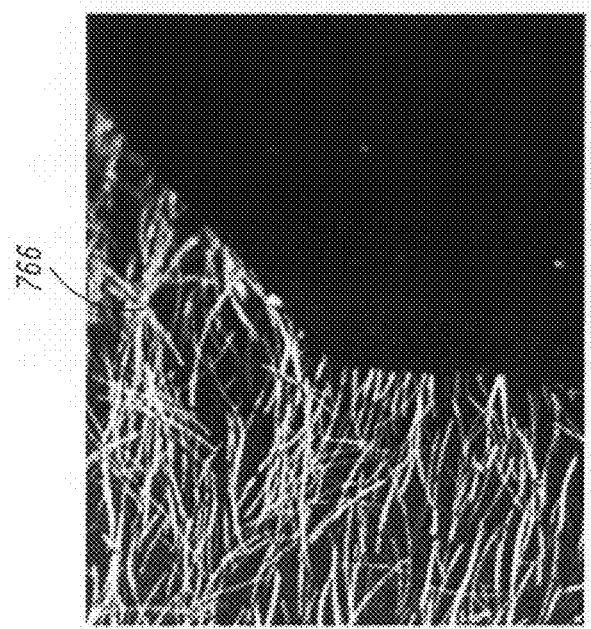
FIGS. 37A-37B show the etching rate by using a acid-etching solution according to one embodiment.
Figure 37A:
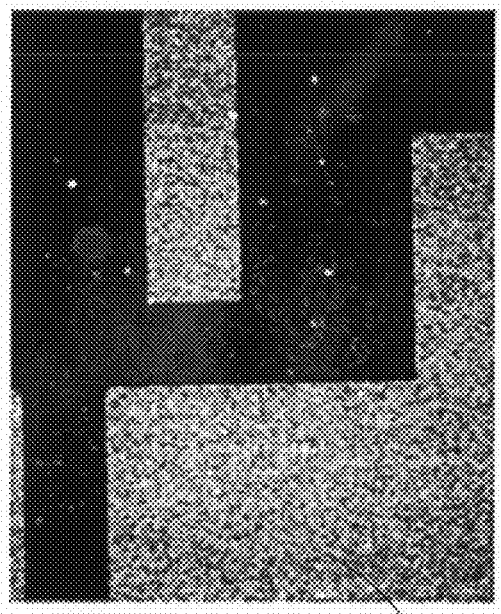

FIGS. 37A and 37B show the impact to the etching rate by using a higher concentration of $KMnO_4$ in the acid-etching solution. A transparent conductor sheet 764 was prepared and patterned as described in Example 9, except that 10 ppm of $KMnO_4$ was used. FIG. 37A shows that the unprotected nanowires were etched away within 30 seconds of the etching. FIG. 37B shows, in higher magnification, the well-defined pattern after etching for about one minute. FIG. 37B also shows that the area 766 in which the matrix was present was not etched or disturbed by the etching solution. Like in Example 9, the protected area remained surface-conductive after the etching. Additionally, FIG. 37B shows that at the interface between the conductive region and non-conductive region of the patterned surface, nanowires are actually severed and portions of these severed nanowires that, prior to etching, extended into the non-conductive region, are etched away. In this way, remaining portions of the severed wires are shorter than the original lengths of the wires prior to etching.

Example 11

Acid-Etching (3)

A transparent conductor sheet was prepared according to the method described in Example 7 (e.g., Formula 1). A nanowire network layer was formed in a matrix layer of about 140 nm thick. The sheet was surface-conductive having a surface resistivity of about 500Ω/□.

A region of the conductive surface area of the sheet was then protected by an overcoat of about 1 μm thick. The nanowires were fully covered by the overcoat and no surface conductivity was detectable in this region. The region without the overcoat remained surface conductive.

The entire sheet was then dipped into an acid etching solution (20 ppm $KMnO_4$, 1% $HNO_3$, 1% $NaNO_3$) for a minute. The sheet was removed and rinsed with water and dried under $N_2$ flow. The entire sheet became non-conductive.

Figure 38B:
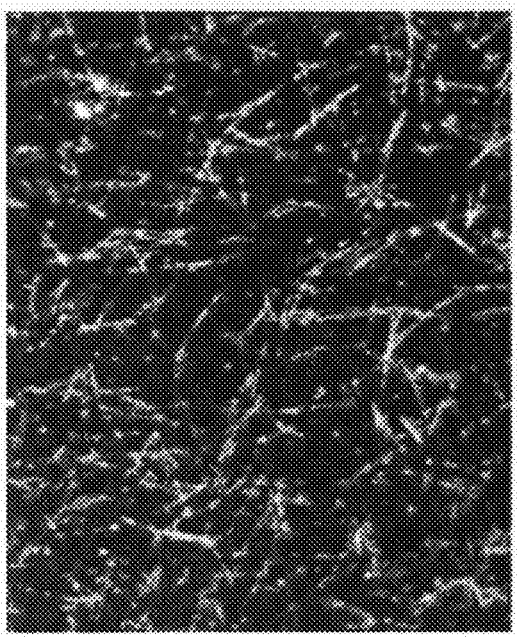
FIGS. 38A and 38B illustrate a patterning and etching process according to one embodiment.

In the uncoated area, as shown in FIG. 38B, silver nanowires were dissolved into soluble silver salt despite the presence of the matrix. This result indicates that higher concentration of $KMnO_4$ (20 ppm compared to 10 ppm and 5 ppm in Examples 9 and 10, respectively) can cause the dissolution of the nanowires within the matrix. The uncoated area was no longer conductive because of the corruption of the nanowire network layer.

The silver nanowires in the overcoat-protected area were unaffected by the etching. Although no surface conductivity was possible due to the thickness of the overcoat, a nanowire network layer remained underneath the overcoat (FIG. 38A).

Figure 38A:
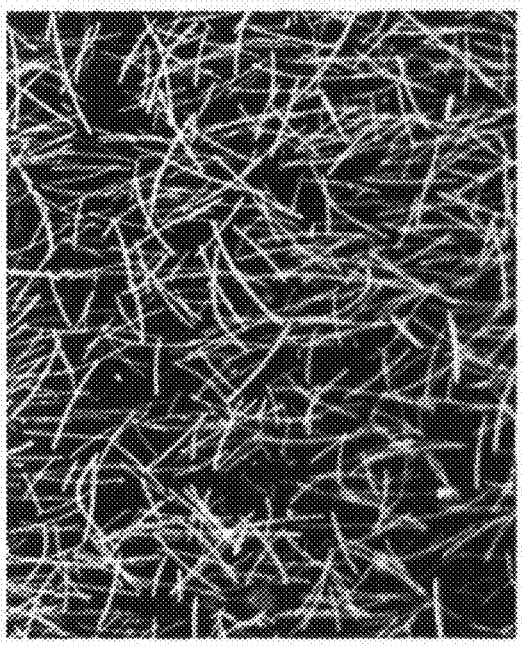

FIGS. 38A and 38B illustrate that the transparent conductor described herein can be patterned according to standard lithography method using a mask, which acts as the thick overcoat as illustrated herein.

Example 12

Color Filter Coatings

Commercial color filters were coated directly with conductive nanowire films.

Sample 1 was a chrome black matrix with color filters. As shown in FIG. 39A, the R, G and B color filters were arranged parallel to each other and two adjacent color filters were separated from one another by a groove 780, which prevents light transmission between adjacent pixels. Sample 1 was surface conductive in the direction of the grooves (due to the metallic content of the black matrix) and registered a sheet resistance of about 40Ω/□. The sample was not surface conductive across the grooves.

Nanowires were coated directly on the entire top surface of Sample 1. The coated sample remained surface conductive in the direction along the grooves and showed a surface resistance of about 33Ω/□. In addition, because the nanowires were coated conformally, (see, FIG. 39A), the coated sample was also surface conductive across the grooves 780 and showed a surface resistance of about 100Ω/□.

The nanowire coating had little effect on the optical properties of Sample 1. The light transmittance was 18.2% in the coated sample, compared to 19.2% in the un-coated sample. The coated sample was slightly hazier than the plain sample. The haze in the coated sample increased from about 2.7% of the plain sample to about 3.5-5.3%.

Sample 2 was an organic resin black matrix with color filters having a similar arrangement as in Sample 1. Sample 2 (see, FIG. 39B) was entirely non-surface conductive.

Figure 39B:
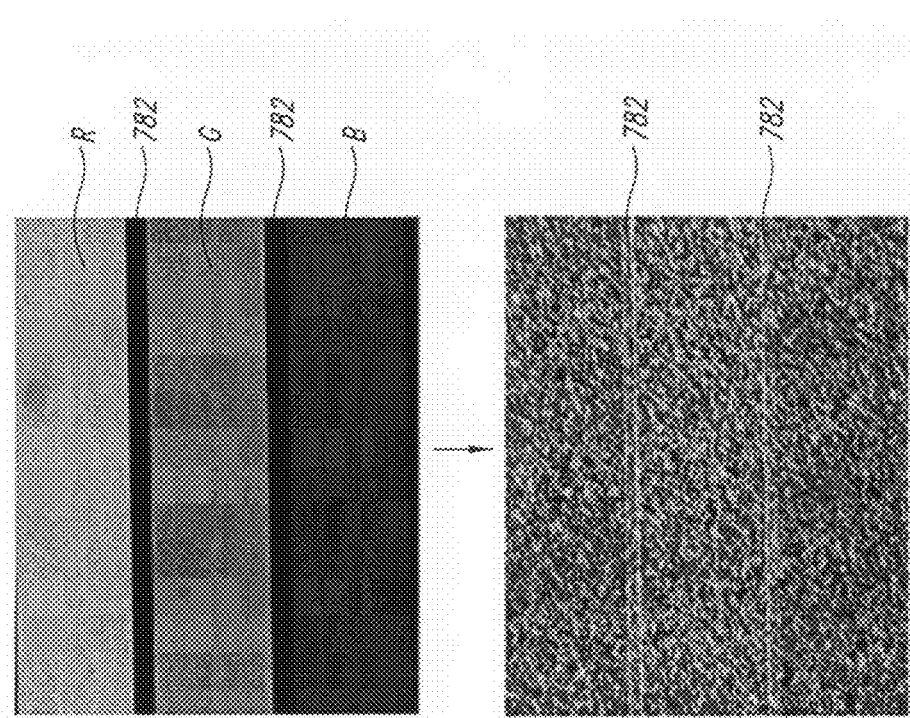
FIGS. 39A and 39B illustrate coating commercial color filters with nanowire-based transparent conductor film according to one embodiment.
Figure 39A:
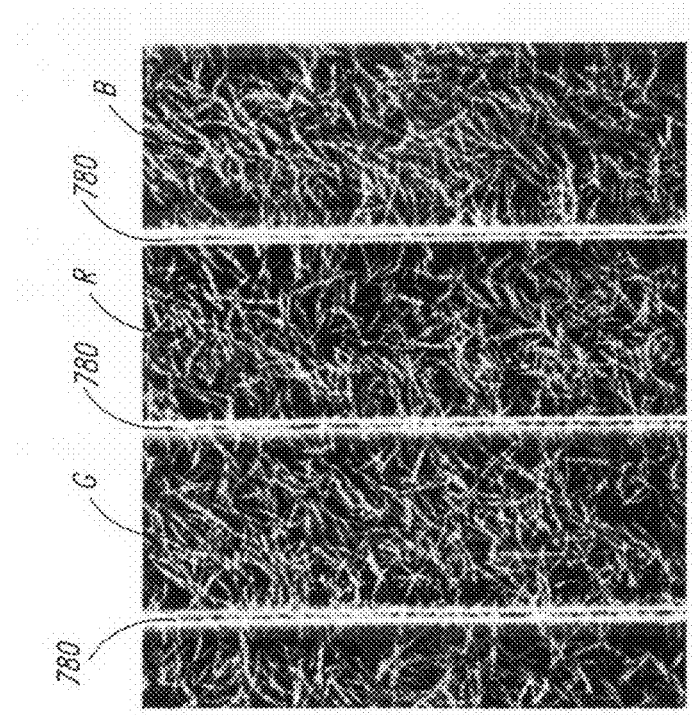

FIG. 39B also shows Sample 2 coated with a nanowire layer. The coated Sample 2 became surface conductive in the direction along the grooves 782 and showed a surface resistance of about 56-76Ω/□. In addition, because the nanowires conformed to the grooves 782, the coated sample was also surface conductive across the grooves and showed a surface resistance of about 61Ω/□. Overall, a bulk surface resistance was measured at about 120-130Ω/□.

Optically, the nanowire coating had little effect to Sample 2. The light transmittance was 27.5% in the coated sample, whereas it was 26.9% in the un-coated sample. The coated sample was slightly hazier than the un-coated sample, increasing from about 1.4% to about 4.8% in haze.

Example 13

Surface Pre-Treatment

Transparent conductor samples were patterned by wet-etching process. Prior to etching, the transparent conductor had been masked according to a pattern (physical mask or photoresist mask) and surface-treated in the unmasked regions. Compared to the untreated sample, surface-treated transparent conductors were etched at much higher rate.

Using Physical Mask:

Transparent conductor samples were prepared by first forming a silver nanowire film by spin-coating (or other deposition method) on substrates including Polycarbonate, glass or PET, with desired transparency and conductivity. The silver nanowire film was subsequently coated with Addison Clear Wave AC YC-5619 hard coat (by spin-coating). The hard coat material was baked and fully UV cured.

A mask (e.g., a plastic film) having a desired pattern was placed on and in contact with the hard coat of the transparent conductor sample. The mask defined regions (unmasked) to be etched. The unmasked region was submitted to $O_2$ plasma or 10 minute UV ozone treatment for 10 minutes.

The mask was removed and the sample was immersed in 100% Transene Ag Etchant Type TFS for 10 seconds before it was removed and rinsed in DI and air-dried.

Using Photoresist Mask:

Instead of a physical mask, a photoresist material can be spin-coated on the silver nanowire film (with a hard coat). When exposed to UV light according to a desired pattern, the photoresist material cures into a mask. The transparent conductor samples can be surface treated and etched following the process described above.

Results:

As shown, Samples 1 and 2, which were pretreated by oxygen plasma and UV ozone respectively, became non-conductive (infinite resistivity) within 10 seconds of etching. In comparison, untreated Sample 3 remained conductive after 6 minutes of etching.

Sample 4 illustrates a process of invisible patterning in which a diluted etchant was used. Following an oxygen plasma treatment, patterning using 5% Transene Ag Etchant Type TFS created a patterned transparent conductor with substantially uniform optical properties. It is believed that the diluted etchant has rendered transparent conductor film non-conductive without completely removing the nanowires.

Sample 1—Pretreated with Oxygen Plasma

| | Total etch time | Initial | 10 sec |
|---|---|---|---|
| $O_2$ Plasma Treated Film | Film Resistivity (ohm) | 66.4 | infinite |
| | 2 pt Contact Resistance (ohm) | 70 | infinite |
| | % Transparency | 87.6 | 90.0 |
| | % Haze | 2.33 | 1.10 |

Sample 2—Pretreated with UV Ozone

| | Total etch time | Initial | 10 sec |
|---|---|---|---|
| UV Ozone Treated Film | Film Resistivity (ohm) | 63.5 | infinite |
| | 2 pt Contact Resistance (ohm) | 60 | 1100 |
| | % Transparency | 87.8 | 90.2 |
| | % Haze | 2.33 | 1.10 |

Sample 3—Untreated

| | Total etch time | Initial | 10 sec | 30 sec | 60 sec | 3 min | 6 min |
|---|---|---|---|---|---|---|---|
| Untreated Film | Film Resistivity (ohm) | 57.4 | 90.9 | 110.2 | 130.5 | 234.1 | 473.9 |
| | 2 pt Contact Resistance (ohm) | 70 | 1100 | 1000 | 1000 | 6000 | 1M |
| | % Transparency | 87.7 | 87.9 | 87.9 | 88.0 | 88.1 | 88.2 |
| | % Haze | 2.28 | 2.16 | 2.09 | 2.08 | 2.00 | 1.95 |

Sample 4—Dilute Etchant

| | Total etch time | Initial | $O_2$ Plasma | 10 sec | 100 sec |
|---|---|---|---|---|---|
| 5% Ag Etchant Solution | Film Resistivity (ohm) | 55 | 65.9 | Infinite | Infinite |
| | 2 pt Contact Resistance (ohm) | 60 | 65 | Infinite | Infinite |
| | % Transparency | 87.6 | 87.3 | 87.8 | 88.0 |
| | % Haze | 2.71 | 2.84 | 4.93 | 4.40 |

Example 14

Invisible Patterning

A suspension of HPMC, silver nanowires and water was prepared. The suspension was spin-coated on a glass substrate to form a thin conductive film of silver nanowires in a HPMC matrix. The conductive layer was optically clear, with an optical transmission (% T) of about 88.1% and haze (% H) of about 2.85%. The conductive layer is also highly surface-conductive with a surface resistivity of about 25Ω/□.

Figure 40A:
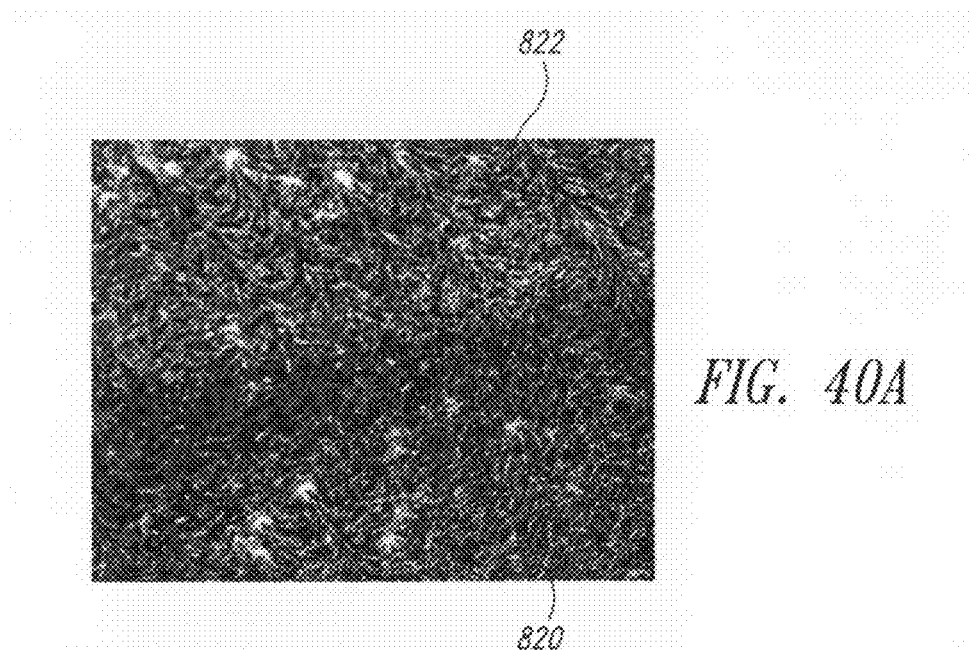
FIGS. 40A-40B show an embodiment of patterning a transparent conductor layer without affecting its optical property.

Thereafter, a region of the conductive film was treated with an oxidizing agent, e.g., a bleach solution having 0.5% hypochlorite, for 2 minutes. The treated film was then rinsed with water and dried in a nitrogen atmosphere. The treated region of the film showed substantially the same transmission (89.1% T) and haze (5.85% H) as compared to the optical properties of the untreated region. FIG. 40A shows that the treated region 820 and the untreated region 822 are visually uniform.

Figure 40B:
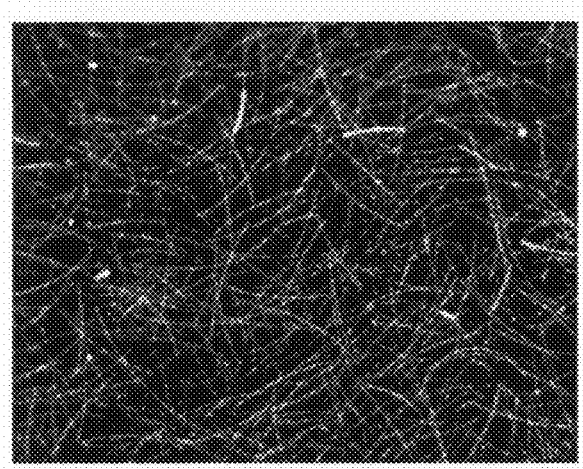

The surface resistivity of the treated region, however, has increased by several orders of magnitude and become effectively insulating. Further magnification (100×, dark field) of FIG. 40A shows that the silver nanowires were broken or were likely to have been converted to an insoluble and insulating silver salt such as silver chloride (see, e.g., FIG. 40B.)

Figure 41:
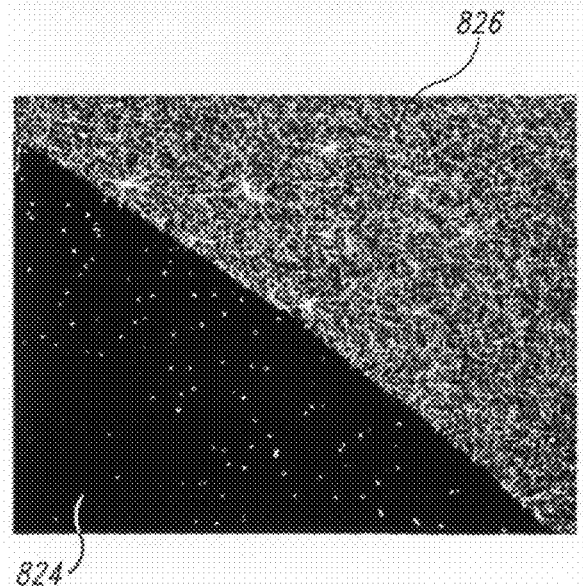
FIG. 41 shows another embodiment of patterning by etching.

As a comparison, FIG. 41 shows a silver nanowire-based conductive film that was treated with a stronger and more concentrated oxidizing agent: 30% hydrogen peroxide. As shown, in the treated region 824, nearly all of the nanowires and the organic HPMC matrix were dissolved. The optical properties in the treated region 824 and the untreated region 826 are notably different.

Example 15

A suspension of HPMC, silver nanowires and water was prepared. The suspension was spin-coated on a glass substrate to form a thin conductive film of silver nanowires in a HPMC matrix. The conductive layer was optically clear, with an optical transmission (% T) of about 89.1%, haze (% H) of about 3.02% and surface resistivity of about 45Ω/□.

A region of the transparent conductor was soaked in a TCNQ solution with acetonitrile (ACN)(0.5 mg/ml) for different amounts of time, rinsed and dried in a nitrogen atmosphere. Table 5 below shows how the transparency, haze and resistivity of the region of the transparent conductor exposed to the TCNQ solution varied with amount of time exposed.

TABLE 5

|         | Before Soaking | 10 sec. | 20 sec. | 60 sec.      |
|---------|----------------|---------|---------|--------------|
| % T     | 89.1           | 89.3    | 90.0    | 91.3         |
| % H     | 3.02           | 2.36    | 1.74    | 0.53         |
| Ohm/Sq. | 45             | 112     | 1700    | Open Circuit |

As shown in Table 5, the change in resistivity of a treated region, with relatively little change in optical characteristics, can be controlled by changing the amount of time treated region is exposed.

Example 16

The change in resistivity of a treated region may also be controlled depending on the chemical used to treat the region of altered resistivity. A transparent conducting sample was prepared as described above in example 15. A region of the sample was soaked in a solution of Pd(AcO)$_2$ and ACN (1 mg/mL) for varying amounts of time. The sample was then rinsed twice with ACN and dried in a nitrogen atmosphere. Table 6 below shows the change in optical characteristics (transparency and haze) and resistivity as a function of the amount of time the sample was exposed to the solution.

TABLE 6

|         | Before Soaking | 1 min. | 11 min. | 35 min. | 66 min. |
|---------|----------------|--------|---------|---------|---------|
| % T     | 89.5           | 89.4   | 89.2    | 88.7    | 88.5    |
| % H     | 2.80           | 2.82   | 2.81    | 2.66    | 2.56    |
| Ohm/Sq. | 51             | 47     | 58      | 173     | 193     |

As illustrated by a comparison of Tables 5 and 6, the amount the resistivity of the exposed region changes with time can vary depending on the chemical the region is exposed to.

Example 17

Photoresist Patterning Method

A silver nanowire dispersion was prepared consisting of 0.2% HPMC, 250 ppm TritonX100 and silver nanowires. The dispersion was spin-coated onto a substrate and baked for 90 seconds at 180° C. This nanowire film was then spin-coated with AZ-3330F photoresist to make a 2.5 μm transparent conducting film. The transparent conductor was then baked at 110° C. for 60 seconds. A photomask was placed in contact with a portion of the photoresist layer and the transparent conductor was exposed to light for 20 seconds at 12 mW/cm$^2$. The conductor was then baked for 60 seconds at 110° C.

The photoresist was then developed with AZ300MIF developer, rinsed and spun dry. The conductor was then exposed to Transene silver etchant for 10 seconds, rinsed and spun dry. The photoresist was then stripped using Acetone. The transparent conductor was overcoated with Polyset PCX35-39B at 2.5% dilution in PGME and then cured for 45 min. at 180° C. The resulting patterned transparent conductor had a line-width of from 5 μm to 10 μm. Larger pattern line-widths have also been obtained using photoresist and other patterning methods disclosed herein. For example, line-widths from 10 μm to 300 μm and 10 μm to 50 μm have been obtained.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A touch screen device comprising:
    a first transparent conductive layer including metal nanowires, wherein the metal nanowires are at or above an electrical percolation level; and
    a second transparent conductive layer positioned above the first transparent conductive layer and separated therefrom by a spacer, the second transparent conductive layer including metal nanowires, wherein the metal nanowires are at or above the electrical percolation level;

wherein at least one of the first transparent conductive layer and the second transparent conductive layer is further coated with a transparent overcoat, the transparent overcoat including a plurality of conductive particles at below the electrical percolation level, and wherein the transparent overcoat is surface conductive.

2. The touch screen device of claim 1 wherein the conductive particles are ITO, ZnO, doped ZnO, metallic nanowires, metallic nanotubes, carbon nanotubes, or a mixture thereof.

3. The touch screen device of claim 1 wherein the transparent overcoat has a surface resistivity of at least $10^6$ ohm/sq.

4. A multi-layer structure comprising:
   a substrate;
   a conductive layer formed on the substrate, wherein the conductive layer comprises a first plurality of metallic nanowires, the first plurality of metallic nanowires reaching an electrical percolation level; and
   an overcoat formed on the conductive layer, the overcoat incorporating a second plurality of conductive particles, the second plurality of conductive particles being below the electrical percolation level, and wherein the overcoat is surface conductive.

5. The multi-layer structure of claim 4 wherein the conductive particles are ITO, ZnO, doped ZnO, metallic nanowires, metallic nanotubes, carbon nanotubes, or a mixture thereof.

6. The multi-layer structure of claim 4 wherein the conductive layer and the overcoat are optically clear.

7. The multi-layer structure of claim 4 having a surface resistivity of less than $10^6$ ohm/sq.

8. A touch screen device comprising a multi-layer structure having:
   a conductive layer, wherein the conductive layer comprises a first plurality of metallic nanowires, the first plurality of metallic nanowires reaching an electrical percolation level; and
   an overcoat formed on the conductive layer, the overcoat incorporating a second plurality of conductive particles, the second plurality of conductive particles being below the electrical percolation level and wherein the overcoat is surface conductive.

9. The touch screen of claim 8 wherein the conductive particles are ITO, ZnO, doped ZnO, metallic nanowires, metallic nanotubes, carbon nanotubes, or a mixture thereof.

10. The touch screen of claim 8 wherein the conductive layer and the overcoat are optically clear.

11. The touch screen of claim 8 having a surface resistivity of less than $10^6$ ohm/sq.

\* \* \* \* \*